US012810805B2

(12) United States Patent
Wei et al.

(10) Patent No.: US 12,810,805 B2

(45) Date of Patent: Nov. 24, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Qi Wei, Beijing (CN); Jianpeng Wu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 283 days.

(21) Appl. No.: 18/833,939

(22) PCT Filed: Sep. 20, 2023

(86) PCT No.: PCT/CN2023/120105

§ 371 (c)(1),
(2) Date: Jul. 29, 2024

(87) PCT Pub. No.: WO2025/059923

PCT Pub. Date: Mar. 27, 2025

(65) Prior Publication Data

US 2026/0188236 A1 Jul. 2, 2026

(51) Int. Cl.

*G09G 3/3266* (2016.01)
*G09G 3/3233* (2016.01)
(Continued)

(52) U.S. Cl.

CPC ......... *G09G 3/3266* (2013.01); *G09G 3/3233* (2013.01); *G11C 19/28* (2013.01);
(Continued)

(58) Field of Classification Search

CPC ...... G09G 3/3266; G09G 3/3233; G09G 3/32; G09G 3/30; G09G 3/3208; G09G 3/3225;
(Continued)

(56) References Cited

U.S. PATENT DOCUMENTS 12,548,522 B2 * 2/2026 Qing .................... G09G 3/3266
12,579,937 B2 * 3/2026 Feng ......................... G09F 9/33
(Continued)

FOREIGN PATENT DOCUMENTS

CN 103413514 A 11/2013
CN 104766576 A 7/2015
(Continued)

*Primary Examiner* — Hai L Nguyen

(57) ABSTRACT

A display substrate and a display apparatus are provided. The display substrate include: a shift register, the shift register includes: a first output transistor (OUT1) to a fifth output transistor (OUT5). The first output transistor (OUT1) is electrically connected with a cascaded signal output terminal (GP) and a first power supply terminal (V1), respectively; the second output transistor (OUT2) is connected with the cascaded signal output terminal (GP) and a second power supply terminal (V2), respectively; the third output transistor (OUT3) is connected with the fifth output transistor (OUT5) and the first power supply terminal (V1), respectively; the fourth output transistor (OUT4) is connected with a drive signal output terminal (OP) and the second power supply terminal (V2), respectively; and the fifth output transistor (OUT5) is connected with the drive signal output terminal (OP).

20 Claims, 12 Drawing Sheets

(51) Int. Cl.
*G11C 19/28* (2006.01)
*H10K 59/121* (2023.01)

(52) U.S. Cl.
CPC . *H10K 59/1213* (2023.02); *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2330/021* (2013.01); *G09G 2340/0435* (2013.01)

(58) Field of Classification Search
CPC ....... G11C 19/28; G11C 19/287; G11C 19/00; H01K 59/00; H01K 59/10; H01K 59/12; H01K 59/121
USPC ............................................... 377/64, 69, 75
See application file for complete search history.

(56) References Cited

U.S. PATENT DOCUMENTS

| | | | | |
|---|---|---|---|---|
| 12,579,939 | B2 * | 3/2026 | Zhang ...................... | G09G 3/32 |
| 2012/0038603 | A1 | 2/2012 | Chen et al. | |

FOREIGN PATENT DOCUMENTS

| | | | |
|---|---|---|---|
| CN | 105336300 | A | 2/2016 |
| CN | 113112949 | A | 7/2021 |
| CN | 113744679 | A | 12/2021 |
| CN | 116525619 | A | 8/2023 |
| WO | 2023044830 | A1 | 3/2023 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2023/120105 having an international filing date of Sep. 20, 2023. The above-identified application is hereby incorporated by reference.

TECHNICAL FIELD

The present disclosure relates to, but is not limited to, the field of display technologies, and more particularly, to a display substrate and a display apparatus.

BACKGROUND

An Organic Light Emitting Diode (OLED for short) and a Quantum dot Light Emitting Diode (QLED for short) are active light emitting display devices and have advantages such as self-luminescence, wide viewing angle, high contrast ratio, low power consumption, very high response speed, lightness and thinness, flexibility, and low cost. With constant development of display technologies, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matter described in the present disclosure in detail. This summary is not intended to limit the protection scope of claims.

In a first aspect, the present disclosure provides a display substrate having a display region and a non-display region. The display substrate includes: a pixel drive circuit located in the display region and a gate drive circuit group located in the non-display region. The gate drive circuit group at least includes a first drive circuit, the first drive circuit is connected with the pixel drive circuit, and the first drive circuit includes a plurality of cascaded shift registers. The shift register at least includes: a first output transistor, a second output transistor, a third output transistor, a fourth output transistor, a fifth output transistor, a cascaded signal output terminal, a drive signal output terminal, a first power supply terminal and a second power supply terminal, and the drive signal output terminal is electrically connected with the pixel drive circuit.

The first output transistor is electrically connected with the cascaded signal output terminal and the first power supply terminal, respectively; the second output transistor is connected with the cascaded signal output terminal and the second power supply terminal, respectively; the third output transistor is connected with the fifth output transistor and the first power supply terminal, respectively; the fourth output transistor is connected with the drive signal output terminal and the second power supply terminal, respectively; and the fifth output transistor is connected with the drive signal output terminal.

A gate electrode of the first output transistor and a gate electrode of the third output transistor form an integrated structure, and a gate electrode of the second output transistor and a gate electrode of the fourth output transistor form an integrated structure.

In an exemplary implementation, the shift register further includes: a fifth capacitor.

The fifth capacitor is connected with the cascaded signal output terminal and the second power supply terminal, respectively.

In an exemplary implementation, a capacitance value of the fifth capacitor is less than or equal to 60 farads.

In an exemplary implementation, any one of the third output transistor and the fourth output transistor is located on a side of any one of the first output transistor and the second output transistor close to the display region, the fifth output transistor is located on a side of any one of the third output transistor and the fourth output transistor close to the display region, and the fifth capacitor is located on a side of the second output transistor away from the display region.

The first output transistor and the third output transistor are arranged along a first direction, the second output transistor and the fourth output transistor are arranged along a first direction, the first output transistor and the second output transistor are arranged along the second direction, the third output transistor and the fourth output transistor are arranged along the second direction, and the first direction intersects with the second direction.

In an exemplary implementation, the transistor includes an active pattern.

A length of an active pattern of the first output transistor along the first direction is less than a length of an active pattern of the third output transistor along the first direction.

A channel width of the active pattern of the first output transistor is less than a channel width of the active pattern of the third output transistor, and a channel length of the active pattern of the first output transistor is greater than a channel length of the active pattern of the third output transistor.

In an exemplary implementation, the transistor includes an active pattern. A length of the active pattern of the third output transistor along the first direction is greater than a length of the active pattern of the fourth output transistor along the first direction, and a length of the active pattern of the third output transistor along the second direction is less than a length of the active pattern of the fourth output transistor along the second direction.

In an exemplary implementation, the channel width of the active pattern of the first output transistor ranges from 80 microns to 100 microns, and the channel length of the active pattern of the first output transistor ranges from 3.2 microns to 3.7 microns.

In an exemplary implementation, the channel width of the active pattern of the third output transistor ranges from 250 microns to 300 microns, and the channel length of the active pattern of the third output transistor ranges from 2.9 microns to 3.2 microns.

In an exemplary implementation, the transistor includes: an active pattern.

A length of an active pattern of the second output transistor along the first direction is less than a length of an active pattern of the fourth output transistor along the first direction.

A channel width of the active pattern of the second output transistor is less than a channel width of the active pattern of the fourth output transistor, and a channel length of the active pattern of the second output transistor is greater than a channel length of the active pattern of the fourth output transistor.

In an exemplary implementation, the channel width of the active pattern of the second output transistor ranges from 80 microns to 100 microns, and the channel length of the active pattern of the second output transistor ranges from 3.2 microns to 3.7 microns.

In an exemplary implementation, the channel width of the active pattern of the fourth output transistor ranges from 250 microns to 300 microns, and the channel length of the active pattern of the fourth output transistor ranges from 2.9 microns to 3.2 microns.

In an exemplary implementation, a length of an active pattern of the fifth output transistor along the second direction is greater than a length of an active pattern of any of the third output transistor and the fourth output transistor along the second direction.

A channel width of the active pattern of the fifth output transistor ranges from 250 microns to 300 microns, and a channel length of the active pattern of the fifth output transistor ranges from 2.9 microns to 3.2 microns.

In an exemplary implementation, the transistor includes a gate electrode. A length of the gate electrode of the third output transistor along the first direction is greater than a length of the gate electrode of the fourth output transistor along the first direction.

In an exemplary implementation, the transistor includes a gate electrode. A length of the gate electrode of the fifth output transistor along the second direction is greater than a length of the gate electrode of any one of the first output transistor and the second output transistor along the second direction.

In an exemplary implementation, the shift register further includes: a fourth capacitor.

The fourth capacitor is connected with the fifth output transistor and the first power supply terminal, respectively.

In an exemplary implementation, the fourth capacitor is located between the second output transistor and the fourth output transistor.

In an exemplary implementation, the shift register includes: a twenty-fourth transistor.

The twenty-fourth transistor is connected with the fifth output transistor and the second power supply terminal, respectively. The twenty-fourth transistor has a transistor type opposite to the transistor type of any one of the first output transistor to the fifth output transistor.

In an exemplary implementation, the twenty-fourth transistor is located on a side of the fifth output transistor close to the display region, and is arranged along the first direction with the first output transistor and the third output transistor.

In an exemplary implementation, the shift register further includes a twentieth transistor, a twenty-first transistor, a twenty-second transistor, a twenty-third transistor, a reverse signal output terminal, and a masking signal terminal.

The twentieth transistor is connected with the cascaded signal output terminal, the fifth output transistor and the twenty-first transistor, respectively; the twenty-first transistor is connected with the reverse signal output terminal and the masking signal terminal of a shift register of previous stage, respectively; the twenty-second transistor is connected with the cascaded signal output terminal, the reverse signal output terminal and the second power supply terminal, respectively; the twenty-third transistor is connected with the cascaded signal output terminal, the reverse signal output terminal and the first power supply terminal, respectively.

A transistor type of the twenty-second transistor is opposite to the transistor type of any one of the first output transistor to the third output transistor, the twentieth transistor, the twenty-first transistor, and the twenty-third transistor.

In an exemplary implementation, the twentieth transistor to the twenty-third transistor is located on a side of the fifth output transistor close to the display region.

The twenty-first transistor and the twentieth transistor are arranged along the second direction, and the twentieth transistor is located on a side of the twenty-first transistor close to the twenty-second transistor, and the twenty-third transistor is located between the twenty-second transistor and the fifth output transistor, and is located on a side of the twenty-second transistor away from the twenty-first transistor.

In an exemplary implementation, the shift register further includes a first transistor to an eighth transistor, an eleventh transistor to a sixteenth transistor, a first capacitor to a third capacitor, a signal input terminal, a first clock signal terminal, a second clock signal terminal, and a third power supply terminal;

The first transistor is connected with the signal input terminal, the first clock signal terminal, the second transistor, the eighth transistor, the twelfth transistor and the thirteenth transistor, respectively; the second transistor is connected with the first clock signal line, the third transistor, the fifth transistor, the eighth transistor, the eleventh transistor, the twelfth transistor and the thirteenth transistor, respectively; the third transistor is connected with the first clock signal terminal, the second power supply terminal, the fifth transistor and the eleventh transistor, respectively; the fourth transistor is connected with the second clock signal terminal, the third capacitor, the fifth transistor, the fifteenth transistor and the sixteenth transistor, respectively; the fifth transistor is connected with the first power supply terminal, the third capacitor and the eleventh transistor, respectively; the sixth transistor is connected with the second clock signal terminal, the first capacitor, the seventh transistor and the eleventh transistor, respectively; the seventh transistor is connected with the second clock signal terminal, the first capacitor, the second capacitor, the first output transistor, the third output transistor and the eighth transistor, respectively; the eighth transistor is connected with the first power supply terminal, the second capacitor, the first output transistor, the third output transistor, the twelfth transistor and the thirteenth transistor, respectively; the eleventh transistor is connected with the second power supply terminal and the first capacitor, respectively; the twelfth transistor is connected with the second power supply terminal, the second output transistor, the fourth output transistor, the thirteenth transistor and the sixteenth transistor, respectively; the thirteenth transistor is connected with the first power supply terminal and the third power supply terminal, respectively; the fourteenth transistor is connected with the signal input terminal, the first clock signal terminal and the fifteenth transistor, respectively; the fifteenth transistor is connected with the second power supply terminal, the third capacitor and the sixteenth transistor, respectively; and the sixteenth transistor is connected with the second output transistor, the fourth output transistor and the third capacitor, respectively.

A capacitance value of the third capacitor is greater than a capacitance value of the second capacitor, and the capacitance value of the second capacitor is greater than a voltage value of the first capacitor.

A transistor type of any one of the first transistor to the eighth transistor and the eleventh transistor to the sixteenth transistor is the same as a transistor type of any one of the first output transistor to the fifth output transistor.

Any one of the first transistor to the eighth transistor, the eleventh transistor to the sixteenth transistor, and the first capacitor to the third capacitor is located on a side of any one of the first output transistor and the second output transistor away from the display region.

In an exemplary implementation, the shift register includes at least one P-type transistor, at least one N-type transistor, and at least one capacitor. The capacitor includes a first plate and a second plate. The at least one P-type transistor includes: the first output transistor to the fifth output transistor. A gate electrode of the N-type transistor includes: a first gate electrode and a second gate electrode.

The display substrate includes: a base substrate and a drive circuit layer disposed on the base substrate, the gate drive circuit group and the pixel drive circuit are disposed in the drive circuit layer, the drive circuit layer includes a first semiconductor layer, a first conductive layer, a second conductive layer, a second semiconductor layer, a third conductive layer, a fourth conductive layer and a fifth conductive layer stacked in sequence.

The first semiconductor layer at least includes: an active pattern of the P-type transistor.

The first conductive layer at least includes: a gate electrode of the P-type transistor and a first plate of at least one capacitor.

The second conductive layer at least includes: a second plate of at least one capacitor and the first gate electrode of the N-type transistor.

The second semiconductor layer at least includes: an active pattern of the N-type transistor.

The third conductive layer at least includes: the second gate electrode of the N-type transistor.

The fourth conductive layer at least includes a first electrode and a second electrode of any one of the P-type transistor and the N-type transistor.

In an exemplary implementation, the display substrate further includes: an initial signal line, a first clock signal line, a second clock signal line, a first one of second power supply lines, a third power supply line, a second one of the second power supply lines, and a first one of first power supply lines, wherein the second one of the second power supply lines is connected with the second power supply terminal connected with the second output transistor, and the first one of the first power supply lines is connected with the first power supply terminal connected with the first output transistor.

Any one of the initial signal line, the first clock signal line, the second clock signal line, the first one of the second power supply lines, the third power supply line, the second one of the second power supply lines, and the first one of the first power supply lines extends at least partially along the second direction.

Orthographic projections of the initial signal line, the first clock signal line, the second clock signal line, the first one of the second power supply lines, the third power supply line, the second one of the second power supply lines and the first one of the first power supply lines on the base substrate are arranged sequentially in a direction close to the display region, and there is no overlapped region between the orthographic projections of any two of the initial signal line, the first clock signal line, the second clock signal line, the first one of the second power supply lines, the second one of the second power supply lines and the first one of the first power supply lines on the base substrate.

The orthographic projection of the second clock signal line on the base substrate is located on a side of an orthographic projection of any transistor in the shift register on the base substrate away from the display region.

In an exemplary implementation, the display substrate includes: a base substrate and a drive circuit layer disposed on the base substrate, the gate drive circuit group and the pixel drive circuit are disposed in the drive circuit layer, the drive circuit layer includes a first semiconductor layer, a first conductive layer, a second conductive layer, a second semiconductor layer, a third conductive layer, a fourth conductive layer and a fifth conductive layer stacked in sequence.

The initial signal line, the first clock signal line, the second clock signal line, and the third power supply line are located in the fourth conductive layer.

The first one of the second power supply lines, the second one of the second power supply lines, and the first one of the first power supply lines are located in the fifth conductive layer.

In an exemplary implementation, the orthographic projection of the second one of the second power supply lines on the base substrate is at least partially overlapped with the orthographic projection of the third power supply line on the base substrate.

A line width of the second one of the second power supply lines is greater than a line width of the third power supply line.

In an exemplary implementation, the display substrate further includes: a third one of the second power supply lines, a fourth one of the second power supply lines, a second one of the first power supply lines, and a masking signal line, wherein the third one of the second power supply lines is connected with the second power supply terminal connected with the fourth output transistor, and the second one of the first power supply lines is connected with the first power supply terminal connected with the third output transistor.

Any one of the third one of the second power supply lines, the fourth one of the second power supply lines, the second one of the first power supply lines, and the masking signal line extends at least partially along the second direction.

Orthographic projections of the third one of the second power supply lines, the second one of the first power supply lines, the masking signal line, and the fourth one of the second power supply lines on the base substrate are arranged sequentially in a direction close to the display region, and there is no overlapped region between the orthographic projections of any two of the third one of the second power supply lines, the second one of the first power supply lines, the masking signal line, and the fourth one of the second power supply lines on the base substrate.

In an exemplary implementation, the display substrate includes: a base substrate and a drive circuit layer disposed on the base substrate, the gate drive circuit group and the pixel drive circuit are disposed in the drive circuit layer, the drive circuit layer includes a first semiconductor layer, a first conductive layer, a second conductive layer, a second semiconductor layer, a third conductive layer, a fourth conductive layer and a fifth conductive layer stacked in sequence.

The third one of the second power supply lines, the fourth one of the second power supply lines, the second one of the first power supply lines, and the masking signal line are located in the fifth conductive layer.

In an exemplary implementation, the gate drive circuit group further includes: a second drive circuit, the second drive circuit is electrically connected with the pixel drive circuit, the first drive circuit and the second drive circuit are arranged along the first direction.

The second drive circuit is electrically connected with the fourth one of the second power supply lines.

In a second aspect, the present disclosure further provides a display apparatus, including the display substrate described above.

Other aspects of the present disclosure may be comprehended after the drawings and the detailed descriptions are read and understood.

BRIEF DESCRIPTION OF DRAWINGS

Accompany drawings are used to provide understanding of technical solution of the present disclosure, and form a part of the specification. The accompany drawings and embodiments of the present disclosure are adopted to explain the technical solution of the present disclosure, and do not form limitations on the technical solution of the present disclosure.

DETAILED DESCRIPTION

Figure 1:
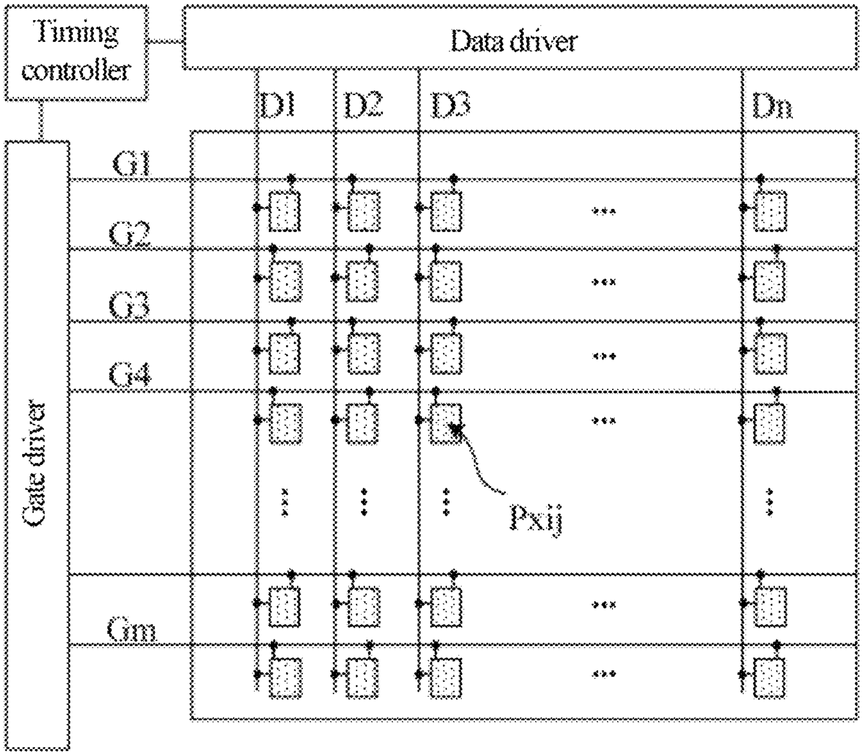
FIG. 1 is a schematic diagram of a structure of a display apparatus.

To make the objectives, technical solutions, and advantages of the present disclosure clearer, the embodiments of the present disclosure will be described in detail below with reference to the accompany drawings. It is to be noted that implementation modes may be implemented in a plurality of different forms. Those of ordinary skills in the art can easily understand such a fact that implementation modes and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflict. In order to keep following description of the embodiments of the present disclosure clear and concise, detailed description of part of known functions and known components are omitted in the present disclosure. The drawings in the embodiments of the present disclosure relate only to the structures involved in the embodiments of the present disclosure, and other structures may be described with reference to conventional designs.

Scales of the drawings in the present disclosure may be used as a reference in actual processes, but are not limited thereto. For example, a width-length ratio of a channel, a thickness and spacing of various films, and a width and spacing of various signal lines may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals “first”, “second”, “third”, etc., in the specification are set not to form limits in numbers but only to avoid confusion between composition elements.

In the specification, for convenience, expressions “central”, “above”, “below”, “front”, “back”, “vertical”, “horizontal”, “top”, “bottom”, “inside”, “outside”, etc., indicating orientations or positional relationships are used to illustrate positional relationships between the composition elements with reference to the drawings, not to indicate or imply that involved devices or elements are required to have specific orientations and be structured and operated with the specific orientations but only to easily and simply describe the present specification, and thus should not be understood as limitations on the present disclosure. The positional relationships between the constituent elements may be changed as appropriate according to a direction according to which each constituent element is described. Therefore, appropriate replacements based on situations are allowed, which is not limited to the expressions in the specification.

In the specification, unless otherwise specified and defined, terms “mounting”, “mutual connection”, and “connection” should be understood in a broad sense. For example, a connection may be fixed connection, or a detachable connection, or an integral connection; it may be a mechanical connection or an electrical connection; it may be a direct connection, or an indirect connection through middleware, or internal communication inside two elements. Those of ordinary skills in the art may understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode. Or, the first electrode may be a source electrode, and the second electrode may be a drain electrode. In a case that transistors with opposite polarities are used, or in a case that a direction of a current changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes connection of composition elements through an element with a certain electrical action. An "element with a certain electrical action" is not particularly limited as long as electrical signals between the connected constituent elements may be sent and received. Examples of the "element with the certain electrical action" not only include an electrode and a wiring, but also include a switching element such as a transistor, a resistor, an inductor, a capacitor, another element with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive thin film" sometimes. Similarly, an "insulation film" may be replaced with an "insulation layer" sometimes.

In the specification, "arranged in a same layer" refers to a structure formed by patterning two (or more than two) structures through a same patterning process, and their materials may be the same or different. For example, materials of precursors for forming a plurality of structures arranged in a same layer are the same, and final materials may be the same or different.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

FIG. 1 is a schematic diagram of a structure of a display apparatus. As shown in FIG. 1, the display apparatus may include a timing controller, a data driver, a gate driver, and a pixel array. The timing controller is connected with the data driver and the gate driver respectively, the data driver is connected with a plurality of data signal lines (D1 to Dn) respectively, and the gate driver is connected with a plurality of gate signal lines (G1 to Gm) respectively. The pixel array may include a plurality of sub-pixels Pxij, wherein i and j may be natural numbers. At least one sub-pixel Pxij may include a circuit unit and a light emitting device connected with the circuit unit, wherein the circuit unit may include a pixel drive circuit, and the pixel drive circuit may be connected with a gate signal line and a data signal line, respectively.

In an exemplary implementation, the timing controller may provide the data driver with a gray scale value and a control signal which are suitable for the specification of the data driver, provide the scan driver with a clock signal and a scan start signal and the like which are suitable for the specification of the scan driver, and provide the light emitting driver with a clock signal and an emission stop signal and the like which are suitable for the specification of the light emitting driver. The data driver may generate data voltages to be provided to the data signal lines D1, D2, D3, . . . , and Dn using the grayscale value and the control signal that are received from the timing controller. For example, the data driver may sample the gray scale value using the clock signal and apply a data voltage corresponding to the gray scale value to the data signal lines D1 to Dn by taking a pixel row as a unit, wherein n may be a natural number.

In an exemplary implementation, the gate driver may generate a scan signal to be provided to the gate signal lines G1, G2, G3, . . . , and Gm by receiving a clock signal, a gate start signal, and the like from the timing controller. For example, the scan driver may sequentially provide a scan signal with an on-level pulse to the gate signal lines G1 to Gm. For example, the gate driver may be constructed in a form of a shift register and may generate a scan signal in a manner in which a scan start signal provided in a form of an on-level pulse is transmitted to a next-stage circuit sequentially under control of the clock signal, wherein m may be a natural number.

Figure 2:
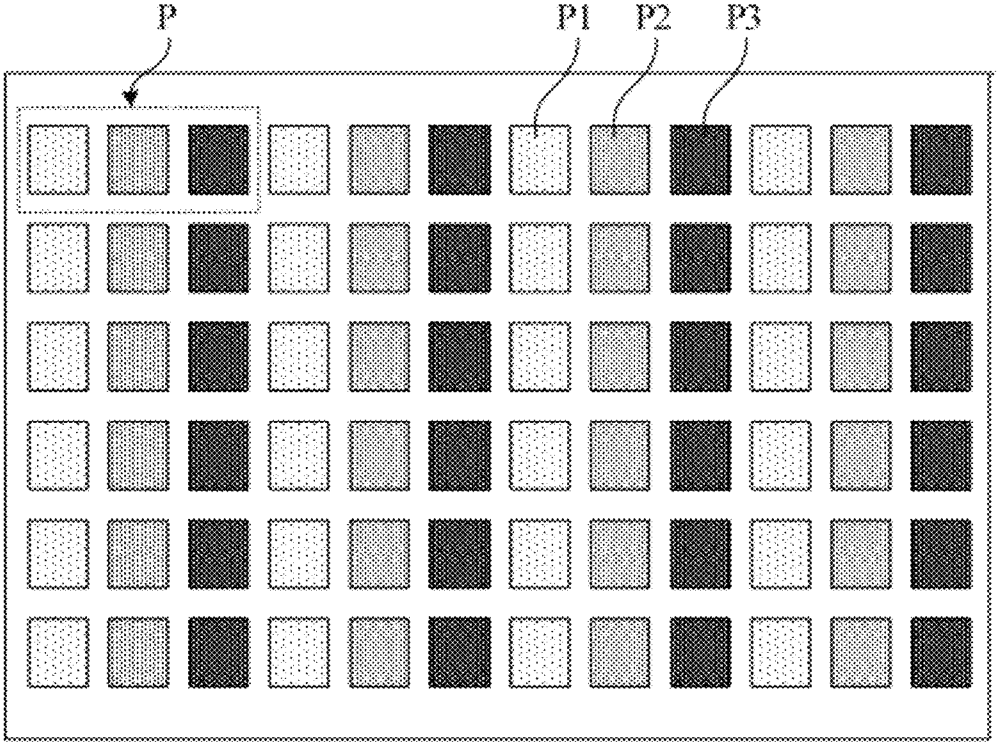
FIG. 2 is a first schematic diagram of a planar structure of a display substrate.
Figure 3:
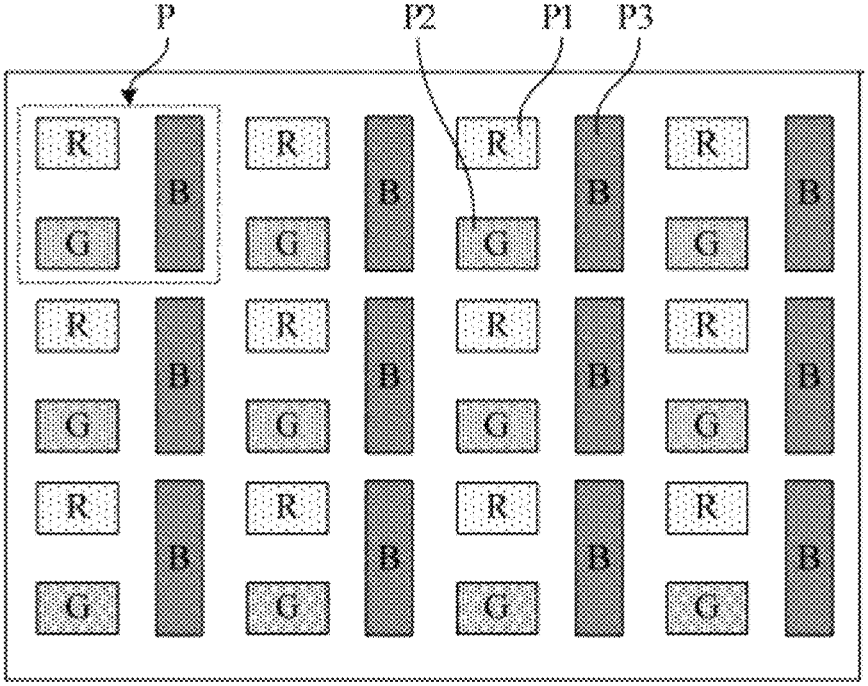
FIG. 3 is a second schematic diagram of a planar structure of a display substrate.
Figure 4:
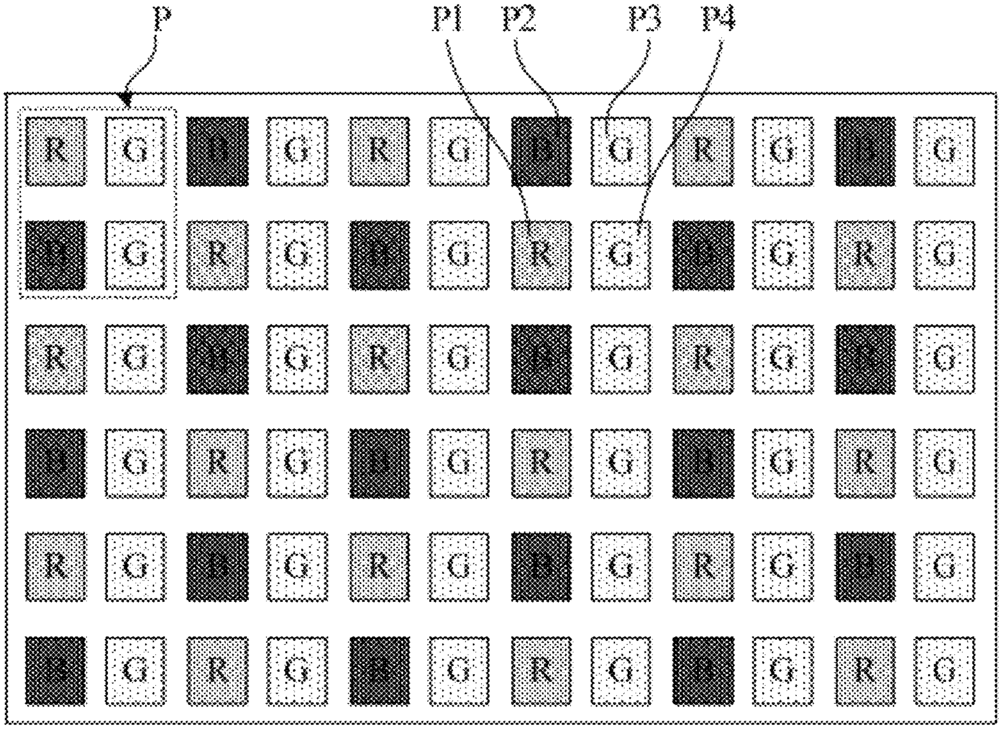
FIG. 4 is a third schematic diagram of a planar structure of a display substrate.

FIG. 2 is a first schematic diagram of a planar structure of a display substrate, FIG. 3 is a second schematic diagram of a planar structure of a display substrate, and FIG. 4 is a third schematic diagram of a planar structure of a display substrate. As shown in FIG. 2 to FIG. 4, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color, and the first sub-pixel P1, the second sub-pixel P2, and the third sub-pixel P3 each includes a pixel drive circuit and a light emitting device. Pixel drive circuits in the first sub-pixel P1, the second sub-pixel P2, and the third sub-pixel P3 are respectively connected with a gate signal line and a data signal line. The pixel drive circuit is configured to receive a data voltage transmitted by the data signal line and output a corresponding current to the light emitting device under controlling of the gate signal line. Light emitting devices in the first sub-pixel P1, the second sub-pixel P2, and the third sub-pixel P3 are respectively connected with the pixel drive circuit of the sub-pixel in which the light emitting device is located, and the light emitting device is configured to emit light with a corresponding brightness in response to a current outputted by the pixel drive circuit of the sub-pixel in which the light emitting device is located.

In an exemplary implementation, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light.

In an exemplary implementation, a sub-pixel may be in a shape of a rectangle, a rhombus, a pentagon, or a hexagon. Three sub-pixels may be arranged side by side horizontally, side by side vertically, or in a manner of delta, the present disclosure is not limited thereto.

In an exemplary implementation, a pixel unit may include three sub-pixels, and the three sub-pixels may be arranged side by side horizontally, side by side vertically, or in a manner of delta, and the present disclosure is not limited herein. FIG. 2 and FIG. 3 are illustrated by taking that a pixel unit includes three sub-pixels as an example. The three sub-pixels in FIG. 2 are arranged side by side horizontally, and the three sub-pixels in FIG. 3 are arranged in a delta manner.

In an exemplary implementation, a pixel unit may include four sub-pixels, and the four sub-pixels may be arranged in a manner to stand side by side horizontally, in a manner to stand side by side vertically, or in a manner of a square, which is not limited here in the present disclosure. FIG. 4 illustrates an example in which the pixel unit includes four sub-pixels and the four sub-pixels are arranged in a square.

In the display market, Low Temperature Poly-Silicon (LTPS) technology is used in most display substrates. LTPS technology has advantages of high resolution, high response speed, high brightness and high aperture ratio. Although it is welcomed by the market, the LTPS technology also has some defects, such as relatively high production cost and relatively large power consumption. At this time, a technology solution of Low Temperature Polycrystalline Oxide (LTPO for short) came into being. Compared with the LTPS technology, in the LTPO technology, a leakage current is smaller, pixel point response is faster, and an additional layer of an oxide is added to a display substrate, which reduces energy consumption required for exciting pixel points, thus reducing power consumption during screen display.

In an exemplary implementation, the pixel drive circuit may have a structure of 3T1C, 4T1C, 5T1C, 5T2C, 6T1C, 7T1C, or 8T1C.

Figure 5:
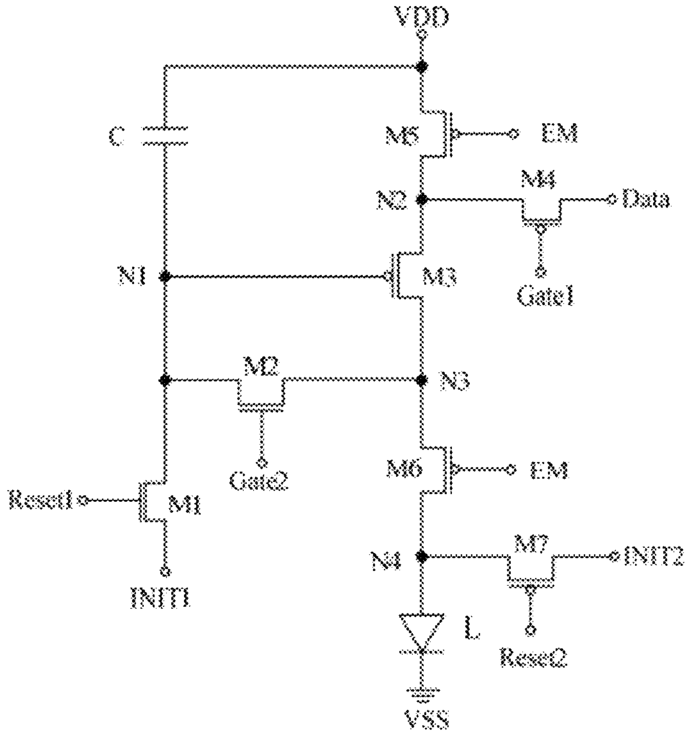
FIG. 5 is a schematic equivalent circuit diagram of a pixel drive circuit.

FIG. 5 is an equivalent circuit diagram of a pixel drive circuit. As shown in FIG. 5, the pixel drive circuit in the LTPO display substrate may include seven transistors (a first transistor M1 to a seventh transistor M7) and one capacitor C. A gate electrode of the first transistor M1 is electrically connected with a first reset signal line Reset1, a first electrode of the first transistor M1 is electrically connected with a first initial signal line INIT1, and a second electrode of the first transistor M1 is electrically connected with a first node N1 or a third node N3; a gate electrode of the second transistor M2 is electrically connected with a second scan signal line Gate2, a first electrode of the second transistor M2 is electrically connected with the first node N1, and a second electrode of the second transistor M2 is electrically connected with the third node N3; a gate electrode of the third transistor M3 is electrically connected with the first node N1, a first electrode of the third transistor M3 is electrically connected with a second node N2, and a second electrode of the third transistor M3 is electrically connected with the third node N3; a gate electrode of the fourth transistor M4 is electrically connected with a first scan signal line Gate1, a first electrode of the fourth transistor M4 is electrically connected with a data signal line Data, and a second electrode of the fourth transistor M4 is electrically connected with the second node N2; a gate electrode of the fifth transistor M5 is electrically connected with a light-emitting signal line EM, a first electrode of the fifth transistor M5 is electrically connected with a high-level power supply line VDD, and a second electrode of the fifth transistor M5 is electrically connected with the second node N2; a gate electrode of the sixth transistor M6 is electrically connected with the light emitting signal line EM, a first electrode of the sixth transistor M6 is electrically connected with the third node N3, and a second electrode of the sixth transistor M6 is electrically connected with a fourth node N4; a gate electrode of the seventh transistor M7 is electrically connected with a second reset signal line Reset2, a first electrode of the seventh transistor M7 is electrically connected with a second initial signal line INIT2, and a second electrode of the seventh transistor M7 is electrically connected with the fourth node N4; a first plate of the capacitor C is electrically connected with the first node N1, and a second plate of the capacitor C is electrically connected with the high-level power supply line VDD. FIG. 5 illustrates an example in which the second electrode of the first transistor M1 is electrically connected with the first node N1.

In an exemplary implementation, the signal of the second reset signal line Reset2 may be the same as the signal of the first scan signal line Gate1, or may be the same as the signal of the first reset signal line Reset1.

In an exemplary implementation, for the first transistor M1 to the seventh transistor M7, low temperature poly silicon thin film transistors may be used, or oxide thin film transistors may be used, or both the low temperature poly silicon thin film transistor and the oxide thin film transistor may be used. An active pattern of the low temperature poly-silicon thin film transistor may be made of Low Temperature Poly-Silicon (LTPS for short), and an active pattern of the oxide thin film transistor may be made of an oxide semiconductor (Oxide). The Low-temperature Poly Silicon thin film transistor has advantages such as a high mobility rate and fast charging, and the oxide thin film transistor has advantages such as a low leakage current. The Low Temperature Poly Silicon thin film transistor and the oxide thin film transistor are integrated on one display substrate to form a LTPO display substrate, and advantages of both the Low Temperature Poly Silicon thin film transistor and the oxide thin film transistor may be utilized, which can achieve low frequency drive, reduce power consumption, and improve display quality.

In an exemplary implementation, the first transistor M1 and the second transistor M2 are of a transistor type opposite to the third transistor M3 to the seventh transistor M7. Exemplarily, the first transistor M1 and the second transistor M2 may be N-type transistors, and the third transistors M3 to the ninth transistors M7 may be P-type transistors.

In an exemplary implementation, the first transistor M1 and the second transistor M2 may be oxide transistors, and the third transistor M3 to the seventh transistor M7 may be low-temperature poly silicon transistors.

In an exemplary implementation, a voltage value of a signal of the first initial signal line INIT1 is constant and the signal is a Direct Current (DC) signal. The voltage value of the signal of the first initial signal line INIT1 may be −3V.

In an exemplary implementation, the voltage value of the signal of the second initial signal line INIT2 is constant and the signal is a DC signal, and the voltage value of the signal of the second initial signal line INIT2 may be 0V.

In an exemplary implementation, the light emitting device L may be electrically connected with the fourth node N4 and the low-level power supply line VSS, respectively.

In an exemplary implementation, a high-level power supply line VDD continuously provides a high-level signal, and a low power supply line VSS continuously provides a low-level signal.

Figure 6:
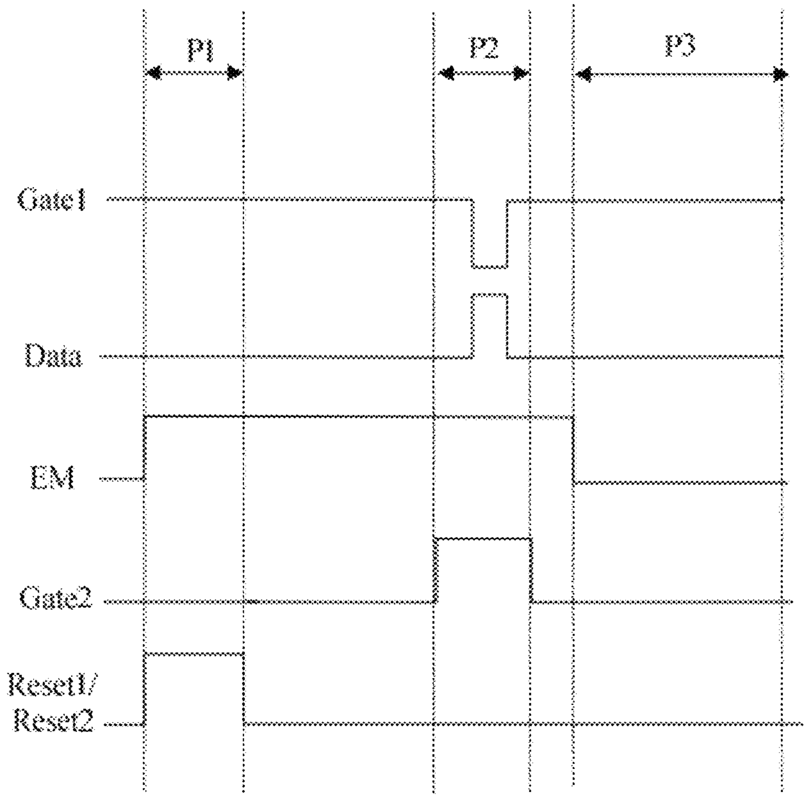
FIG. 6 is a working timing diagram of the pixel drive circuit provided in FIG. 5.

FIG. 6 is a working timing diagram of the pixel drive circuit provided in FIG. 5. Exemplary embodiments of the present disclosure are described below through an operation process of the pixel drive circuit illustrated in FIG. 5 in a display stage. FIG. 6 illustrates an exemplary embodiment in which a first transistor M1 and a second transistor M2 are N-type transistors and a third transistor M3 to a seventh transistor M7 are P-type transistors, and the signal of the second reset signal line Reset2 is the same as the signal of the first reset signal line Reset1. A pixel drive circuit in FIG. 5 includes a first transistor M1 to a seventh transistors M7, one capacitor C, and nine signal lines (a Data signal line Data, a first scan signal line Gate1, a second scan signal line Gate2, a first reset signal line Reset1, a second reset signal line Reset2, a first initial signal line INIT1, a second initial signal line INIT2, a light emitting signal line EM, and a high-level power supply line VDD).

As shown in conjunction with FIG. 5, and FIG. 6, the operation process of the Pixel Drive Circuit may include following stages.

In a first stage P1, referred as an initialization stage, the signals of the first reset signal line Reset1 and the second reset signal line Reset2 are high-level signals, the first transistor M1 is turned on, and the signal of the first initial signal line INIT1 is written into the first node N1 or the third node N3 through the turned-on first transistor M1, so as to initialize (reset) the first node N1 or the third node N3, empty the pre-stored voltage inside it and complete the initialization; the seventh transistor M7 is turned on, the signal of the second initial signal line INIT2 is written into the fourth node N4 through the turned-on seventh transistor M7, so as to initialize (reset) the first electrode of the light-emitting device L, empty the pre-stored voltage inside it and complete the initialization.

In a second stage P2, referred to as a data writing stage or a threshold compensation stage, the signal of the first scan signal line Gate1 is a low-level signal, the signal of the second scan signal line Gate2 is a high-level signal, and the data signal line Data outputs a data voltage. In this stage, since the first node N1 is a low-level signal, the third transistor M3 is turned on. The signal of the first scanning signal line Gate1 is a low-level signal, the fourth transistor M4 is turned on, the signal of the second scanning signal line Gate2 is a high-level signal, the second transistor M2 is turned on, the data voltage outputted from the data signal line Data is provided to the first node N1 through the turned-on fourth transistor M4, the second node N2, the turned-on third transistor M3, the third node N3 and the turned-on second transistor M2, the difference between the data voltage outputted from the data signal line Data and the threshold voltage of the third transistor M3 is charged into the capacitor C until the voltage of the first node N1 is Vd−|Vth|, where Vd is the data voltage outputted from the data signal line Data and Vth is the threshold voltage of the third transistor M3.

In a third stage P3, referred to as a light emitting stage, the signal of the light emitting signal line EM is the low-level signal, the fifth transistor M5 and the sixth transistor M6 are turned on, and a power supply voltage output by the high-level power supply line VDD provides a drive voltage to the first electrode of the light emitting device L through the turned-on fifth transistor M5, the third transistor M3, and the sixth transistor M6, to drive the light emitting device L to emit light.

In a drive process of the pixel drive circuit, a drive current flowing through the third transistor M3 (drive transistor) is determined by a voltage difference between the gate electrode and the first electrode of the third transistor T3. Since the voltage of the first node N1 is Vd−|Vth|, the drive current of the third transistor M3 is as follows:

$$I=K^*(Vgs-Vth)^2=K^*[(Vdd-Vd+|Vth|)-Vth]^2=K^*(Vdd-Vd)^2$$

Among them, I is the drive current flowing through the third transistor M3, that is, a drive current for driving the light emitting device L, K is a constant, Vgs is the voltage difference between the gate electrode and the first electrode of the third transistor M3, Vth is the threshold voltage of the third transistor M3, Vd is the data voltage output by the data signal line Data, and Vdd is the power supply voltage output by the high-level power supply line VDD.

In some exemplary embodiments, the light emitting device L may include any one of an organic light emitting diode (OLED), a quantum dot light emitting diode, and an inorganic light emitting diode. For example, the light emitting device may employ a micron-scale light emitting device, such as a Micro Light emitting Diode (Micro LED), a Mini Light emitting Diode (Mini LED), a Micro Organic Light Emitting Diode (Micro OLED), and the like, which are not limited by the embodiments of the present disclosure. For example, taking a case in which the light emitting device L is an organic electroluminescent diode (OLED) as an example, the light emitting device may include a first electrode (for example, as an anode), an organic light emitting layer, and a second electrode (for example, as a cathode) which are stacked.

In an exemplary implementation, the organic emitting layer may include an Emitting Layer (EML), and any one or more of following: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation, one or more of hole injection layers, hole transport layers, electron block layers, hole block layers, electron transport layers and electron injection layers of all sub-pixels may be connected together to form a common connected layer. The emitting layers of adjacent sub-pixels may overlap slightly with each other, or may be isolated from each other.

In an exemplary implementation, the gate signal line may include a first scan signal line, a second scan signal line, a light emitting signal line, a first reset signal line, and a second reset signal line.

In an exemplary implementation, the gate driver includes at least one gate drive circuit. The number of gate drive circuits depends on the gate signal lines. Taking the display substrate of the pixel drive circuit provided in FIG. 5 as an example, the gate drive circuit includes a first scan drive circuit, a second scan drive circuit and a light emitting drive circuit. The first scan drive circuit is electrically connected with the first scan signal line, the first reset signal line and the second reset signal line. The second scan drive circuit is electrically connected with the second scan signal. The light emitting drive circuit is electrically connected with the light emitting signal line.

Figure 7:
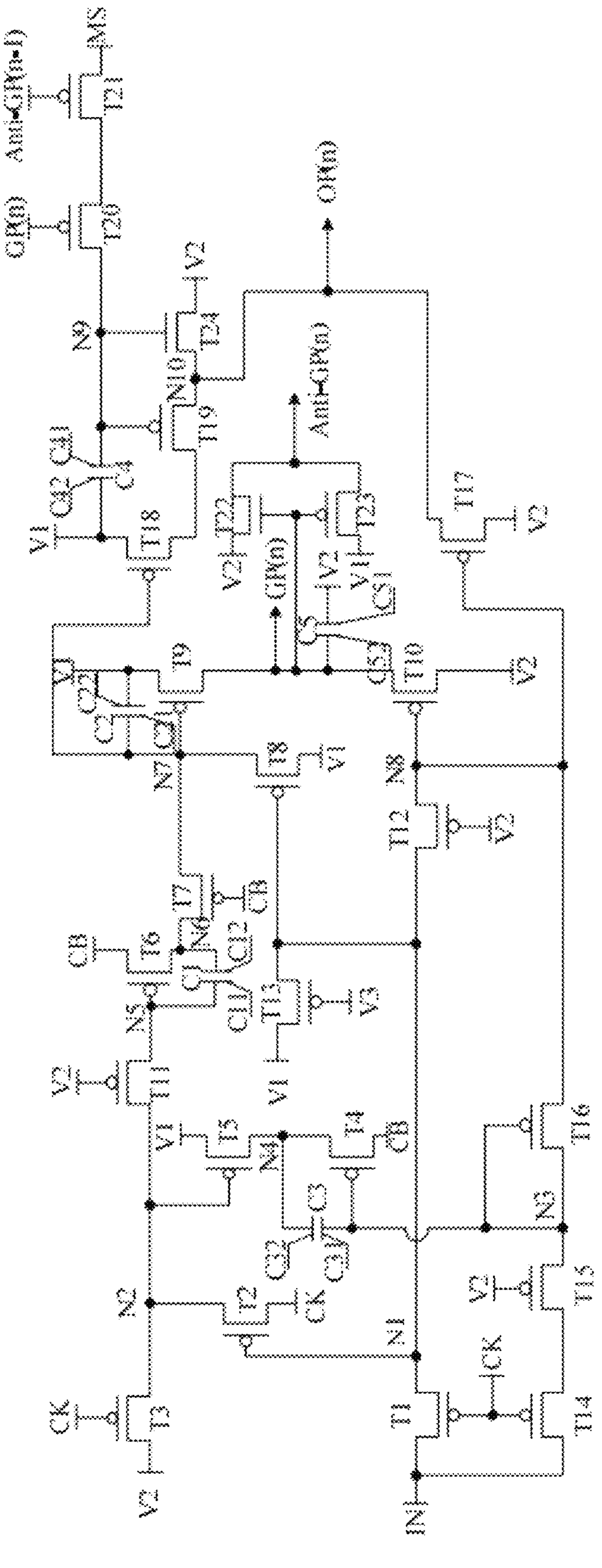
FIG. 7 is an equivalent circuit diagram of a shift register.

In an exemplary implementation, any gate drive circuit in the gate driver may include a plurality of cascaded shift registers. FIG. 7 is an equivalent circuit diagram of a shift register. As shown in FIG. 7, the shift register may include a shift sub-circuit, a reverse output sub-circuit, a select output sub-circuit, and a latch sub-circuit.

In an exemplary implementation, the shift sub-circuit may be a circuit structure of 10T3C, 10T4C, 12T3C, 12T4C, 13T3C, 13T4C, 16T3C, or 16T4C, which is not limited in this disclosure.

In an exemplary implementation, as shown in FIG. 7, the shift sub-circuit may include a first transistor T1 to a sixteenth transistor T16, a first capacitor C1, a second capacitor C2, a third capacitor C3, and a fifth capacitor C5. A gate electrode of the first transistor T1 is electrically connected with a first clock signal terminal CK1, a first electrode of the first transistor T1 is electrically connected with a signal input terminal IN, and a second electrode of the first transistor T1 is electrically connected with a first node N1; a gate electrode of the second transistor T2 is electrically connected with the first node N1, a first electrode of the second transistor T2 is electrically connected with the first clock signal terminal CK1, and a second electrode of the second transistor T2 is electrically connected with a second node N2; a gate electrode of the third transistor T3 is electrically connected with the first clock signal terminal CK1, a first electrode of the third transistor T3 is electrically connected with a second power supply terminal V2, and a second electrode of the third transistor T3 is electrically connected with the second node N2; a gate electrode of the fourth transistor T4 is electrically connected with a third node N3, a first electrode of the fourth transistor T4 is electrically connected with a second clock signal terminal CK2, and a second electrode of the fourth transistor T4 is electrically connected with a fourth node N4; a gate electrode of the fifth transistor T5 is electrically connected with the second node N2, a first electrode of the fifth transistor T5 is electrically connected with a first power supply terminal V1, and a second electrode of the fifth transistor T5 is electrically connected with a fourth node N4; a gate electrode of the sixth transistor T6 is electrically connected with a fifth node N5, a first electrode of the sixth transistor T6 is electrically connected with the second clock signal terminal CK2, and a second electrode of the sixth transistor T6 is electrically connected with a sixth node N6; a gate electrode of the seventh transistor T7 is electrically connected with the second clock signal terminal CK2, a first electrode of the seventh transistor T7 is electrically connected with the sixth node N6, and a second electrode of the seventh transistor T7 is electrically connected with a seventh node N7; a gate electrode of the eighth transistor T8 is electrically connected with the first node N1, a first electrode of the eighth transistor T8 is electrically connected with the first power supply terminal V1, and a second electrode of the eighth transistor T8 is electrically connected with the seventh node N7; a gate electrode of the ninth transistor T9 is electrically connected with the seventh node N7, a first electrode of the ninth transistor T9 is electrically connected with the first power supply terminal V1, and a second electrode of the ninth transistor T9 is electrically connected with a cascaded signal output terminal GP (n); a gate electrode of the tenth transistor T10 is electrically connected with an eighth node N8, a first electrode of the tenth transistor T10 is electrically connected with a second power supply terminal V2, and a second electrode of the tenth transistor T10 is electrically connected with the cascaded signal output terminal GP (n); a gate electrode of the eleventh transistor T11 is electrically connected with the second power supply terminal V2, a first electrode of the eleventh transistor T11 is electrically connected with the second node N2, and a second electrode of the eleventh transistor T11 is electrically connected with the fifth node N5; a gate electrode of the twelfth transistor T12 is electrically connected with the second power supply terminal V2, a first electrode of the twelfth transistor T12 is electrically connected with the first node N1, and a second electrode of the twelfth transistor T12 is electrically connected with the eighth node N8; a gate electrode of the thirteenth transistor T13 is electrically connected with a third power supply terminal V3, a first electrode of the thirteenth transistor T13 is electrically connected with the first power supply terminal V1, and a second electrode of the thirteenth transistor T13 is electrically connected with the first node N1; a gate electrode of the fourteenth transistor T14 is electrically connected with the first clock signal terminal CK1, a first electrode of the fourteenth transistor T14 is electrically connected with a signal input terminal IN, and a second electrode of the fourteenth transistor T14 is electrically connected with a first electrode of the fifteenth transistor T15; a gate electrode of the fifteenth transistor T15 is electrically connected with the second power supply terminal V2, and a second electrode of the fifteenth transistor T15 is electrically connected with the third node N3; a gate electrode of the sixteenth transistor T16 is electrically connected with the third node N3, a first electrode of the sixteenth transistor T16 is electrically connected with the third node N3, and a second electrode of the sixteenth transistor T16 is electrically connected with the eighth node N8; a first plate C11 of the first capacitor C1 is electrically connected with the fifth node N5, a second plate C1 of the first capacitor C1 is electrically connected with the sixth node N6, a first plate C21 of the second capacitor C2 is electrically connected with the seventh node N7, a second plate C22 of the second capacitor C2 is electrically connected with the first power supply terminal V1, a first plate C31 of the third capacitor C3 is electrically connected with the third node N3, a second plate C32 of the third capacitor C3 is electrically connected with the fourth node N4, a first plate C51 of the fifth capacitor C5 is electrically connected with the second power supply terminal V2, and a second plate C52 of the fifth capacitor C5 is electrically connected with the cascaded signal output terminal GP (n). FIG. 7 is illustrated by an example of 16T4C.

In an exemplary implementation, when the shift sub-circuit is a circuit structure of 10T3C, the shift sub-circuit includes a first transistor T1 to a tenth transistor T10 and a first capacitor C1 to a third capacitor C3.

In an exemplary implementation, when the shift sub-circuit is a circuit structure of 10T4C, the shift sub-circuit includes a first transistor T1 to a tenth transistor T10 and a first capacitor C1 to a third capacitor C3 and a fifth capacitor C5.

In an exemplary implementation, when the shift sub-circuit is a circuit structure of 12T3C, the shift sub-circuit includes a first transistor T1 to a twelfth transistor T12 and a first capacitor C1 to a third capacitor C3.

In an exemplary implementation, when the shift sub-circuit is a circuit structure of 12T4C, the shift sub-circuit includes a first transistor T1 to a twelfth transistor T12 and a first capacitor C1 to a third capacitor C3 and a fifth capacitor C5.

In an exemplary implementation, when the shift sub-circuit is a circuit structure of 13T3C, the shift sub-circuit includes a first transistor T1 to a thirteenth transistor T13 and a first capacitor C1 to a third capacitor C3.

In an exemplary implementation, when the shift sub-circuit is a circuit structure of 13T4C, the shift sub-circuit includes a first transistor T1 to a thirteenth transistor T13 and a first capacitor C1 to a third capacitor C3 and a fifth capacitor C5.

In an exemplary implementation, when the shift sub-circuit is a circuit structure of 16T3C, the shift sub-circuit includes a first transistor T1 to a sixteenth transistor T16 and a first capacitor C1 to a third capacitor C3.

In an exemplary implementation, as shown in FIG. 7, the selection output sub-circuit may include a seventeenth transistor T17, an eighteenth transistor T18, a nineteenth transistor T19, a twenty-fourth transistor T24, and a fourth capacitor C4. A gate electrode of the seventeenth transistor T17 is electrically connected with the eighth node N8, a first electrode of the seventeenth transistor T17 is electrically connected with the second power supply terminal V2, a second electrode of the seventeenth transistor T17 is electrically connected with a drive signal output terminal OP (n); a gate electrode of the eighteenth transistor T18 is electrically connected with the seventh node N7, a first electrode of the eighteenth transistor T18 is electrically connected with the first power supply terminal V1, a second electrode of the eighteenth transistor T18 is electrically connected with a first electrode of the nineteenth transistor T19; a gate electrode of the nineteenth transistor T19 is electrically connected with a ninth node N9, a second electrode of the nineteenth transistor T19 is electrically connected with the drive signal output terminal OP (n); a gate electrode of the twenty-fourth transistor T24 is electrically connected with the ninth node N9, a first electrode of the twenty-fourth transistor T24 is electrically connected with the second power supply terminal V2, a second electrode of the twenty-fourth transistor T24 is electrically connected with the drive signal output terminal OP (n); a first plate C41 of the fourth capacitor C4 is electrically connected with the ninth node N9, and a second plate C42 of the fourth capacitor C4 is electrically connected with the first power supply terminal V1.

In an exemplary implementation, as shown in FIG. 7, the reverse output sub-circuit may include a twenty-second transistor T22 and a twenty-third transistor T23. A gate electrode of the twenty-second transistor T22 is electrically connected with the cascaded signal output terminal GP (n), a first electrode of the twenty-second transistor T22 is electrically connected with the second power supply terminal V2, a second electrode of the twenty-second transistor T22 is electrically connected with a reverse signal output terminal Anti-GP (n); a gate electrode of the twenty-third transistor T23 is electrically connected with the cascaded signal output terminal GP (n), a first electrode of the twenty-third transistor T23 is electrically connected with the first power supply terminal V1, and a second electrode of the twenty-third transistor T23 is electrically connected with the reverse signal output terminal Anti-GP (n).

In an exemplary implementation, as shown in FIG. 7, the latch sub-circuit may include a twentieth transistor T20 and a twenty-first transistor T21. A gate electrode of the twentieth transistor T20 is electrically connected with the cascaded signal output terminal GP (n), a first electrode of the twentieth transistor T20 is electrically connected with the ninth node N9, a second electrode of the twentieth transistor T20 is electrically connected with a second electrode of the twenty-first transistor T21; a gate electrode of the twenty-first transistor T21 is electrically connected with a reverse signal output terminal Anti-GP (n−1) of a shift register of previous stage, and a second electrode of the twenty-first transistor T21 is electrically connected with the masking signal terminal MS.

The shift register provided by the present disclosure can lock the control signal of the corresponding masking signal terminal into the selection output sub-circuit according to the requirement of the refresh rate of the display region, and can achieve the control of the signal output by the drive signal output terminal, and achieve different refresh rates in different regions of the display panel, that is, high and low refresh rates can coexist in the same frame picture. The embodiments of the present disclosure are not limited to achieving different refresh rates in a fixed region of the display panel, and can achieve dynamic refresh in any region, thereby reducing the power consumption of the display panel; at the same time, the latch sub-circuit can use a phase difference of the cascade signals output from the shift sub-circuits of previous and next stages to store the control signals of the masking signal terminal into the shift register of each stage, so as to achieve the continuous and correct output of the shift register of the present stage.

In an exemplary implementation, any one of the first capacitor C1 to fifth capacitor C5 may be a capacitor device fabricated by a process, for example, the capacitor device may be implemented by fabricating a special capacitor electrode, and a plurality of capacitor electrodes of the capacitor may be implemented by metal layers, semiconductor layers (e.g. doped polysilicon), or the like. Alternatively, any one of the first capacitor C1 to the fifth capacitor C5 may be a parasitic capacitance between a plurality of devices, and may be implemented by the transistor itself and other devices or lines. The connection mode of any one of the first capacitor C1 to the fifth capacitor C5 includes but is not limited to the mode described above, and may be another suitable connection mode which may store the level of the corresponding node. Herein, the illustrative embodiments of the present disclosure are not limited thereto.

In an exemplary implementation, the transistors may be divided into N type transistors and P type transistors according to their characteristics. When a transistor is a P-type transistor, its turn-on voltage is a low-level voltage (e.g., 0V, −5 V, −10 V, or another suitable voltage), and its turn-off voltage is a high-level voltage (e.g., 5 V, 10 V, or another suitable voltage). When a transistor is an N-type transistor, its turn-on voltage is a high-level voltage (e.g., 5 V, 10 V, or another suitable voltage), and its turn-off voltage is a low-level voltage (e.g., 0 V, −5 V, −10 V, or another suitable voltage).

In an exemplary implementation, the first transistor T1 to the twentieth transistor T21 and the twenty-third transistor T23 are P-type transistors, while the twentieth transistor T22 and the twenty-fourth transistor T24 are N-type transistors.

In an exemplary implementation, the signal of the masking signal terminal MS may be a low-level signal or may be a high-level signal. When the signal of the masking signal terminal MS is a low-level signal, it may be −20V to −5V, and when the signal of the masking signal terminal MS is a high-level signal, it may be 5V to 20V.

In an exemplary implementation, the signal of the first power supply terminal V1 may be a high-level signal, such as 5 V to 10 V; the signal of the second power supply terminal V2 may be a low-level signal, such as −10 V to −5 V.

In an exemplary implementation, the signals at either of the first clock signal terminal CK1 and the second clock signal terminal CK2 is square wave signals that repeat high and low voltages. Exemplarily, the signals at the first clock signal terminal CK1 and the second clock signal terminal CK2 may have the same period and may be configured as phase-shifted signals. Here, the signals at the second clock signal terminal CK2 may be phase shifted by half period compared to the signals at the first clock signal terminal CK1. A high voltage period of a signal at either of the first clock signal terminal CK1 and the second clock signal terminal CK2 in each cycle may be set longer than a low voltage period.

In an exemplary implementation, the third power supply terminal V3 is a low-level signal during startup initialization stage, which prevents the ninth transistor T9 and the tenth transistor T10 of a control shift register in a last stage from simultaneously being turned on because of delay of an output signal, or is a low-level signal during abnormal shutdown stage, which prevents the ninth transistor T9 and the tenth transistor T10 from simultaneously being turned on. The third power supply terminal V3 continuously provides the high-level signal during normal display stage, i.e., the thirteenth transistor T13 is turned off during the normal display stage.

In an exemplary implementation, the drive signal output by the drive signal output terminal OP (n) of the shift register is mainly used to control at least one transistor (for example, the second transistor M2) in the pixel drive circuit of the display substrate. When the display substrate is in a refresh frame, the drive signal output terminal OP (n) outputs a high-level signal for a period of time, and outputs a low-level signal for the rest of the time period within one frame, and controls the second transistor M2 to turn on, so as to achieve the refresh of the data voltage. When the display substrate is not in the refresh frame, the drive signal output terminal OP (n) outputs a low-level signal all the time, and the second transistor M2 cannot be turned on.

Figure 8:
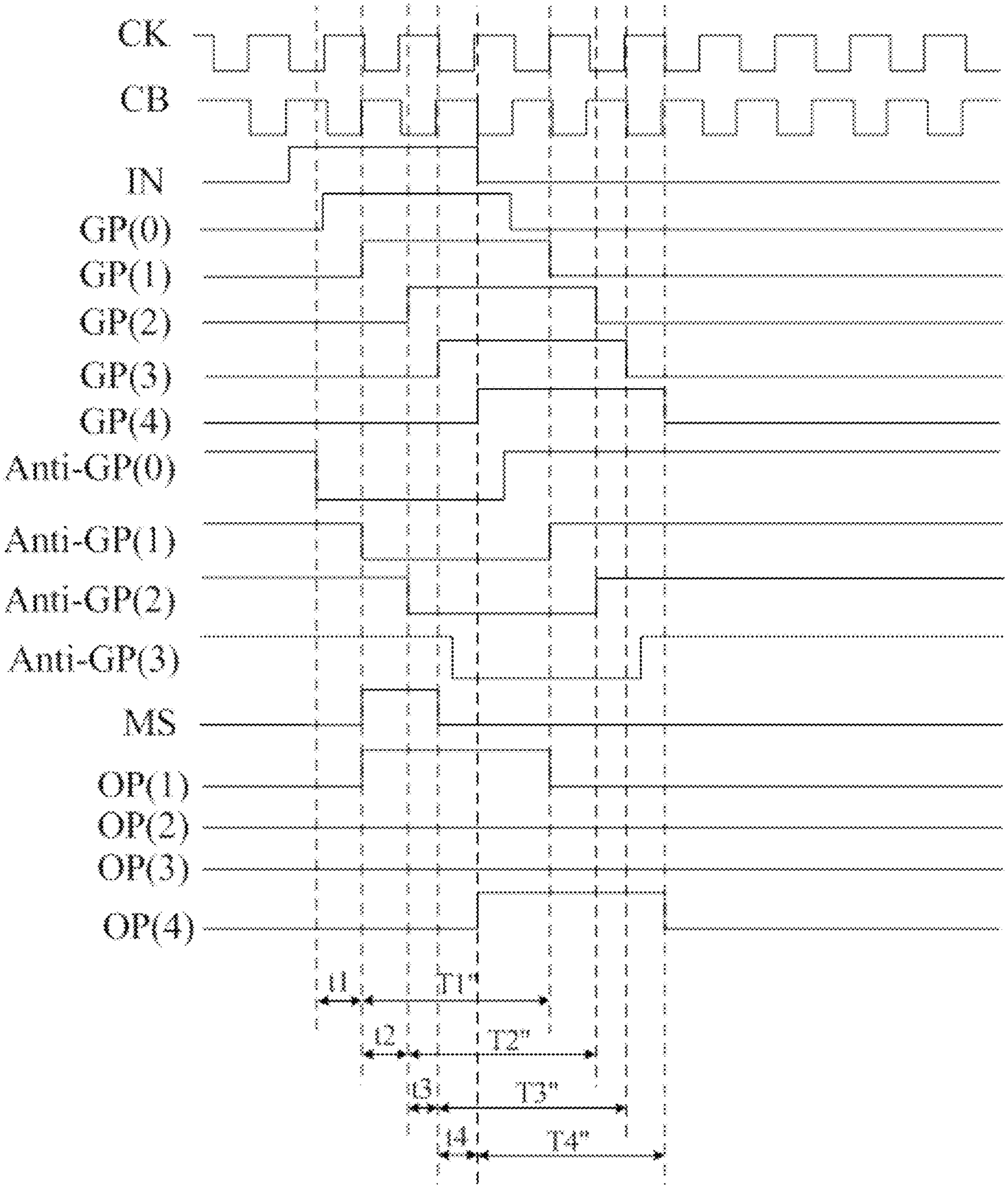
FIG. 8 is a working timing diagram of partial shift registers.

FIG. 8 is a working timing diagram of partial shift registers. Taking the shift register shown in FIG. 7 as an example, the working principle of the shift register provided by the embodiment of the present disclosure, which achieves the control of the display panel to have different refresh rates in different regions, is described in conjunction with the signal timing diagram shown in FIG. 8, and FIG. 8 is illustrated by an example of the shift registers of first four stages.

The signal timing diagram shown in FIG. 8 only takes the input (IN) and output (OP (1), OP (2), OP (3), OP (4)) of the shift registers of first four stages as an example. For example, when the region corresponding to the second sub-pixel and the third sub-pixel in the display panel is a low refresh rate region, and the region corresponding to the first sub-pixel and the fourth sub-pixel is a high refresh rate region, the twentieth transistor T20 and the twenty-first transistor T21 are both turned on when the signal of the cascaded signal output terminal GP (1) of a shift register of first stage and the signal of the reverse signal output terminal Anti-GP (0) of previous stage are both low-level signals (time t1). That is, the low-level signal of the masking signal terminal MS is locked into the fourth capacitor C4 of the selection output sub-circuit at time t1. When the first cascaded signal output terminal GP (1) outputs a high-level signal (time T1"), the eighteenth transistor T18 is turned on. Since the fourth capacitor C4 maintains the low-level signal of the masking signal terminal MS at time t1, the nineteenth transistor T19 is turned on and the twenty-fourth transistor T24 is turned off, the drive signal output terminal OP (1) of the shift register of first stage outputs a high-level signal of the first power supply terminal V1 at time T1", so as to achieve a high refresh rate of the first row of sub-pixels in the display region. The maintaining time of the drive signal output terminal OP (1) of the shift register of first stage outputting the high-level signal of the first power supply terminal V1 can be set according to the actual demand. For example, the duration of the drive signal output terminal OP (1) of the shift register of first stage outputting the high-level signal of the first power supply terminal V1 may overlap with the duration of the drive signal output terminal OP (4) of a shift register of fourth stage outputting the high-level signal of the first power supply terminal V1, and the pixel drive circuit corresponding to the drive signal output terminal OP (4) of the shift register of fourth stage may be pre-charged. Similarly, the duration of the drive signal output terminals OP (n) of shift registers of other stages outputting level signal is similar, which will not be repeated.

As shown in FIG. 8, when the signal of the cascaded signal output terminal GP (2) of a shift register of second stage and the signal of the reverse signal output terminal Anti-GP (1) of previous stage are both low-level signals (time t2), the twentieth transistor T20 and the twenty-first transistor T21 are both turned on. That is, the high-level signal of the masking signal terminal MS is locked into the fourth capacitor C4 of the selection output sub-circuit at time t2. When the cascaded signal output terminal GP (2) of second stage outputs a high-level (time T2"), the eighteenth transistor T18 is turned on. Since the fourth capacitor C4 maintains the high-level signal of the masking signal terminal MS at time t2, the nineteenth transistor T19 is turned off and the twentieth transistor T20 is turned on, the drive signal output terminal OP (2) of the shift register of second stage outputs a low-level signal of the second power supply terminal V2 at time T2", so as to achieve a low refresh rate of a second row of sub-pixels in the display region.

When the signal of the cascaded signal output terminal GP (3) of a shift register of third stage and the signal of the reverse signal output terminal Anti-GP (2) of previous stage are both low-level signals (time t3), the twentieth transistor T20 and the twenty-first transistor T21 are both turned on. That is, the high-level signal of the masking signal terminal MS is locked into the fourth capacitor C4 of the selection output sub-circuit at time t3. When the cascaded signal output terminal GP (3) of third stage outputs a high-level (time T3"), the eighteenth transistor T18 is turned on. Since the fourth capacitor C4 maintains the high-level signal of the masking signal terminal MS at time t3, the nineteenth transistor T19 is turned off and the twentieth transistor T20 is turned on, the drive signal output terminal OP (3) of the shift register of third stage outputs a low-level signal of the second power supply terminal V2 at time T3", so as to achieve a low refresh rate of a third row of sub-pixels in the display region.

When the signal of the cascaded signal output terminal GP (4) of a shift register of fourth stage and the signal of the reverse signal output terminal Anti-GP (3) of previous stage are both low-level signals (time t4), the twentieth transistor T20 and the twenty-first transistor T21 are both turned on. That is, the low-level signal of the masking signal terminal MS is locked into the fourth capacitor C4 of the selection output sub-circuit at time t4. When the cascaded signal output terminal GP (4) of fourth stage outputs a high-level (time T4"), the eighteenth transistor T18 is turned on. Since the fourth capacitor C4 maintains the low-level signal of the masking signal terminal MS at time t4, the nineteenth transistor T19 is turned on and the twentieth transistor T20 is turned off, the drive signal output terminal OP (4) of the shift register of fourth stage outputs a high-level signal of the first power supply terminal V1 at time T4", so as to achieve a high refresh rate of a fourth row of sub-pixels in the display region.

Therefore, when a low refresh rate is required in a certain region of the display substrate, a high-level signal is supplied by the masking signal terminal MS, and a low-level signal is continuously output by the drive signal output terminal so that part of the transistors corresponding to the pixel drive circuit in the display substrate are turned off, the data voltage in the display substrate is not charged, and the state of the previous frame is maintained, thereby achieving a low refresh rate in the region.

In an exemplary implementation, since the shift register provided in FIG. 7 includes a large number of transistors, the display substrate including the shift register provided in FIG. 7 cannot achieve a narrow bezel.

Figure 9:
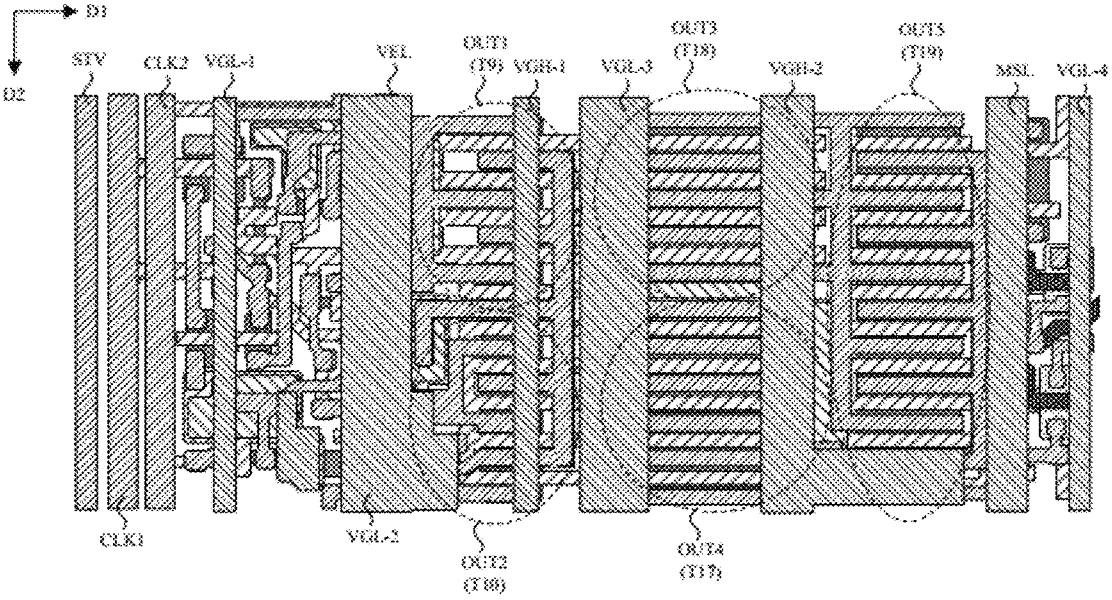
FIG. 9 is a schematic diagram of a structure of a display substrate according to an embodiment of the present disclosure.
Figure 10A:
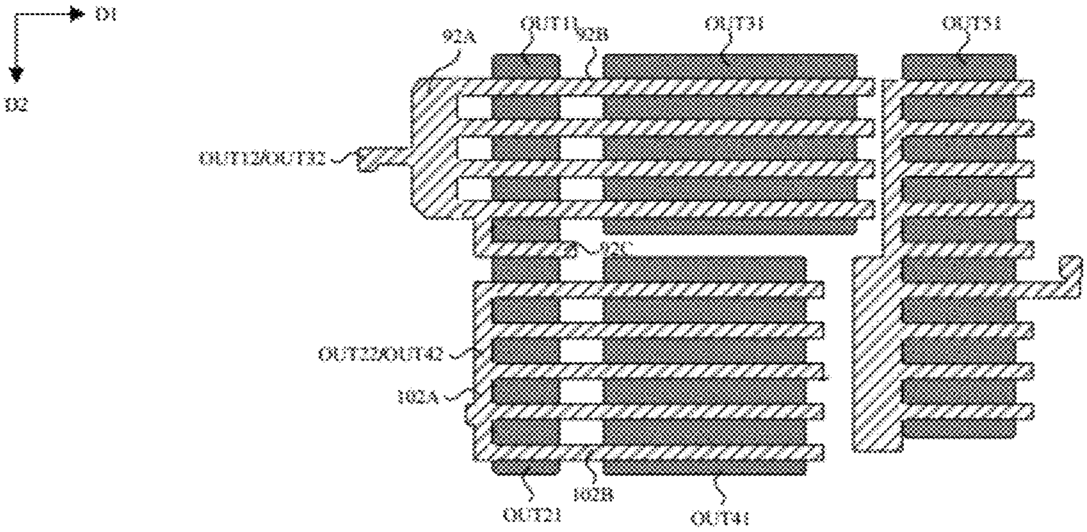
FIG. 10A is a schematic diagram of a part of the film layers of the display substrate provided in FIG. 9.
Figure 10B:
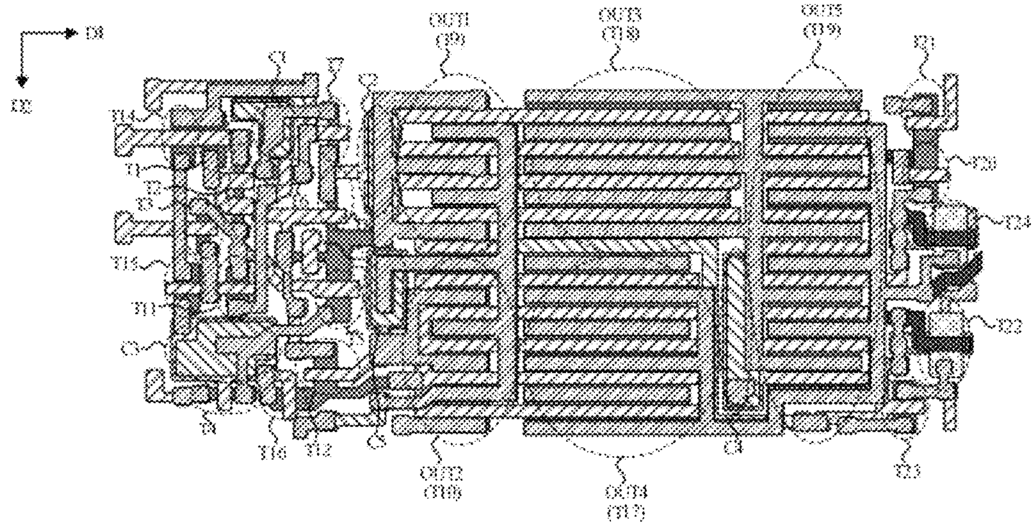
FIG. 10B is a schematic diagram of another part of the film layers of the display substrate provided in FIG. 9.

FIG. 9 is a schematic diagram of a structure of a display substrate provided in an embodiment of the present disclosure, FIG. 10A is a schematic diagram of a part of film layers of the display substrate provided in FIG. 9, and FIG. 10B is a schematic diagram of another part of the film layers of the display substrate provided in FIG. 9. The display substrate provided by the embodiment of the present disclosure has the display region and a non-display region. The display substrate includes: a pixel drive circuit located in the display region and a gate drive circuit group located in the non-display region. The gate drive circuit group at least includes a first drive circuit, the first drive circuit is connected with the pixel drive circuit, and the first drive circuit includes a plurality of cascaded shift registers. The shift register at least includes: a first output transistor OUT1, a second output transistor OUT2, a third output transistor OUT3, a fourth output transistor OUT4, and a fifth output transistor OUT5, a cascaded signal output terminal, a drive signal output terminal, a first power supply terminal, and a second power supply terminal. The drive signal output terminal is electrically connected with the pixel drive circuit. The first output transistor OUT1 is electrically connected with the cascaded signal output terminal and the first power supply terminal, respectively; the second output transistor OUT2 is connected with the cascaded signal output terminal and the second power supply terminal, respectively; the third output transistor OUT3 is connected with the fifth output transistor OUT5 and the first power supply terminal, respectively; the fourth output transistor OUT4 is connected with the drive signal output terminal and the second power supply terminal, respectively; and the fifth output transistor OUT5 is connected with the drive signal output terminal, respectively.

In an exemplary implementation, as shown in FIG. 10A, a gate electrode OUT12 of the first output transistor OUT1 and a gate electrode OUT32 of the third output transistor OUT3 form an integrated structure, and a gate electrode OUT22 of the second output transistor OUT2 and a gate electrode OUT42 of the fourth output transistor OUT4 form an integrated structure.

In an exemplary implementation, the first drive circuit may be connected with a gate electrode of the second transistor of the pixel drive circuit through the second scan signal line.

In an exemplary implementation, as shown in FIGS. 9, 10A, and 10B, the first output transistor OUT1 is the ninth transistor T9 in FIG. 7, the second output transistor OUT2 is the tenth transistor T10 in FIG. 7, the third output transistor OUT3 is the eighteenth transistor T18 in FIG. 7, the fourth output transistor OUT4 is the seventeenth transistor T17 in FIG. 7, and the fifth output transistor OUT5 is the nineteenth transistor T19 in FIG. 7.

In an exemplary implementation, as shown in FIG. 10B, the shift register may further include a fifth capacitor C5. The fifth capacitor C5 is connected with the cascaded signal output terminal and the second power supply terminal, respectively. In an exemplary implementation, with reference to FIG. 7, the fifth capacitor C5 is configured to maintain the stability of the signal of the reverse signal output terminal.

In an exemplary implementation, a capacitance value of the fifth capacitor is less than or equal to 60 farads. If the capacitance value of the fifth capacitor is small, the discharge speed of the fifth capacitor can be increased, and the output of the reverse signal output terminal is guaranteed. The capacitance value of the fifth capacitor is small, so that the area of the plate in the fifth capacitor is small, the area occupied by the shift register can be reduced, and the narrow bezel of the display substrate can be achieved.

In an exemplary implementation, as shown in FIGS. 9, 10A, and 10B, any one of the third output transistor OUT3 and the fourth output transistor OUT4 is located on a side of any one of the first output transistor OUT1 and the second output transistor OUT2 close to the display region, the fifth output transistor OUT5 is located on a side of any one of the third output transistor OUT3 and the fourth output transistor OUT4 close to the display region, and the fifth capacitor C5 is located on a side of the second output transistor OUT2 away from the display region.

In an exemplary implementation, as shown in FIGS. 9, 10A and 10B, the first output transistor OUT1 and the third output transistor OUT3 are arranged along the first direction D1, the second output transistor OUT2 and the fourth output transistor OUT4 are arranged along the first direction D1, the first output transistor OUT1 and the second output transistor OUT2 are arranged along the second direction D2, and the third output transistor OUT3 and the fourth output transistor OUT4 are arranged along the second direction D2, the first direction D1 intersects with the second direction D2.

In an exemplary implementation, the transistor includes an active pattern, a gate electrode, a first electrode, and a second electrode.

In an exemplary implementation, as shown in FIG. 10A, a length of an active pattern OUT11 of the first output transistor OUT1 along the first direction D1 is less than a channel width of an active pattern OUT31 of the third output transistor OUT3 along the first direction D1.

In an exemplary implementation, as shown in FIG. 10A, a channel width of the active pattern OUT11 of the first output transistor OUT1 is less than the channel width of the active pattern OUT31 of the third output transistor OUT3, and a channel length of the active pattern OUT11 of the first output transistor OUT1 is greater than a channel length of the active pattern OUT31 of the third output transistor OUT3.

In an exemplary implementation, the channel width of the active pattern OUT11 of the first output transistor OUT1 ranges from 80 microns to 100 microns. For example, the channel width of the active pattern OUT11 of the first output transistor OUT1 may be 90 microns.

In an exemplary implementation, the channel length of the active pattern OUT11 of the first output transistor OUT1 ranges from 3.2 microns to 3.7 microns. For example, the channel length of the active pattern OUT11 of the first output transistor OUT1 may be 3.5 microns.

In an exemplary implementation, a channel width-to-length ratio of the active pattern OUT11 of the first output transistor OUT1 may be 90/3.5.

In an exemplary implementation, the channel width of the active pattern OUT31 of the third output transistor OUT3 ranges from 250 microns to 300 microns. For example, the channel width of the active pattern OUT311 of the third output transistor OUT3 may be 270 microns.

In an exemplary implementation, the channel length of the active pattern OUT31 of the third output transistor OUT3 ranges from 2.9 microns to 3.2 microns. For example, the channel length of the active pattern OUT311 of the third output transistor OUT3 may be 3.1 microns.

In an exemplary implementation, a channel width-to-length ratio of the active pattern OUT31 of the third output transistor OUT3 may be 270/3.1.

In an exemplary implementation, as shown in FIG. 10A, a length of the active pattern OUT31 of the third output transistor OUT3 along the first direction D1 is greater than a length of an active pattern OUT41 of the fourth output transistor OUT4 along the first direction D1, and a length of the active pattern OUT31 of the third output transistor OUT3 along the second direction D2 is less than a length of the active pattern OUT41 of the fourth output transistor OUT4 along the second direction D2.

In an exemplary implementation, as shown in FIG. 10A, a length of an active pattern OUT21 of the second output transistor OUT2 along the first direction D1 is less than the length of the active pattern OUT41 of the fourth output transistor OUT4 along the first direction D1.

In an exemplary implementation, as shown in FIG. 10A, a channel width of the active pattern OUT21 of the second output transistor OUT2 is less than a channel width of the active pattern OUT41 of the fourth output transistor OUT4, and a channel length of the active pattern OUT21 of the second output transistor OUT2 is greater than a channel length of the active pattern OUT41 of the fourth output transistor OUT4.

In an exemplary implementation, the channel width of the active pattern OUT21 of the second output transistor OUT2 ranges from 80 microns to 100 microns. For example, the channel width of the active pattern OUT21 of the second output transistor OUT2 may be 90 microns.

In an exemplary implementation, the channel length of the active pattern OUT21 of the second output transistor OUT2 ranges from 3.2 microns to 3.7 microns. For example, the channel length of the active pattern OUT21 of the second output transistor OUT2 may be 3.5 microns.

In an exemplary implementation, a channel width-to-length ratio of the active pattern OUT21 of the second output transistor OUT2 may be 90/3.5.

In an exemplary implementation, the channel width of the active pattern OUT41 of the fourth output transistor OUT4 ranges from 250 microns to 300 microns. For example, the channel width of the active pattern OUT411 of the fourth output transistor OUT4 may be 270 microns.

In an exemplary implementation, the channel length of the active pattern OUT41 of the fourth output transistor OUT4 ranges from 2.9 microns to 3.2 microns. For example, the channel length of the active pattern OUT411 of the fourth output transistor OUT4 may be 3.1 microns.

In an exemplary implementation, a channel width-to-length ratio of the active pattern OUT41 of the fourth output transistor OUT4 is 270/3.1.

In an exemplary implementation, as shown in FIG. 10A, a length of an active pattern OUT51 of the fifth output transistor OUT5 along the second direction D2 is greater than the length of the active pattern of any of the third output transistor OUT3 and the fourth output transistor OUT4 along the second direction D2.

In an exemplary implementation, as shown in FIG. 10A, a channel width of the active pattern OUT51 of the fifth output transistor OUT5 ranges from 250 microns to 300 microns. For example, the channel width range of the active pattern OUT51 of the fifth output transistor OUT5 is 270 microns.

In an exemplary implementation, as shown in FIG. 10A, the channel length of the active pattern OUT51 of the fifth output transistor OUT5 ranges from 2.9 microns to 3.2 microns. For example, the channel length range of the active pattern OUT51 of the fifth output transistor OUT5 is 3.1 microns.

In an exemplary implementation, a channel width-to-length ratio of the active pattern OUT51 of the fifth output transistor OUT5 may be 270/3.1.

In an exemplary implementation, as shown in FIG. 10A, the active pattern OUT51 of the fifth output transistor OUT5 extends along the second direction D2. The extension of the active pattern OUT51 of the fifth output transistor OUT5 along the second direction D2 can reduce the width of the shift register along the first direction, thereby reducing the area occupied by the shift register, and can achieve a narrow bezel. In an exemplary implementation, the channel width of the active pattern of any one of the third transistor OUT3 to the fifth output transistor OUT5 is greater than the channel width of the active pattern of any one of the first transistor OUT1 and the second output transistor OUT2. The channel length of the active pattern of any one of the third output transistor OUT3 to the fifth output transistor OUT5 is similar to the channel length of the active pattern of any one of the first output transistor OUT1 and the second output transistor OUT2, so that the current amplification factor of the third output transistor OUT3 to the fifth output transistor OUT5 is greater than that of any one of the first output transistor OUT1 and the second output transistor OUT2. The driving ability of the output signal to the drive signal output terminal can be improved, the performance of the shift register can be improved, and the reliability of the display substrate can be improved.

In an exemplary implementation, as shown in FIG. 10A, the active pattern OUT11 of the first output transistor OUT1 and the active pattern OUT21 of the second output transistor OUT2 are the same active pattern.

In an exemplary implementation, as shown in FIG. 10A, a length of the gate electrode OUT22 of the third output transistor OUT2 along the first direction D1 is greater than a length of the gate electrode OUT42 of the fourth output transistor OUT4 along the first direction D1.

In an exemplary implementation, as shown in FIG. 10A, a length of a gate electrode OUT52 of the fifth output transistor OUT5 along the second direction D2 is greater than a length of the gate electrode of any one of the first output transistor OUT1 and the second output transistor OUT2 along the second direction D2.

In an exemplary implementation, as shown in FIG. 10A, the integrated structure of the gate electrode OUT12 of the first output transistor OUT1 and the gate electrode OUT32 of the third output transistor OUT3 may include: a first connection section 92A, an adapter section 92C, and a plurality of first branch sections 92B. The first branch section 92B and the adapter section 92C are located on the side of the first connection section 92A close to the display region, the first connection section 92A is electrically connected with a plurality of first branch sections 92B respectively, and one end of the adapter section 92C is electrically connected with a middle portion of one of the first branch sections 92B.

In an exemplary implementation, as shown in FIG. 10A, the first connection section 92A extends at least partially along the second direction D2, the first branch section 92B extends at least partially along the first direction D1, a plurality of first branch sections 92B are arranged along the second direction D2, and the adapting section 92C is in a bend line shape and partly extends along the first direction D1.

In an exemplary implementation, as shown in FIG. 10A, a length of the first branch section 92B along the first direction D1 is greater than a length of the adapter section 92C along the first direction D1.

In an exemplary implementation, as shown in FIG. 10A, the integrated structure of the gate electrode OUT22 of the second output transistor OUT2 (and the gate electrode OUT42 of the fourth output transistor OUT4) may include: a second connection section 102A and a plurality of second branch sections 102B. The second branch section 102B is located on a side of the second connection section 102A close to the display region, and the second connection section 102A is connected with a plurality of second branch sections 102B, respectively.

In an exemplary implementation, as shown in FIG. 10A, the second connection section 102A extends at least partially along the second direction D2, the second branching section 102B extends at least partially along the first direction D1, and a plurality of second branching sections 102B are arranged along the second direction D2.

In an exemplary implementation, as shown in FIG. 10A, the length of the first branch section 92B along the first direction D1 is greater than a length of the second branch section 102B along the second direction D2.

In an exemplary implementation, as shown in FIG. 10B, the shift register may further include a fourth capacitor C4. The fourth capacitor C4 is connected with the fifth output transistor OUT5 and the first power supply terminal, respectively.

In an exemplary implementation, a capacitance value of the fourth capacitor ranges from 120 farads to 130 farads. For example, the capacitance value of the fourth capacitor is 125.6 farads.

In an exemplary implementation, as shown in FIG. 10B, the fourth capacitor C4 is located between the second output transistor OUT2 and the fourth output transistor OUT4.

In an exemplary implementation, as shown in FIG. 10B, the shift register may further include a twenty-fourth transistor T24. The twenty-fourth transistor T24 is connected with the fifth output transistor OUT5 and the second power supply terminal, respectively.

In an exemplary implementation, the transistor type of the twenty-fourth transistor T24 is opposite to the transistor type of any one of the first output transistor OUT1 to the fifth output transistor OUT5.

In an exemplary implementation, as shown in FIG. 10B, the twenty-fourth transistor T24 is located on a side of the fifth output transistor OUT5 close to the display region, and is arranged along the first direction D1 with the first output transistor OUT1 and the third output transistor OUT3.

In an exemplary implementation, the shift register may further include a twentieth transistor T20, a twenty-first transistor T21, a twenty-second transistor T22, a twenty-third transistor T23, a reverse signal output terminal, and a masking signal terminal. The twentieth transistor T20 is connected with the cascaded signal output terminal, the fifth output transistor OUT5, and the twenty-first transistor T21, respectively; the twenty-first transistor T21 is connected with the reverse signal output terminal and the masking signal terminal of the shift register of previous stage, respectively; the twenty-second transistor T22 is connected with the cascaded signal output terminal, the reverse signal output terminal and the second power supply terminal, respectively; the twenty-third transistor T23 is connected with the cascaded signal output terminal, the reverse signal output terminal and the first power supply terminal, respectively.

In an exemplary implementation, the transistor type of the twenty-second transistor T22 is opposite to the transistor type of any one of the first output transistor OUT1 to the fifth output transistor OUT5, the twentieth transistor T20, the twenty-first transistor T21, and the twenty-third transistor T23.

In an exemplary implementation, as shown in FIG. 10B, the twentieth transistor T20 to the twenty-third transistor T23 are located on a side of the fifth output transistor OUT5 close to the display region. The twenty-first transistor T21 and the twentieth transistor T20 are arranged along the second direction D2, and the twentieth transistor T20 is located on a side of the twenty-first transistor T21 close to the twenty-second transistor T22, and the twenty-third transistor T23 is located between the twenty-second transistor T22 and the fifth output transistor OUT5, and is located on a side of the twenty-second transistor T22 away from the twenty-first transistor T21.

In an exemplary implementation, as shown in FIG. 10B, the shift register may further include a first transistor T1 to an eighth transistor T8, a eleventh transistor T11 to a sixteenth transistor T16, a first capacitor C1 to a third capacitor C3, a signal input terminal, a first clock signal terminal, a second clock signal terminal, and a third power supply terminal. The first transistor T1 is connected with the signal input terminal, the first clock signal terminal, the second transistor T2, the eighth transistor T8, the twelfth transistor T12, and the thirteenth transistor T13, respectively; the second transistor T2 is connected with the first clock signal line, the third transistor T3, the fifth transistor T5, the eight transistor T8, the eleventh transistor T11, the twelfth transistor T12, and the thirteenth transistor T13, respectively; the third transistor T3 is connected with the first clock signal terminal, the second power supply terminal, the fifth transistor T5, and the eleventh transistor T11, respectively; the fourth transistor T4 is connected with the second clock signal terminal, the third capacitor C3, the fifth transistor T5, the fifteenth transistor T15, and the sixteenth transistor T16, respectively; the fifth transistor T5 is connected with the first power supply terminal, the third capacitor C3, and the eleventh transistor T11, respectively; the sixth transistor T6 is connected with the second clock signal terminal, the first capacitor C1, the seventh transistor T7, and the eleventh transistor T11, respectively; the seventh transistor T7 is connected with the second clock signal terminal, the first capacitor C1, the second capacitor C2, the first output transistor, the third output transistor and the eighth transistor T8, respectively; the eighth transistor T8 is connected with the first power supply terminal, the second capacitor C2, the first output transistor, the third output transistor, the twelfth transistor T12, and the thirteenth transistor T13, respectively; the eleventh transistor T11 is connected with the second power supply terminal and the first capacitor C1, respectively; the twelfth transistor T12 is connected with the second power supply terminal, the second output transistor, the fourth output transistor, the thirteenth transistor T13, and the sixteenth transistor T16, respectively; the thirteenth transistor T13 is connected with the first power supply terminal and the third power supply terminal, respectively; the fourteenth transistor T14 is connected with the signal input terminal, the first clock signal terminal, and the fifteenth transistor T15, respectively; the fifteenth transistor T15 is connected with the second power supply terminal, the third capacitor C3, and the sixteenth transistor T16, respectively; the sixteenth transistor T16 is connected with the second output transistor, the fourth output transistor, and the third capacitor C3, respectively.

In an exemplary implementation, the transistor type of any one of the first transistor to the eighth transistor and the eleventh transistor to the sixteenth transistor is the same as the transistor type of any one of the first output transistor to the fifth output transistor.

In an exemplary implementation, a capacitance value of the third capacitor C3 is greater than a capacitance value of the second capacitor C2, and the capacitance value of the second capacitor C2 is greater than a voltage value of the first capacitor C1.

In an exemplary implementation, the voltage value of the first capacitor C1 ranges from 47 farads to 50 farads. For example, the voltage value of the first capacitor C1 may be 48.7 farads.

In an exemplary implementation, the voltage value of the second capacitor C2 ranges from 71 farads to 73 farads. For example, the voltage value of the second capacitor C2 may be 72.7 farads.

In an exemplary implementation, the voltage value of the third capacitor C3 ranges from 119 farads to 121 farads. For example, the voltage value of the third capacitor C3 may be 120.2 farads.

In an exemplary implementation, as shown in FIG. 10B, any one of the first transistor T1 to the eighth transistor T8, the eleventh transistor T11 to the sixteenth transistor T16, and the first capacitor C1 to the third capacitor C3 is located on a side of any one of the first output transistor OUT1 and the second output transistor OUT2 away from the display region.

In an exemplary implementation, as shown in FIG. 9, the display substrate further includes an initial signal line STV, a first clock signal line CLK1, a second clock signal line CLK2, a first power supply line VGH, a second power supply line VGL, a third power supply line VEL, and a masking signal line MSL located in the non-display region. The initial signal line STV is electrically connected with the signal input terminal of the partial shift register, the first clock signal line CLK1 is electrically connected with one of the first clock signal terminal and the second clock signal terminal of any shift register, the second clock signal line CLK2 is electrically connected with the other signal terminal of the first clock signal terminal and the second clock signal terminal of any shift register, the first power supply line VGH is electrically connected with the first power supply terminal of any shift register, the second power supply line VGL is electrically connected with the second power supply terminal of any shift register, the third power supply line VEL is electrically connected with the third power supply terminal of any shift register, and the masking signal line MSL is electrically connected with the masking signal terminal of any shift register.

In an exemplary implementation, as shown in FIG. 9, any one of the initial signal line STV, the first clock signal line CLK1, the second clock signal line CLK2, the first power supply line VGH, the second power supply line VGL, the third power supply line VEL, and the masking signal line MSL extends at least partially along the second direction D2.

In an exemplary implementation, the shift register includes at least one P-type transistor, at least one N-type transistor, and at least one capacitor, and the capacitor includes a first plate and a second plate. The at least one P-type transistor includes a first output transistor OUT1 to a fifth output transistor OUT5.

In an exemplary implementation, gate electrodes of the N-type transistors include a first gate electrode and a second gate electrode disposed in different layers and connected with each other, and the first gate electrode is disposed in the same layer as the second plate of the at least one capacitor.

In an exemplary implementation, the P-type transistors include the first transistor T1 to the twenty-first transistor T21 and the twenty-third transistor T23 in FIG. 7, and the N-type transistors include the twenty-second transistor T22 and the twenty-fourth transistor T24 in FIG. 7.

In an exemplary implementation, the display substrate may further include: a base substrate and a drive circuit layer disposed on the base substrate, the gate drive circuit group and the pixel drive circuit are disposed in the drive circuit layer, the drive circuit layer includes a first semiconductor layer, a first conductive layer, a second conductive layer, a second semiconductor layer, a third conductive layer, a fourth conductive layer and a fifth conductive layer stacked in sequence.

In an exemplary implementation, the first semiconductor layer at least includes active patterns of the P-type transistors.

In an exemplary implementation, the first conductive layer at least includes gate electrodes of the P-type transistors and the first plate of the at least one capacitor.

In an exemplary implementation, the second conductive layer at least includes the second plate of the at least one capacitor and first gate electrodes of the N-type transistors.

In an exemplary implementation, the second semiconductor layer at least includes active patterns of the N-type transistors.

In an exemplary implementation, the third conductive layer at least includes second gate electrodes of the N-type transistors.

In an exemplary implementation, the fourth conductive layer at least includes the initial signal line STV, the first clock signal line CLK1, the second clock signal line CLK2, the third power supply line VEL, and a first electrode and a second electrode of any one of the P-type transistor and the N-type transistor.

The fifth conductive layer at least includes two first power supply lines, four second power supply lines, and the masking signal line MSL.

Figure 11:
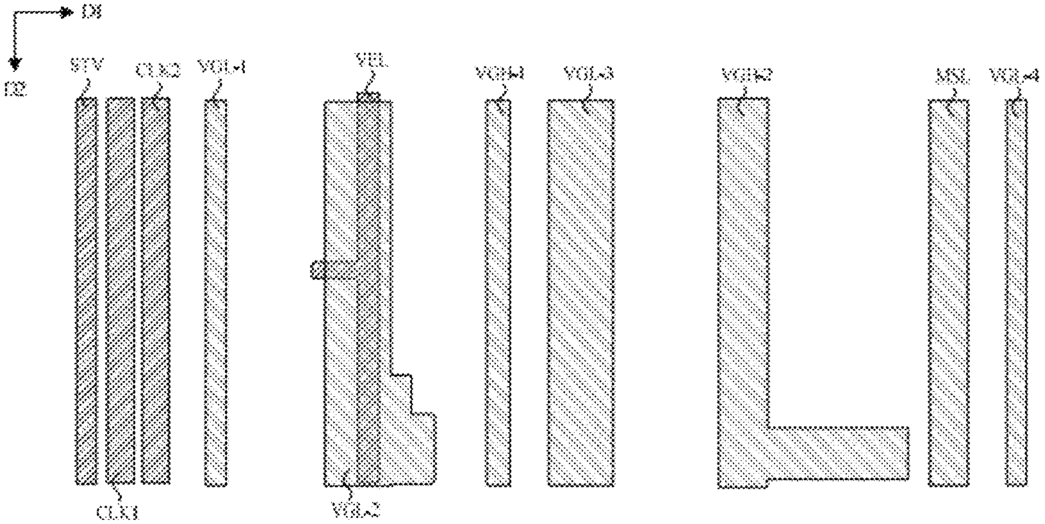
FIG. 11 is a schematic diagram of the film layer where the signal lines of the display substrate provided in FIG. 9 are located.

In an exemplary implementation, as shown in FIGS. 9 and 11, the two first power supply lines include a first one of the first power supply lines VGH-1 and a second one of the first power supply lines VGH-2. The four second power supply lines include a first one of the second power supply lines VGL-1, a second one of the second power supply lines VGL-2, a third one of the second power supply lines VGL-3 and a fourth one of the second power supply lines VGL-4.

In an exemplary implementation, a second one of the second power supply lines VGL-2 is connected with a second power supply terminal to which the second output transistor is connected, a third one of the second power supply lines VGL-2 is connected with a second power supply terminal to which the fourth output transistor is connected, a first one of the first power supply lines VGH-1 is connected with a first power supply terminal to which the first output transistor is connected, and a second one of the first power supply lines VGH-2 is connected with a first power supply terminal to which the third output transistor is connected.

In an exemplary implementation, FIG. 11 is a schematic diagram of the film layer where the signal line of the display substrate provided in FIG. 9 is located. As shown in FIGS. 9 and 11, the initial signal line STV, the first clock signal line CLK1, the second clock signal line CLK2, and the third power supply line VEL are arranged sequentially along a direction close to the display region.

In an exemplary implementation, as shown in FIG. 9, the initial signal line STV, the first clock signal line CLK1, and the second clock signal line CLK2 are located on a side of the first electrodes and the second electrodes of all transistors in the shift register away from the display region, and an orthographic projection of the third power supply line VEL on the base substrate is partially overlapped with orthographic projections of part of the transistors on the base substrate.

In an exemplary implementation, as shown in FIGS. 9 and 11, a first one of the second power supply lines VGL-1, the second one of the second power supply lines VGL-2, the first one of the first power supply lines VGH-1, the third one of the second power supply lines VGL-3, the second one of the first power supply lines VGH-2, the masking signal line MSL, and the fourth one of the second power supply lines VGL-4 are arranged sequentially along a direction close to the display region.

In an exemplary implementation, as shown in FIGS. 9 and 11, an orthographic projection of the second one of the second power supply lines VGL-2 on the base substrate is at least partially overlapped with an orthographic projection of the third power supply line VEL on the base substrate.

In an exemplary implementation, as shown in FIG. 11, a line width of the second one of the second power supply lines VGL-2 is larger than a line width of the third power supply line VEL.

In an exemplary implementation, as shown in FIGS. 9 and 11, an orthographic projection of the second clock signal line CLK2 on the base substrate is located on a side of an orthographic projection of any transistor in the shift register on the base substrate away from the display region. That is, the initial signal line STV, the first clock signal line CLK1, and the second clock signal line CLK2 are located on a side of the shift register away from the display region, and there is no overlapping between the electrodes included in the transistors in the shift register, so that the overlapped area between all signal lines connected with the shift register and the electrodes included in the transistors in the shift register is reduced, hopping of the signals of the electrodes included in the transistors of the shift register due to hopping of the signals of the clock signal lines can be avoided, and the reliability of the display substrate can be improved.

In an exemplary implementation, as shown in FIG. 11, orthographic projections of any two of the initial signal line STV, the first clock signal line CLK1, the second clock signal line CLK2, the first one of the second power supply lines VGL-1, the second one of the second power supply lines VGL-2, and the first one of the first power supply lines VGH-1 on the base substrate are not overlapped, and orthographic projections of any two of the third one of the second power supply lines VGL-3, the second one of the first power supply lines VGH-2, the masking signal line MSL, and the fourth one of the second power supply lines VGL-4 on the base substrate are not overlapped. The orthographic projection of the first one of the second power supply lines VGL-1 on the base substrate is located between the orthographic projection of the second clock signal line CLK2 on the base substrate and the orthographic projection of the third power supply line VEL on the base substrate, and the orthographic projections of the first one of the first power supply lines VGH-1, the third one of the second power supply lines VGL-3, the second one of the first power supply lines VGH-2, the masking signal line MSL, and the fourth one of the second power supply lines VGL-4 on the base substrate are located on a side of the orthographic projection of the third power supply line VEL on the base substrate close to the display region. By means of the arrangement of the signal lines described above in the present disclosure, a plurality of signal lines (e.g., the initial signal line STV, the first clock signal line CLK1, and the second clock signal line CLK2) located in the fourth conductive layer is not overlapped with all the signal lines located in the fifth conductive layer, thereby reducing signal coupling among the signal lines and improving the reliability of the display substrate.

In an exemplary implementation, as shown in FIG. 11, a line width of the first one of the second power supply lines VGL-1 is smaller than a line width of any one of the second one of the second power supply lines VGL-2 and the third one of the second power supply lines VGL-3, and a line width of the fourth one of the second power supply lines VGL-4 is smaller than the line width of any one of the second one of the second power supply lines VGL-2 and the third one of the second power supply lines VGL-3.

In an exemplary implementation, as shown in FIG. 11, a line width of the first one of the first power supply lines VGH-1 is smaller than a line width of the second one of the first power supply lines VGH-2.

In an exemplary implementation, as shown in FIG. 11, a line width of the masking signal line MSL is larger than the line width of any one of the first one of the second power supply lines VGL-1, the fourth one of the second power supply lines VGL-4, and the first one of the first power supply lines VGH-1, and smaller than the line width of the second one of the second power supply lines VGL-2, the line width of the third one of the second power supply lines VGL-3, and the line width of the second one of the first power supply lines VGH-2.

In an exemplary implementation, the gate drive circuit group further includes a second drive circuit electrically connected with the pixel drive circuit; the first drive circuit and the second drive circuit are arranged along the first direction D1, and the second drive circuit is electrically connected with the fourth one of the second power supply lines VGL-4.

In an exemplary implementation, the second drive circuit may be connected with the gate electrode of the first transistor of the pixel drive circuit through the first scan signal line.

In an exemplary implementation, two drive circuits share one power supply line, so that the area occupied by the entire gate drive circuit group in the non-display region can be reduced, and a narrow bezel of the display substrate can be achieved.

In an exemplary implementation, the display substrate further includes a light emitting structure layer located on a side of the drive structure layer away from the base substrate. The light emitting structure layer 103 may include an anode, a pixel definition layer, an organic emitting layer, and a cathode. The anode is connected with the pixel drive circuit through a via, the organic emitting layer is connected with the anode, the cathode is connected with the organic emitting layer, and the organic emitting layer emits light of corresponding color under drive of the anode and the cathode.

In an exemplary implementation, the display substrate may further include an encapsulation structure layer located on a side of the light emitting structure layer away from the base substrate. The encapsulation structure layer may include a first encapsulation layer, a second encapsulation layer, and a third encapsulation layer that are stacked. The first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water vapor cannot enter the light emitting structure layer.

In an exemplary implementation, the display substrate may further include a touch structure layer located on a side of the encapsulation structure layer away from the base substrate. The touch structure layer may include a first touch insulation layer disposed on the encapsulation structure layer, a first touch metal layer disposed on the first touch insulation layer, a second touch insulation layer cover the first touch metal layer, a second touch metal layer disposed on the second touch insulation layer and a touch protection layer covering the second touch metal layer. The first touch metal layer may include a plurality of bridge electrodes, the second touch metal layer may include a plurality of first touch electrodes and second touch electrodes, and the first touch electrode or the second touch electrode may be connected with the bridge electrode through a via.

In an exemplary implementation, the display substrate according to the present disclosure may be applied to a display device with a gate drive circuit, such as an OLED, a quantum dot display (QLED), a light emitting diode display (Micro LED or Mini LED), or a Quantum Dot Light Emitting Diode display (QDLED), etc., which is not limited here in the present disclosure.

Exemplary description is made below through a preparation process of a display substrate. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are arranged in a same layer" in the present disclosure means that A and B are formed simultaneously through a same patterning process, and a "thickness" of a film layer is a dimension of the film layer in a direction perpendicular to a display substrate. In an exemplary implementation of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or the boundary of the orthographic projection of A coincides with the boundary of the orthographic projection of B.

Figure 12:
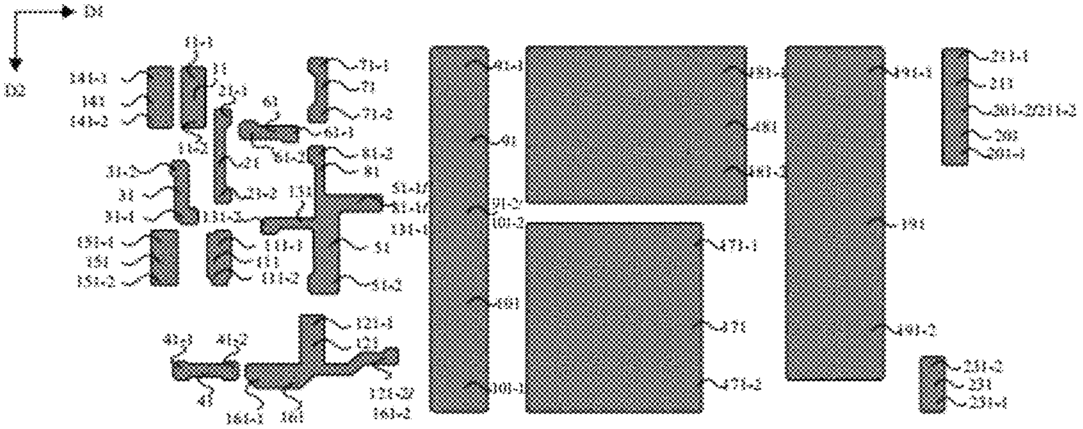
FIG. 12 is a schematic diagram after the pattern of the first semiconductor layer is formed in FIG. 9.

(1) Forming a pattern of a first semiconductor layer on a base substrate. In an exemplary implementation, forming pattern of a first semiconductor layer on a base substrate may include: depositing a first semiconductor thin film on the base substrate, patterning the first semiconductor thin film by a patterning process, and forming a pattern of a first semiconductor layer. As shown in FIG. 12, FIG. 12 is a schematic diagram after the first semiconductor layer patterns are formed in FIG. 9.

In an exemplary implementation, as shown in FIG. 12, the pattern of the semiconductor layer may at least include an active pattern 11 of a first transistor to an active pattern 211 of a twenty-first transistor and an active pattern 231 of a twenty-third transistor in a shift register of each stage.

In an exemplary implementation, as shown in FIG. 12, an active pattern 51 of the fifth transistor, an active pattern 81 of the eighth transistor, and an active pattern 131 of the thirteenth transistor form an integrated structure, an active pattern 91 of the ninth transistor and an active pattern 101 of the tenth transistor form an integrated structure, an active pattern 121 of the twelfth transistor and an active pattern 161 of the sixteenth transistor form an integrated structure, and an active pattern 201 of the twentieth transistor and an active pattern 211 of the twenty-first transistor form an integrated structure. An active pattern 11 of the first transistor, an active pattern 21 of the second transistor, an active pattern 31 of the third transistor, an active pattern 41 of the fourth transistor, an active pattern 61 of the sixth transistor, an active pattern 71 of the seventh transistor, an active pattern 111 of the eleventh transistor, an active pattern 141 of the fourteenth transistor, an active pattern 151 of the fifteenth transistor, an active pattern 171 of the seventeenth transistor, an active pattern 181 of the eighteenth transistor, an active pattern 191 of the nineteenth transistor, and an active pattern 231 of the twenty-third transistor may be individually provided.

In an exemplary implementation, as shown in FIG. 12, the active pattern 11 of the first transistor and the active pattern 141 of the fourteen transistor are arranged in a first direction D1, and the active pattern 11 of the first transistor is located on a side of the active pattern 141 of the fourteen transistor close to the display region, and the active pattern 21 of the second transistor is located on a side of the active pattern 11 of the first transistor close to the display region. The active pattern 31 of the third transistor and the active pattern 11 of the first transistor are arranged along the second direction D2, and the active pattern 31 of the third transistor of the shift register of present stage is located on a side of the active pattern 11 of the first transistor of the shift register of present stage close to the shift register of next stage. The active pattern 111 of the eleventh transistor and the active pattern 151 of the fifteenth transistor are arranged along the first direction D1, the active pattern 111 of the eleventh transistor and the active pattern 11 of the first transistor are arranged along the second direction D2, the active pattern 151 of the fifteenth transistor and the active pattern 141 of the fourteenth transistor are arranged along the second direction D2, the active pattern 111 of the eleventh transistor is located on a side of the active pattern 151 of the fifteenth transistor of the shift register of present stage close to the display region, and the active pattern 151 of the fifth transistor of the shift register of present stage is located on a side of the active pattern 31 of the third transistor close to the shift register of next stage. In the same stage of shift register, the active pattern 41 of the fourth transistor of the shift register is located on a side of the active pattern 111 of the eleventh transistor close to the next stage of shift register. The active pattern 61 of the sixth transistor is located on a side of the active pattern 21 of the second transistor close to the display region. The active pattern 71 of the seventh transistor is located on a side of the active pattern 61 of the sixth transistor close to the display region. The active pattern 51 of the fifth transistor (also the active pattern 81 of the eighth transistor and the active pattern 131 of the thirteenth transistor) is located on a side of the active pattern 21 of the second transistor and the active pattern 111 of the eleventh transistor close to the display region; the active pattern 131 of the thirteenth transistor is located on a side of the active pattern 81 of the eighth transistor away from the display region; the active pattern 51 of the fifth transistor is located on a side of the active pattern 111 of the eleventh transistor close to the display region; the active pattern 71 of the seventh transistor, the active pattern 81 of the eighth transistor and the active pattern 51 of the fifth transistor are arranged in sequence along the second direction D2, and the active pattern 71 of the seventh transistor of the shift register of present stage is located on a side of the active pattern 81 of the eighth transistor close to the shift register of previous stage, and the active pattern 51 of the fifth transistor of the shift register of present stage is located on a side of the active pattern 81 of the eighth transistor close to the shift register of next stage. The active pattern 121 of the twelfth transistor (also the active pattern 161 of the sixteenth transistor) is located on a side of the active pattern 41 of the fourth transistor close to the display region, the active pattern 121 of the twelfth transistor is located on a side of the active pattern 161 of the sixteenth transistor close to the display region, the active pattern 51 of the fifth transistor and the active pattern 121 of the twelfth transistor are arranged along the second direction D2, and the active pattern 121 of the twelfth transistor of shift register of present stage is located on a side of the active pattern 51 of the fifth transistor close to the shift register of next stage. The active pattern 91 of the ninth transistor (also the active pattern 101 of the tenth transistor) is located on a side of the active pattern 71 of the seventh transistor and the active pattern 51 of the fifth transistor (also the active pattern 81 of the eighth transistor and the active pattern 131 of the thirteenth transistor) close to the display region, and the active pattern 91 of the ninth transistor of the shift register of present stage may be located on a side of the active pattern 101 of the tenth transistor close to the shift register of next stage. The active pattern 171 of the seventeenth transistor and the active pattern 181 of the eighteenth transistor are arranged along the second direction D2, and are located on a side of the active pattern 91 of the ninth transistor (also the active pattern 101 of the tenth transistor) close to the display region, and the active pattern 171 of the seventeenth transistor in the shift register of present stage may be located on a side of the active pattern 181 of the eighteenth transistor close to the shift register of next stage. The active pattern 191 of the nineteenth transistor is located on a side of the active pattern 171 of the seventeenth transistor and the active pattern 181 of the eighteenth transistor close to the display region; the active pattern 201 of the twentieth transistor (also the active pattern 211 of the twenty-first transistor) is located on a side of the active pattern 191 of the nineteenth transistor close to the display region, the active pattern 201 of the twentieth transistor of the shift register of present stage is located on a side of the active pattern 211 of the twenty-first transistor close to the shift register of next stage, and the active pattern 231 of the twenty-third transistor is located between the active pattern 191 of the nineteenth transistor and the active pattern 201 of the twentieth transistor (also the active pattern 211 of the twenty-first transistor), and is arranged along the first direction D1 with the active pattern 171 of the seventeenth transistor.

In an exemplary implementation, as shown in FIG. 12, any one of the active pattern 11 of the first transistor, the active pattern 21 of the second transistor, the active pattern 31 of the third transistor, the active pattern 71 of the seventh transistor, the active pattern 91 of the ninth transistor (also the active pattern 101 of the tenth transistor), the active pattern 111 of the eleventh transistor, the active pattern 141 of the fourteenth transistor, the active pattern 151 of the fifteenth transistor, the active pattern 171 of the seventeenth transistor, the active pattern 181 of the eighteenth transistor, the active pattern 191 of the nineteenth transistor, the active pattern 201 of the twentieth transistor (also the active pattern 211 of the twenty-first transistor) and the active pattern 231 of the twenty-third transistor has a strip shape and extends along the second direction D2.

In an exemplary implementation, as shown in FIG. 12, any one of the active pattern 41 of the fourth transistor and the active pattern 61 of the sixth transistor has a strip shape and extends along the first direction D1.

In an exemplary implementation, as shown in FIG. 12, the active pattern 121 of the twelfth transistor (also the active pattern 161 of the sixteenth transistor) has an inverted “T” shape.

In an exemplary implementation, the active pattern 51 of the fifth transistor may have a “⌈” shape, the active pattern of the eighth transistor may have a “ . . . ” shape, the active pattern 51 of the fifth transistor and the active pattern 81 of the eighth transistor may have a “ . . . ” shape, and the active pattern 131 of the thirteenth transistor may have a bend line shape extending at least partially along the first direction D1.

In an exemplary implementation, a length of the active pattern 91 of the ninth transistor (also the active pattern 101 of the tenth transistor) along the first direction D1 is smaller than a length of the active pattern 171 of the seventeenth transistor along the first direction D1, and is smaller than a length of the active pattern 181 of the eighteenth transistor along the first direction D1.

In an exemplary implementation, a channel width of the active pattern 91 of the ninth transistor ranges from 80 microns to 100 microns, and a channel length of the active pattern 91 of the ninth transistor ranges from 3.2 microns to 3.7 microns.

In an exemplary implementation, a channel width-to-length ratio of the active pattern 91 of the ninth transistor may be 90/3.5.

In an exemplary implementation, a channel width of the active pattern 101 of the tenth transistor ranges from 80 microns to 100 microns, and a channel length of the active pattern 101 of the tenth transistor ranges from 3.2 microns to 3.7 microns.

In an exemplary implementation, a channel width-to-length ratio of the active pattern 101 of the tenth transistor may be 90/3.5.

In an exemplary implementation, a channel width of the active pattern 171 of the seventeenth transistor ranges from 250 microns to 300 microns, and a channel length of the active pattern 171 of the seventeenth transistor ranges from 2.9 microns to 3.2 microns.

In an exemplary implementation, a channel width-to-length ratio of the active pattern 171 of the seventeenth transistor may be 270/3.1.

In an exemplary implementation, a channel width of the active pattern 181 of the eighteenth transistor ranges from 250 microns to 300 microns, and a channel length of the active pattern 181 of the eighteenth transistor ranges from 2.9 microns to 3.2 microns.

In an exemplary implementation, a channel width-to-length ratio of the active pattern 181 of the eighteenth transistor may be 270/3.1.

In an exemplary implementation, a channel width of the active pattern 191 of the nineteenth transistor ranges from 250 microns to 300 microns, and a channel length of the active pattern 191 of the nineteenth transistor ranges from 2.9 microns to 3.2 microns.

In an exemplary implementation, a channel width-to-length ratio of the active pattern 191 of the nineteenth transistor may be 270/3.1.

In an exemplary implementation, as shown in FIG. 12, an active pattern of each transistor may include a first region, a second region and a channel region between the first region and the second region. In an exemplary implementation, a first region 51-1 of the active pattern 51 of the fifth transistor may serve as a first region 81-1 of the active pattern 81 of the eighth transistor and a first region 131-1 of the active pattern 131 of the thirteenth transistor, a second region 91-2 of the active pattern 91 of the ninth transistor may serve as a second region 101-2 of the active pattern 101 of the tenth transistor, a second region 121-2 of the active pattern 121 of the twelfth transistor may serve as a second region 161-2 of the active pattern 161 of the sixteenth transistor, and a second region 201-2 of the active pattern 201 of the twentieth transistor may serve as a second region 211-2 of the active pattern 211 of the twenty-first transistor. A first region 11-1 and a second region 11-2 of the active pattern 11 of the first transistor, a first region 21-1 and a second region 21-2 of the active pattern 21 of the second transistor, a first region 31-1 and a second region 31-2 of the active pattern 31 of the third transistor, a first region 41-1 and a second region 41-2 of the active pattern 41 of the fourth transistor, a second region 51-2 of the active pattern 51 of the fifth transistor, a first region 61-1 and a second region 61-2 of the active pattern 61 of the sixth transistor, a first region 71-1 and a second region 71-2 of the active pattern 71 of the seventh transistor, a second region 81-2 of the active pattern 81 of the eighth transistor, a first region 91-1 of the active pattern 91 of the ninth transistor, a first region 101-1 of the active pattern 101 of the tenth transistor, a first region 111-1 and a second region 111-2 of the active pattern 111 of the eleventh transistor, a first region 121-1 of the active pattern 121 of the twelfth transistor, a second region 131-2 of the active pattern 131 of the thirteenth transistor, a first region 141-1 and a second region 141-2 of the active pattern 141 of the fourteenth transistor, a first region 151-1 and a second region 151-2 of the active pattern 151 of the fifteenth transistor, a first region 161-1 of the active pattern 161 of the sixteenth transistor, a first region 17-1 and a second region 171-2 of the active pattern 171 of the seventeenth transistor, a first region 181-1 and a second region 181-2 of the active pattern 181 of the eighteenth transistor, a first region 191-1 and a second region 191-2 of the active pattern 191 of the nineteenth transistor, a first electrode 201-1 of the active pattern of the twentieth transistor, a first electrode 211-1 of the twenty-first transistor, and a first region 231-1 and a second region 231-2 of the active pattern of the twenty-third transistor are individually provided.

Figure 13:
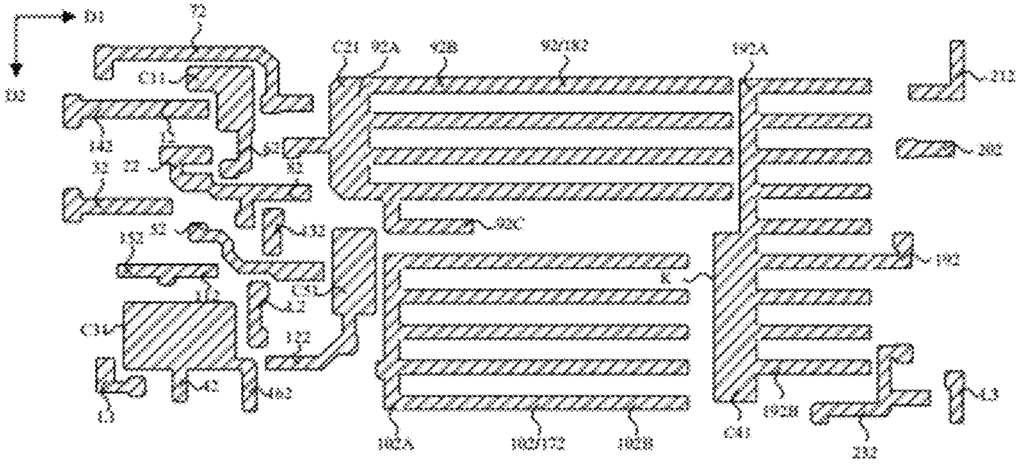
FIG. 13 is a schematic diagram of a pattern of a first conductive layer in FIG. 9.
Figure 14:
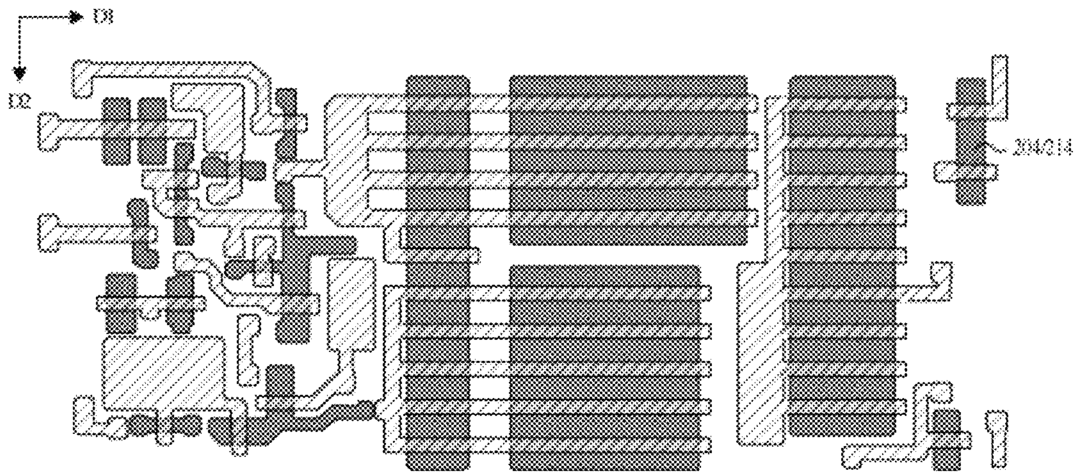
FIG. 14 is a schematic diagram after a pattern of a first conductive layer is formed in FIG. 9.

(2) Forming a pattern of a first conductive layer. In an exemplary implementation, forming a pattern of a first conductive layer may include: depositing a first insulation thin film and a first conductive thin film on the base substrate on which the aforementioned pattern is formed, patterning the first conductive thin film by a patterning process to form a first insulation layer covering the pattern of the first semiconductor layer, and a pattern of a first conductive layer disposed on the first insulation layer, as shown in FIGS. 13 and 14. FIG. 13 is a schematic diagram of the pattern of the first conductive layer in FIG. 9 and FIG. 14 is a schematic diagram after the pattern of the first conductive layer is formed in FIG. 9. In an exemplary implementation, the first conductive layer may be referred to as a first gate metal (GATE1) layer.

In an exemplary implementation, as shown in FIGS. 13 and 14, the pattern of the first conductive layer may at least include: a gate electrode 12 of the first transistor to a gate electrode 212 of the twenty-first transistor, a gate electrode 232 of the twenty-third transistor, a first plate C11 of the first capacitor to a first plate C51 of the fifth capacitor, a first connection line L1, a second connection line L2, and a third connection line L3.

In an exemplary implementation, as shown in FIGS. 13 and 14, the gate electrode 12 of the first transistor and the gate electrode 142 of the fourteenth transistor are in an integral structure, and the integral structure of the gate electrode 12 of the first transistor and the gate electrode 142 of the fourteenth transistor has a strip shape and extends along the first direction D1.

In an exemplary implementation, as shown in FIGS. 13 and 14, the gate electrode 22 of the second transistor and the gate electrode 82 of the eighth transistor are in an integral structure. The gate electrode 22 of the second transistor may has a "n" shape with an opening facing the display region, and the gate electrode 82 of the eighth transistor may has a bend line shape and extends at least partially along the first direction D1.

In an exemplary implementation, as shown in FIGS. 13 and 14, the gate electrode 32 of the third transistor is individually provided, and may have a strip shape, and extends along the first direction D1.

In an exemplary implementation, as shown in FIGS. 13 and 14, the gate electrode 42 of the fourth transistor, the gate electrode 162 of the sixteenth transistor and the first plate C31 of the third capacitor are an integral structure. The shape of C31 of the third capacitor is rectangular. In the same stage of shift register the gate electrode 42 of the fourth transistor is located on a side of the third capacitor C31 close to the next stage of shift register, and the gate electrode 42 of the fourth transistor has a strip shape and extends along the second direction D2. The gate electrode 162 of the sixteenth transistor is located on a side of C31 of the third capacitor C31 close to the display region, and the gate electrode 162 of the sixteenth transistor has a "]" shape.

In an exemplary implementation, as shown in FIGS. 13 and 14, the gate electrode 52 of the fifth transistor is individually provided. The gate electrode 52 of the fifth transistor has a bend line shape and extends at least partially along the first direction D1.

In an exemplary implementation, as shown in FIGS. 13 and 14, the gate electrode 62 of the sixth transistor and the first plate C11 of the first capacitor are an integral structure. In the same stage of shift register the gate electrode 62 of the sixth transistor is located on a side of the first plate C11 of the first capacitor close to the next stage of shift register. The first plate C11 of the first capacitor may have a "]" shape. The gate electrode 62 of the sixth transistor has a bend line shape and extends at least partially along the second direction D2.

In an exemplary implementation, as shown in FIGS. 13 and 14, the gate electrode 72 of the seventh transistor is individually provided. The gate electrode 72 of the seventh transistor has a bend line shape and extends at least partially along the first direction D1. The gate electrode 72 of the seventh transistor is at least partially located on a side of the first plate C11 of the first capacitor.

In an exemplary implementation, as shown in FIGS. 13 and 14, the gate electrode 92 of the ninth transistor, the gate electrode 182 of the eighteenth transistor, and the first plate C21 of the second capacitor are in an integral structure. The gate electrode 92 of the ninth transistor (also the gate electrode 182 of the eighteenth transistor and the first plate C21 of the second capacitor) includes: a first connection section 92A, an adapter section 92C, and at least one first branch section 92B, wherein the first plate C21 of the second capacitor is located on a side of the first connection section 92A away from the display region, the first branch section 92B is located on a side of the first connection section 92A close to the display region, and the adapter section 92C is located on a side of any one of the first branch sections 92B of the shift register of present stage close to the shift register of next stage. The first connection section 92A is electrically connected with the first plate C21 of the second capacitor and at least one first branch section 92B, respectively. One end of the adapter section 92C is electrically connected with a middle portion of the first branch section 92B close to the shift register of next stage. The first connection section 92A has a strip shape and extends along the second direction D2. The first branch section 92B may have a strip shape and extends along the first direction D1. The first connection section 92A and at least one first branch section 92B may have a comb-shaped structure, wherein the first connection section 92A may correspond to a "comb back" and the first branch section 92B may correspond to a "comb tooth".

In an exemplary implementation, as shown in FIGS. 13 and 14, the gate electrode 102 of the tenth transistor and the gate electrode 172 of the seventeenth transistor are in an integral structure. The gate electrode 102 of the tenth transistor (also the gate electrode 172 of the seventeenth transistor) includes a second connection section 102A and at least one second branch section 102B. The second branch section 102B is located on a side of the second connection section 102A close to the display region. The second connection section 102A extends along the second direction D2, the second branch section 102B extends along the first direction D1, and a plurality of second branch sections 102B are arranged along the second direction D2, and at least one second branch section is electrically connected with the second connection section 102A. The gate electrode 102 of the tenth transistor (also the gate electrode 172 of the seventeenth transistor) has a comb-shaped structure in shape, the second connection section 102A corresponds to a "comb back", and the second branch section 102B corresponds to a "comb tooth".

In an exemplary implementation, as shown in FIGS. 13 and 14, the gate electrode 112 of the eleventh transistor and the gate electrode 152 of the fifteenth transistor form an integrated structure, and the gate electrode 112 of the eleventh transistor (also the gate electrode 152 of the fifteenth transistor) has a strip shape and extends along the first direction D1.

In an exemplary implementation, as shown in FIGS. 13 and 14, the gate electrode 122 of the twelfth transistor and the first plate C51 of the fifth capacitor form an integrated structure. The gate electrode 122 of the twelfth transistor is located on a side of the first plate C51 of the fifth capacitor close to the shift register of next stage, and is electrically connected with a side of the first plate C51 of the fifth capacitor close to the shift register of next stage. The gate electrode 122 of the twelfth transistor has a bend line shape and extends at least partially along the first direction D1. The shape of the first plate C51 of the fifth capacitor may be a rectangular shape, and the corners of the rectangular shape may be chamfered.

In an exemplary implementation, as shown in FIGS. 13 and 14, the gate electrode 132 of the thirteenth transistor is individually provided. The gate electrode 132 of the thirteenth transistor has a strip shape and extends along the second direction D2.

In an exemplary implementation, as shown in FIGS. 13 and 14, the gate electrode 192 of the nineteenth transistor and the first plate C41 of the fourth capacitor form an integrated structure. The gate electrode 192 of the nineteenth transistor (also the first plate C41 of the fourth capacitor) includes a third connection section 192A and at least one third branch section 192B. The third branch section 192B is located on a side of the third connection section 192A close to the display region. The gate electrode 192 of the nineteenth transistor (also the first plate C41 of the fourth capacitor) may have a comb-shaped structure. The third connection section 192A may have a strip shape and extend along the second direction D2, corresponding to a "comb back". The third branch section 192B may have a strip shape and extend along the first direction D1, corresponding to a "comb tooth". At least one third branch section 192B is arranged along the second direction D2. The third connection section 192A is provided with a protrusion K at the boundary away from the display region, and a length of one of the third branch sections 192B along the first direction is greater than a length of the remaining branch sections along the first direction.

In an exemplary implementation, the length of the first branch section 92B is greater than a length of the second branch section 102B, and the length of any second branch section 102B is greater than the length of any third branch section 192B.

In an exemplary implementation, as shown in FIGS. 13 and 14, the gate electrode 202 of the twentieth transistor is individually provided, and the gate electrode 202 of the twentieth transistor may have a strip shape and extend along the first direction D1.

In an exemplary implementation, as shown in FIGS. 13 and 14, the gate electrode 212 of the twenty-first transistor is individually provided, and the gate electrode 212 of the twenty-first transistor may have a "⌉" shape.

In an exemplary implementation, as shown in FIGS. 13 and 14, the gate electrode 232 of the twenty-third transistor is individually provided, and the gate electrode 232 of the twenty-third transistor may have a shape of "h" rotating 90 degrees counterclockwise.

In an exemplary implementation, as shown in FIGS. 13 and 14, the first connection line L1 is located on a side of the gate electrode 42 of the fourth transistor (also the first plate C31 of the third capacitor and the gate electrode 162 of the sixteenth transistor) away from the display region. The shape of the first connection line L1 may have a "⌊" shape.

In an exemplary implementation, as shown in FIGS. 13 and 14, the second connection line L2 is located between the gate electrode 42 of the fourth transistor (also the first plate C31 of the third capacitor and the gate electrode 162 of the sixteenth transistor) and the gate electrode 122 of the twelfth transistor (also the first plate C51 of the fifth capacitor). The second connection line L2 has a strip shape and extends along the second direction D2.

In an exemplary implementation, as shown in FIGS. 13 and 14, the third connection line L3 is located on a side of the gate electrode 232 of the twenty-third transistor close to the display region. The third connection line L3 has a strip shape and extends along the second direction D2.

In an exemplary implementation, as shown in FIGS. 13 and 14, the gate electrode 12 of the first transistor (also the gate electrode 142 of the fourteenth transistor) is disposed across the active pattern of the first transistor and the active pattern of the fourteenth transistor, the gate electrode 22 of the second transistor (also the gate electrode 82 of the eighth transistor) is disposed across the active pattern of the second transistor and the active pattern of the eighth transistor, the gate electrode 32 of the third transistor is disposed across the active pattern of the third transistor, the gate electrode 42 of the fourth transistor (also the first plate C31 of the third capacitor and the gate electrode 162 of the sixteenth transistor) is disposed across the active pattern of the fourth transistor and the active pattern of the sixteenth transistor, the gate electrode 52 of the fifth transistor is disposed across the active pattern of the fifth transistor, the gate electrode 62 of the sixth transistor (also the first plate C11 of the first capacitor) is disposed across the active pattern of the sixth transistor, the gate electrode 72 of the seventh transistor is disposed across the active pattern of the seventh transistor, any first branch section of the gate electrode 92 of the ninth transistor (also the first plate C21 of the second capacitor and the gate electrode 182 of the eighteenth transistor) is disposed across the active pattern of the ninth transistor and the active pattern of the eighteenth transistor, any second branch section of the gate electrode 102 of the tenth transistor (also the gate electrode 172 of the seventeenth transistor) is disposed across the active pattern of the tenth transistor and the active pattern of the seventeenth transistor, the gate electrode 112 of the eleventh transistor (also the gate electrode 152 of the fifteenth transistor) is disposed across the active pattern of the eleventh transistor and the active pattern of the fifteenth transistor, the gate electrode 122 of the twelfth transistor (also the first plate C51 of the fifth capacitor) is disposed across the active pattern of the twelfth transistor, the gate electrode 132 of the thirteenth transistor is disposed across the active pattern of the thirteenth transistor, any third branch section 192B of the gate electrode 192 of the nineteenth transistor (also the first plate C41 of the fourth capacitor) is disposed across the active pattern of the nineteenth transistor, and the gate electrode 202 of the twentieth transistor is disposed across the active pattern of the twentieth transistor, the gate electrode 212 of the twenty-first transistor is disposed across the active pattern of the twenty-first transistor, and the gate electrode 232 of the twenty-third transistor is disposed across the active pattern of the twenty-third transistor. That is, an extension direction of the gate electrode of at least one transistor is perpendicular to an extension direction of the active pattern.

In an exemplary implementation, after the pattern of the first conductive layer is formed, a conductive treatment may be performed on the first semiconductor layer by using the first conductive layer as a shield. A region of the first semiconductor layer, which is shielded by the first conductive layer, forms channel regions of the first transistor to the twenty-first transistor and the twenty-third transistor, and a region of the first semiconductor layer, which is not shielded by the first conductive layer, is made to be conductive, that is, first regions and second regions of any transistor from the first transistor to the twenty-first transistor and the twenty-third transistor is made to be conductive. As shown in FIG. 14, the second region of the active pattern of the twentieth transistor in the present disclosure after conduction (also the second region of the active pattern of the twenty-first transistor) serves as the second electrode 204 of the twentieth transistor (also the second electrode 214 of the twenty-first transistor).

Figure 15:
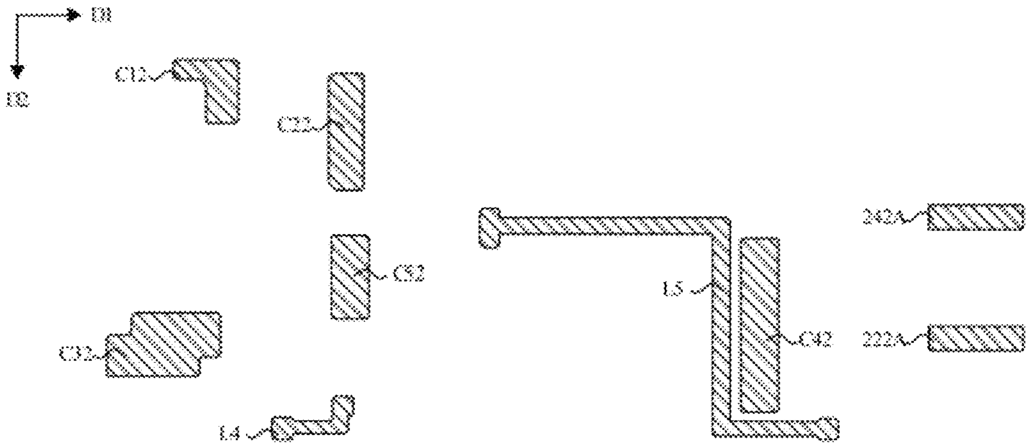
FIG. 15 is a schematic diagram of a pattern of a second conductive layer in FIG. 9.
Figure 16:
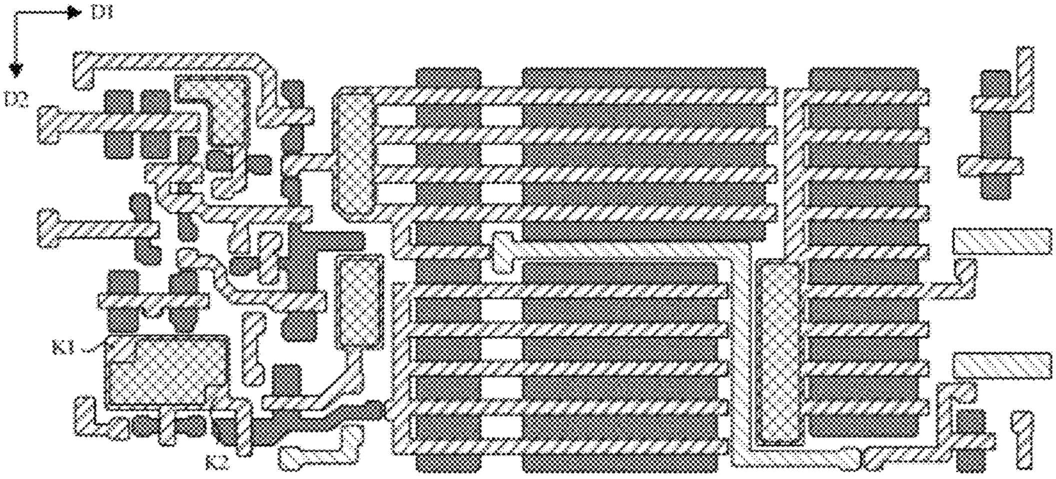
FIG. 16 is a schematic diagram after a pattern of a second conductive layer is formed in FIG. 9.

(3) Forming a pattern of a second conductive layer. In an exemplary implementation, forming a pattern of a second conductive layer may include depositing a second insulation thin film and a second conductive thin film on a base substrate on which the aforementioned patterns are formed, patterning the second conductive thin film by a patterning process, forming a pattern of a second insulation layer covering the pattern of the first conductive layer and the pattern of the second conductive layer on the pattern of the second insulation layer, as shown in FIGS. 15 and 16, FIG. 15 is a schematic diagram of the pattern of the second conductive layer in FIG. 9, and FIG. 16 is a schematic diagram after forming the pattern of the second conductive layer in FIG. 9. In an exemplary implementation, the second conductive layer may be referred to as a second gate metal (GATE2) layer.

In an exemplary implementation, as shown in FIGS. 15 and 16, the pattern of the second conductive layer may at least include a first gate electrode 222A of the twenty-second transistor, a first gate electrode 242A of the twenty-fourth transistor, a second plate C12 of the first capacitor to a second plate C52 of the fifth capacitor, a fourth connection line L4, and a fifth connection line L5 of the shift register of each stage.

In an exemplary implementation, as shown in FIGS. 15 and 16, the first gate electrode 222A of the twenty-second transistor is individually provided. An orthographic projection of the first gate electrode 222A of the twenty-second transistor on the base substrate is located on a side of an orthographic projection of the gate electrode of the nineteenth transistor on the base substrate close to the display region, and is located between an orthographic projection of the gate electrode of the twentieth transistor on the base substrate and an orthographic projection of the third connection line on the base substrate. The first gate electrode 222A of the twenty-second transistor may have a strip shape and extend along the first direction D1.

In an exemplary implementation, as shown in FIGS. 15 and 16, the first gate electrode 242A of the twenty-fourth transistor is individually provided. An orthographic projection of the first gate electrode 242A of the twenty-fourth transistor on the base substrate is located on a side of an orthographic projection of the gate electrode of the nineteenth transistor on the base substrate close to the display region, and is located between an orthographic projection of the first gate electrode 222A of the twenty-second transistor on the base substrate and an orthographic projection of the gate electrode of the twentieth transistor on the base substrate. The first gate electrode 242A of the twenty-fourth transistor may have a strip shape and extend along the first direction D1.

In an exemplary implementation, as shown in FIGS. 15 and 16, an orthographic projection of the second plate C12 of the first capacitor on the base substrate is at least partially overlapped an orthographic projection of the first plate of the first capacitor on the base substrate. The area of the second plate C12 of the first capacitor is smaller than the area of the first plate of the first capacitor. The shape of the second plate C12 of the first capacitor is the same as that of the first plate of the first capacitor.

In an exemplary implementation, as shown in FIGS. 15 and 16, an orthographic projection of the second plate C22 of the second capacitor on the base substrate is at least partially overlapped with an orthographic projection of the first plate of the second capacitor on the base substrate, wherein the orthographic projection of the second plate C22 of the second capacitor on the base substrate is at least partially overlapped with an orthographic projection of the first branch section on the base substrate. The area of the second plate C22 of the second capacitor is smaller than the area of the first plate of the second capacitor. The shape of the second plate C22 of the second capacitor may be a rectangular shape, and the corners of the rectangular shape may be chamfered and extend along the second direction D2.

In an exemplary implementation, as shown in FIGS. 15 and 16, an orthographic projection of the second plate C32 of the third capacitor on the base substrate is at least partially overlapped an orthographic projection of the first plate of the third capacitor on the base substrate. The area of the second plate C32 of the third capacitor is smaller than the area of the first plate of the third capacitor. The shape of the second plate C32 of the third capacitor may be rectangular. An orthogonal projection of the second plate C32 of the third capacitor on the base substrate and an orthogonal projection of the first plate of the third capacitor on the base substrate have two non-overlapped regions K1 and K2, the shape of the two non-overlapped regions K1 and K2 may be square, and the two non-overlapped regions K1 and K2 expose the first plate of the third capacitor. The second plate C32 of the third capacitor and the first plate of the third capacitor are not totally identical in shape, and the second plate C32 of the third capacitor may correspond to a rectangle missing two diagonally arranged corners.

In an exemplary implementation, as shown in FIGS. 15 and 16, an orthographic projection of the second plate C42 of the fourth capacitor on the base substrate is at least partially overlapped with an orthographic projection of the first plate of the fourth capacitor on the base substrate, wherein the orthographic projection of the second plate C42 of the fourth capacitor on the base substrate is at least partially overlapped with an orthographic projection of the protrusion of the third branch section on the base substrate. The second plate C42 of the fourth capacitor has the same shape as the first plate C41 of the fourth capacitor, and the area of the second plate C42 of the fourth capacitor is less than the area of the first plate of the fourth capacitor.

In an exemplary implementation, as shown in FIGS. 15 and 16, an orthographic projection of the second plate C52 of the fifth capacitor on the base substrate is at least partially overlapped with an orthographic projection of the first plate of the fifth capacitor on the base substrate. The shape of the second plate C42 of the fourth capacitor is the same as that of the first plate C51 of the fifth capacitor, and the area of the second plate C52 of the fifth capacitor is smaller than that of the first plate of the fifth capacitor.

In an exemplary implementation, as shown in FIGS. 15 and 16, the orthographic projection of the fourth connection line L4 on the base substrate is located between the orthographic projection of the gate electrode of the tenth transistor (also the gate electrode of the seventeenth transistor) on the base substrate and the orthographic projection of the gate electrode of the fourth transistor (also the first electrode of the third capacitor and the gate electrode of the sixteenth transistor) on the base substrate, and is located on a side of the gate electrode of the twelfth transistor of the shift register of present stage (also the first plate of the fifth capacitor) close to the shift register of next stage. The fourth connection line L4 may have a "]" shape.

In an exemplary implementation, as shown in FIGS. 15 and 16, an orthogonal projection of the fifth connection line L5 on the base substrate is located between an orthogonal projection of the gate electrode of the tenth transistor (also the gate electrode of the seventeenth transistor) on the base substrate and an orthogonal projection of the gate electrode of the nineteenth transistor on the base substrate, and surrounds at least one side of the gate electrode of the tenth transistor (also the gate electrode of the seventeenth transistor). The fifth connection line L5 has a bend line shape and extends at least partially along the first direction D1.

Figure 17:
FIG. 17 is a schematic diagram of a pattern of a second semiconductor layer in FIG. 9.
Figure 18:
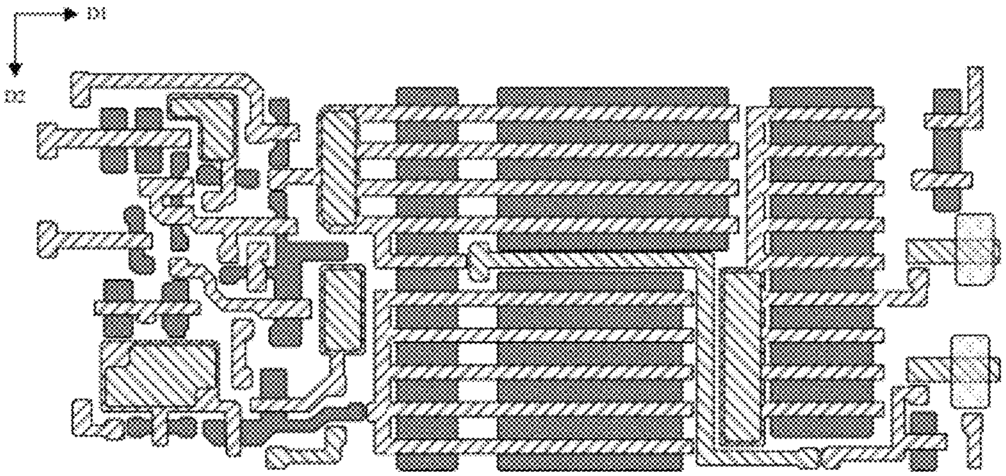
FIG. 18 is a schematic diagram after the pattern of the second semiconductor layer is formed in FIG. 9.

(4) Forming a pattern of a second semiconductor layer. In an exemplary implementation, forming a pattern of a second semiconductor layer may include: depositing a third insulation thin film and a second semiconductor thin film on the base substrate on which the aforementioned patterns are formed, patterning the second semiconductor thin film by a patterning process to form a third insulation layer covering the second conductive layer and a second semiconductor pattern disposed on the third insulation layer, as shown in FIGS. 17 and 18. FIG. 17 is a schematic diagram of the pattern of the second semiconductor layer in FIG. 9 and FIG. 18 is a schematic diagram after the pattern of the second semiconductor layer is formed in FIG. 9.

In an exemplary implementation, as shown in FIGS. 17 and 18, the pattern of the second semiconductor layer may at least include an active pattern 221 of the twenty-second transistor and an active pattern 241 of the twenty-fourth transistor.

In an exemplary implementation, as shown in FIGS. 17 and 18, the active pattern 221 of the twenty-second transistor of the shift register of present stage is located on a side of the active pattern 241 of the twenty-fourth transistor close to the shift register of next stage.

In an exemplary implementation, as shown in FIGS. 17 and 18, the active pattern 221 of the twenty-second transistor is individually provided. The active pattern 221 of the twenty-second transistor may have a strip shape and extend along the second direction D2.

In an exemplary implementation, as shown in FIGS. 17 and 18, the active pattern 241 of the twenty-fourth transistor is individually provided. The active pattern 241 of the twenty-fourth transistor may have a strip shape and extend along the second direction D2.

In an exemplary implementation, as shown in FIGS. 17 and 18, an active pattern of each transistor may include a first region, a second region and a channel region between the first region and the second region. In an exemplary implementation, a first region 221-1 and a second region 221-2 of the active pattern 221 of the twenty-second transistor, and a first region 241-1 and a second region 241-2 of the active pattern 241 of the twenty-fourth transistor are individually provided.

Figure 19:
FIG. 19 is a schematic diagram of a pattern of a third conductive layer in FIG. 9.
Figure 20:
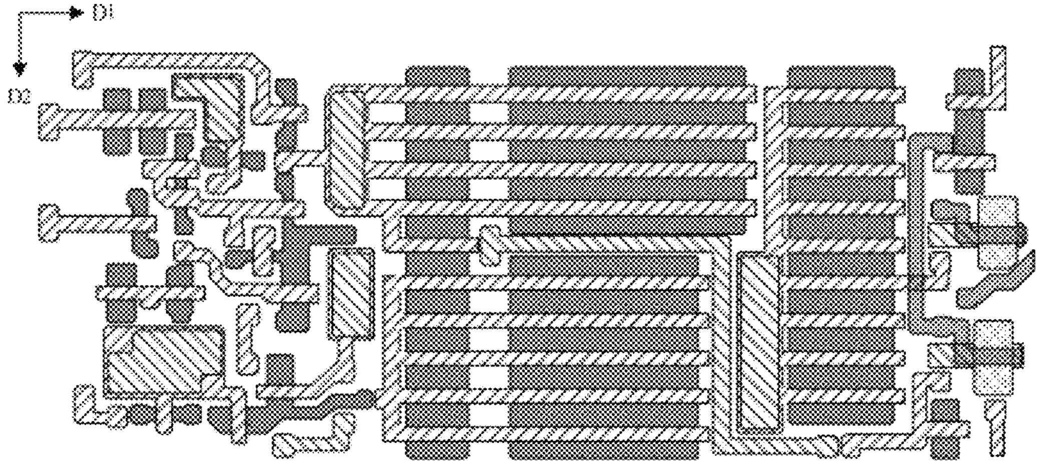
FIG. 20 is a schematic diagram after a pattern of a third conductive layer is formed in FIG. 9.

(5) Forming a pattern of a third conductive layer. In an exemplary implementation, forming a pattern of a third conductive layer may include: depositing a fourth insulation thin film and a third conductive thin film on the base substrate on which the aforementioned patterns are formed, patterning the third conductive thin film by a patterning process to form a fourth insulation layer covering the pattern of the second semiconductor layer and a pattern of the third conductive layer on the fourth insulation layer, as shown in FIGS. 19 and 20, wherein FIG. 19 is a schematic diagram of the pattern of the third conductive layer in FIG. 9, and FIG. 20 is a schematic diagram after the pattern of the third conductive layer is formed in FIG. 9. In an exemplary implementation, the third conductive layer may be referred to as a third gate metal (GATE3) layer.

In an exemplary implementation, as shown in FIGS. 19 and 20, the pattern of the third conductive layer may at least include a second gate electrode 222B of the twenty-second transistor, a second gate electrode 242B of the twenty-fourth transistor, and a sixth connection line L6 of the shift register of each stage.

In an exemplary implementation, as shown in FIGS. 19 and 20, the second gate electrode 222B and the first gate electrode of the twenty-second transistor form a gate electrode of the twenty-second transistor. An orthographic projection of the second gate electrode 222B of the twenty-second transistor on the base substrate is partially overlapped with an orthographic projection of the first gate electrode of the twenty-second transistor on the base substrate. The second gate electrode 222B of the twenty-second transistor may have a "[" shape, and may be provided with an opening.

In an exemplary implementation, as shown in FIGS. 19 and 20, the second gate electrode 242B and the first gate electrode of the twenty-fourth transistor form a gate electrode of the twenty-fourth transistor. An orthographic projection of the second gate electrode 242B of the twenty-fourth transistor on the base substrate is partially overlapped with an orthographic projection of the first gate electrode of the twenty-fourth transistor on the base substrate, and is located in the opening of the second gate electrode 222B of the twenty-second transistor. The second gate electrode 242B of the twenty-fourth transistor has a bend line shape and extends at least partially along the first direction D1.

In an exemplary implementation, as shown in FIGS. 19 and 20, the sixth connection line L6 is located in the opening of the second gate electrode 222B of the twenty-second transistor, and is located on a side of the second gate electrode 242B of the twenty-fourth transistor of the present stage close to the shift register of next stage. The sixth connection line L6 has a strip shape, and has an extension direction intersecting with the first direction D1 and the second direction D2.

In an exemplary implementation, as shown in FIGS. 19 and 20, the second gate electrode 222B of the twenty-second transistor is disposed across the active pattern of the twenty-second transistor, and the second gate electrode 242B of the twenty-fourth transistor is disposed across the active pattern of the twenty-fourth transistor.

In an exemplary implementation, after the pattern of the third conductive layer is formed, a conductive treatment may be performed on the second semiconductor layer by using the third conductive layer as a shield. The second semiconductor layer in a region shielded by the third conductive layer forms channel regions of the twenty-second transistor and the twenty-fourth transistor, and the second semiconductor layer in a region not shielded by the third conductive layer is made be conductive, that is, a first region and a second region of the active pattern of any one of the twenty-second transistor and the twenty-fourth transistor are all made be conductive.

(6) Forming a pattern of a fifth insulation layer. In an exemplary implementation, forming a pattern of a fifth insulation layer may include: depositing a fifth insulation thin film on a base substrate on which the aforementioned patterns are formed, and patterning the fifth insulation thin film by a patterning process to form a pattern of a fifth insulation layer covering the aforementioned structure, wherein the fifth insulation layer is provided with a plurality of via patterns, as shown in FIG. 21, which is a schematic diagram after forming the pattern of the fifth insulation layer in FIG. 9.

Figure 21:
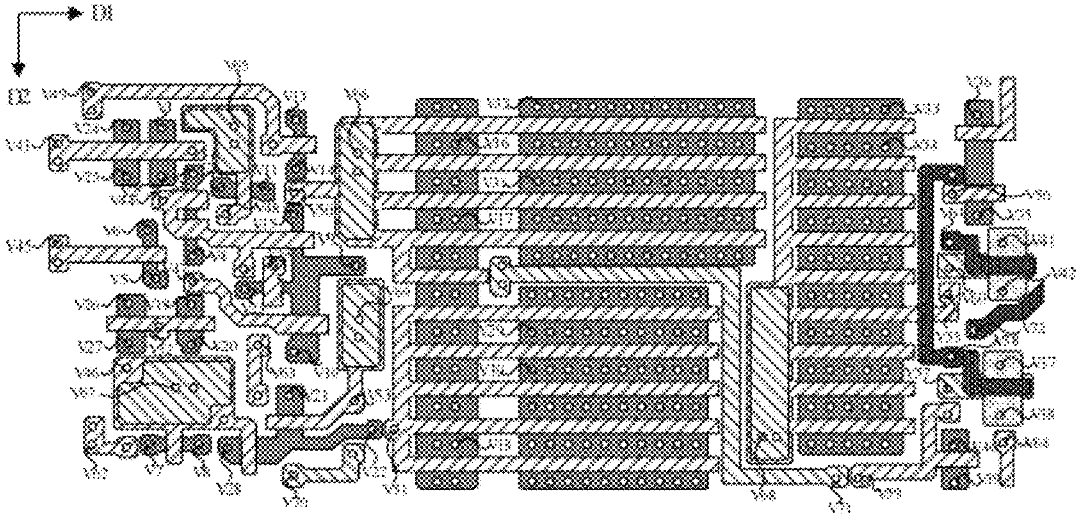
FIG. 21 is a schematic diagram after a pattern of a fifth insulation layer is formed in FIG. 9.

In an exemplary implementation, as shown in FIG. 21, the fifth insulation layer pattern may at least include a first via V1 to a seventy-first via V11 located in the shift register of each stage.

In an exemplary implementation, as shown in FIG. 21, an orthographic projection of the first via V1 on the base substrate is located within a range of an orthographic projection of the first region of the active pattern of the first transistor on the base substrate. The first insulation layer, the second insulation layer, the third insulation layer and the fourth insulation layer within the first via V1 are etched away to expose the surface of the first region of the active pattern of the first transistor, and the first via V1 is configured such that a first electrode of the first transistor (also the first electrode of the fourteenth transistor) formed subsequently is connected with the first region of the active pattern of the first transistor through the first via V1.

In an exemplary implementation, as shown in FIG. 21, an orthographic projection of the second via V2 on the base substrate is located within a range of an orthographic projection of a second region of the active pattern of the first transistor on the base substrate. The first insulation layer, the second insulation layer, the third insulation layer and the fourth insulation layer within the second via V2 is etched away to expose a surface of the second region of the active pattern of the first transistor, and the second via V2 is configured such that a second electrode of the first transistor formed subsequently is connected with the second region of the active pattern of the first transistor through the second via V2.

In an exemplary implementation, as shown in FIG. 21, an orthographic projection of the third via V3 on the base substrate is located within a range of an orthographic projection of a first region of the active pattern of the second transistor on the base substrate. The first insulation layer, the second insulation layer, the third insulation layer and the fourth insulation layer within the third via V3 are etched away to expose a surface of the first region of the active pattern of the second transistor, and the third via V3 is configured such that a first electrode of the second transistor formed subsequently is connected with the first region of the active pattern of the second transistor through the third via V3.

In an exemplary implementation, as shown in FIG. 21, an orthographic projection of the fourth via V4 on the base substrate is located within a range of an orthographic projection of the second region of the active pattern of the second transistor on the base substrate. The first insulation layer, the second insulation layer, the third insulation layer and the fourth insulation layer within the fourth via V4 are etched away to expose the surface of the second region of the active pattern of the second transistor, and the fourth via V4 is configured such that a second electrode of the second transistor (also the second electrode of the third transistor and the first electrode of the eleventh transistor) to be formed subsequently is connected with the second region of the active pattern of the second transistor through the fourth via V4.

In an exemplary implementation, as shown in FIG. 21, an orthographic projection of the fifth via V5 on the base substrate is located within a range of an orthographic projection of a first region of the active pattern of the third transistor on the base substrate. The first insulation layer, the second insulation layer, the third insulation layer and the fourth insulation layer within the fifth via V5 are etched away to expose a surface of the first region of the active pattern of the third transistor, and the fifth via V5 is configured such that a first electrode of the third transistor formed subsequently is connected with the first region of the active pattern of the third transistor through the fifth via V5.

In an exemplary implementation, as shown in FIG. 21, an orthographic projection of the sixth via V6 on the base substrate is located within a range of an orthographic projection of the second region of the active pattern of the third transistor on the base substrate. The first insulation layer, the second insulation layer, the third insulation layer and the fourth insulation layer within the sixth via V6 are etched away to expose the surface of the second region of the active pattern of the third transistor, and the sixth via V6 is configured such that a second electrode of the second transistor (also the second electrode of the third transistor and the first electrode of the eleventh transistor) formed subsequently is connected with the second region of the active pattern of the third transistor through the sixth via V6.

In an exemplary implementation, as shown in FIG. 21, an orthographic projection of the seventh via V7 on the base substrate is located within a range of an orthographic projection of a first region of the active pattern of the fourth transistor on the base substrate. The first insulation layer, the second insulation layer, the third insulation layer and the fourth insulation layer within the seventh via V7 are etched away to expose a surface of the first region of the active pattern of the fourth transistor, and the seventh via V7 is configured such that a first electrode of the fourth transistor formed subsequently is connected with the first region of the active pattern of the fourth transistor through the seventh via V7.

In an exemplary implementation, as shown in FIG. 21, an orthographic projection of the eighth via V8 on the base substrate is located within a range of an orthographic projection of a second region of the active pattern of the fourth transistor on the base substrate. The first insulation layer, the second insulation layer, the third insulation layer and the fourth insulation layer within the eighth via V8 are etched away to expose a surface of the second region of the active pattern of the fourth transistor, and the eighth via V8 is configured such that a second electrode of the fourth transistor (also the second electrode of the fifth transistor) formed subsequently is connected with the second region of the active pattern of the fourth transistor through the eighth via V8.

In an exemplary implementation, as shown in FIG. 21, an orthographic projection of the ninth via V9 on the base substrate is within a range of an orthographic projection of a first region of the active pattern of the fifth transistor (also the first region of the active pattern of the eighth transistor and the first region of the active pattern of the thirteenth transistor) on the base substrate. The first insulation layer, the second insulation layer, the third insulation layer and the fourth insulation layer within the ninth via V9 are etched away to expose a surface of the second region of the active pattern of the fourth transistor, and the ninth via V9 is configured such that a first electrode of the fifth transistor (also the first electrode of the eighth transistor, the first electrode of the ninth transistor and the first electrode of the thirteenth transistor) formed subsequently is connected with the first region of the active pattern of the fifth transistor (also the first region of the active pattern of the eighth transistor and the first region of the active pattern of the thirteenth transistor) through the ninth via V9.

In an exemplary implementation, as shown in FIG. 21, an orthographic projection of the tenth via V10 on the base substrate is located within a range of an orthographic projection of a second region of the active pattern of the fifth transistor on the base substrate. The first insulation layer, the second insulation layer, the third insulation layer and the fourth insulation layer within the tenth via V10 are etched away to expose a surface of the second region of the active pattern of the fifth transistor, and the tenth via V10 is configured such that a second electrode of the fourth transistor (also the second electrode of the fifth transistor) formed subsequently is connected with the second region of the active pattern of the fifth transistor through the tenth via V10.

In an exemplary implementation, as shown in FIG. 21, an orthographic projection of the eleventh via V11 on the base substrate is located within a range of an orthographic projection of a first region of the active pattern of the sixth transistor on the base substrate. The first insulation layer, the second insulation layer, the third insulation layer and the fourth insulation layer within the eleventh via V11 are etched away to expose a surface of the first region of the active pattern of the sixth transistor, and the eleventh via V11 is configured such that a first electrode of the sixth transistor formed subsequently is connected with the first region of the active pattern of the sixth transistor through the eleventh via V11.

In an exemplary implementation, as shown in FIG. 21, an orthographic projection of the twelfth via V12 on the base substrate is located within a range of an orthographic projection of a second region of the active pattern of the sixth transistor on the base substrate. The first insulation layer, the second insulation layer, the third insulation layer and the fourth insulation layer within the twelfth via V12 are etched away to expose a surface of the second region of the active pattern of the sixth transistor, and the twelfth via V12 is configured such that a second electrode of the sixth transistor (also the first electrode of the seventh transistor) formed subsequently is connected with the second region of the active pattern of the sixth transistor through the twelfth via V12.

In an exemplary implementation, as shown in FIG. 21, an orthographic projection of the thirteen via V13 on the base substrate is located within a range of an orthographic projection of a first region of the active pattern of the seventh transistor on the base substrate. The first insulation layer, the second insulation layer, the third insulation layer and the fourth insulation layer within the third via V13 are etched away to expose a surface of the first region of the active pattern of the seventh transistor, and the thirteen via V13 is configured such that a second electrode of the sixth transistor (also the first electrode of the seventh transistor) formed subsequently is connected with the first region of the active pattern of the seventh transistor through the thirteen via V13.

In an exemplary implementation, as shown in FIG. 21, an orthographic projection of the fourteenth via V14 on the base substrate is located within a range of an orthographic projection of a second region of the active pattern of the seventh transistor on the base substrate. The first insulation layer, the second insulation layer, the third insulation layer and the fourth insulation layer within the fourteenth via V14 are etched away to expose a surface of the second region of the active pattern of the seventh transistor, and the fourteenth via V14 is configured such that a second electrode of the seventh transistor (also the second electrode of the eighth transistor) formed subsequently is connected with the second region of the active pattern of the seventh transistor through the fourteenth via V14.

In an exemplary implementation, as shown in FIG. 21, an orthographic projection of the fifteenth via V15 on the base substrate is located within a range of an orthographic projection of a second region of the active pattern of the eighth transistor on the base substrate. The first insulation layer, the second insulation layer, the third insulation layer and the fourth insulation layer within the tenth via V15 is etched away to expose a surface of the second region of the active pattern of the eighth transistor, and the fifteenth via V15 is configured such that a second electrode of the seventh transistor (also the second electrode of the eighth transistor) formed subsequently is connected with the second region of the active pattern of the eighth transistor through the fifteenth via V15.

In an exemplary implementation, as shown in FIG. 21, an orthographic projection of the sixteenth via V16 on the base substrate is located within a range of an orthographic projection of the first region of the active pattern of the ninth transistor on the base substrate. The first insulation layer, the second insulation layer, the third insulation layer and the fourth insulation layer within the sixteenth via V16 are etched away to expose the surface of the first region of the active pattern of the ninth transistor, and the sixteenth via V16 is configured such that a first electrode of the fifth transistor (also the first electrode of the eighth transistor, the first electrode of the ninth transistor and the first electrode of the thirteenth transistor) formed subsequently is connected with the first region of the active pattern of the ninth transistor through the sixteenth via V16.

In an exemplary implementation, as shown in FIG. 21, an orthographic projection of the seventeenth via V17 on the base substrate is within a range of an orthographic projection of the second region of the active layer of the ninth transistor (also the second region of the active pattern of the tenth transistor) on the base substrate, the first insulation layer, the second insulation layer, the third insulation layer and the fourth insulation layer within the seventeenth via V17 are etched away to expose a surface of the second region of the active layer of the ninth transistor (also the second region of the active pattern of the tenth transistor), and the seventeenth via V17 is configured such that a second electrode of the ninth transistor (also the second electrode of the tenth transistor) formed subsequently is connected with the second region of the active layer of the ninth transistor (also the second region of the active pattern of the tenth transistor) through the seventeenth via V17.

In an exemplary implementation, as shown in FIG. 21, an orthographic projection of the eighteenth via V18 on the base substrate is located within a range of an orthographic projection of a first region of the active pattern of the tenth transistor on the base substrate. The first insulation layer, the second insulation layer, the third insulation layer and the fourth insulation layer within the eighteenth via V18 are etched away to expose a surface of the first region of the active pattern of the tenth transistor, and the eighteenth via V18 is configured such that a first electrode of the tenth transistor formed subsequently is connected with the first region of the active pattern of the tenth transistor through the eighteenth via V18.

In an exemplary implementation, as shown in FIG. 21, an orthographic projection of the nineteenth via V19 on the base substrate is located within a range of an orthographic projection of the first region of the active pattern of the eleventh transistor on the base substrate. The first insulation layer, the second insulation layer, the third insulation layer and the fourth insulation layer within the nineteenth via V19 are etched away to expose the surface of the first region of the active pattern of the eleventh transistor, and the nineteenth via V19 is configured such that a second electrode of the second transistor (also the second electrode of the third transistor and the first electrode of the eleventh transistor) formed subsequently is connected with the first region of the active pattern of the eleventh transistor through the nineteenth via V19.

In an exemplary implementation, as shown in FIG. 21, an orthographic projection of the twentieth via V20 on the base substrate is located within a range of an orthographic projection of a second region of the active pattern of the eleventh transistor on the base substrate. The first insulation layer, the second insulation layer, the third insulation layer and the fourth insulation layer within the twentieth via V20 are etched away to expose a surface of the second region of the active pattern of the eleventh transistor, and the twentieth via V20 is configured such that a second electrode of the eleventh transistor formed subsequently is connected with the second region of the active pattern of the eleventh transistor through the twentieth via V20.

In an exemplary implementation, as shown in FIG. 21, an orthographic projection of the twenty-first via V21 on the base substrate is located within a range of an orthographic projection of the first region of the active pattern of the twelfth transistor on the base substrate. The first insulation layer, the second insulation layer, the third insulation layer and the fourth insulation layer within the twenty-first via V21 are etched away to expose the surface of the first region of the active pattern of the twelfth transistor, and the twenty-first via V21 is configured such that a first electrode of the twelfth transistor formed subsequently is connected with the first region of the active pattern of the twelfth transistor through the twenty-first via V21.

In an exemplary implementation, as shown in FIG. 21, an orthographic projection of the twenty-second via V22 on the base substrate is located within a range of an orthographic projection of the second region of the active pattern of the twelfth transistor (also the second region of the active pattern of the sixteenth transistor) on the base substrate. The first insulation layer, the second insulation layer, the third insulation layer and the fourth insulation layer within the twenty-second via V22 are etched away to expose the surface of the second region of the active pattern of the twelfth transistor (also the second region of the active pattern of the sixteenth transistor), and the twenty-second via V22 is configured such that a second electrode of the twelfth transistor (also the second electrode of the sixteenth transistor) formed subsequently is connected with the second region of the active pattern of the twelfth transistor (also the second region of the active pattern of the sixteenth transistor) through the twenty-second via V22.

In an exemplary implementation, as shown in FIG. 21, an orthographic projection of the twenty-third via V23 on the base substrate is located within a range of an orthographic projection of a second region of the active pattern of the thirteenth transistor on the base substrate. The first insulation layer, the second insulation layer, the third insulation layer and the fourth insulation layer within the twenty-third via V23 are etched away to expose a surface of the second region of the active pattern of the thirteenth transistor, and the twenty-third via V23 is configured such that a second electrode of the thirteenth transistor formed subsequently is connected with the second region of the active pattern of the thirteenth transistor through the twenty-third via V23.

In an exemplary implementation, as shown in FIG. 21, an orthographic projection of the twenty-fourth via V24 on the base substrate is located within a range of an orthographic projection of the first region of the active pattern of the fourteenth transistor on the base substrate. The first insulation layer, the second insulation layer, the third insulation layer and the fourth insulation layer within the twenty-fourth via V24 are etched away to expose the surface of the first region of the active pattern of the fourteenth transistor, and the twenty-fourth via V24 is configured such that a first electrode of the first transistor (also the first electrode of the fourteenth transistor) formed subsequently is connected with the first region of the active pattern of the fourteenth transistor through the twenty-fourth via V24.

In an exemplary implementation, as shown in FIG. 21, an orthographic projection of the twenty-fifth via V25 on the base substrate is located within a range of an orthographic projection of the second region of the active pattern of the fourteenth transistor on the base substrate. The first insulation layer, the second insulation layer, the third insulation layer and the fourth insulation layer within the twenty-fifth via V25 are etched away to expose a surface of the second region of the active pattern of the fourteenth transistor, and the twenty-fifth via V25 is configured such that a second electrode of the fourteenth transistor (also the first electrode of the fifteenth transistor) formed subsequently is connected with the second region of the active pattern of the fourteenth transistor through the twenty-fifth via V25.

In an exemplary implementation, as shown in FIG. 21, an orthographic projection of the twenty-sixth via V26 on the base substrate is located within a range of an orthographic projection of the first region of the active pattern of the fifteenth transistor on the base substrate. The first insulation layer, the second insulation layer, the third insulation layer and the fourth insulation layer within the twenty-sixth via V26 are etched away to expose a surface of the first region of the active pattern of the fifteenth transistor, and the twenty-sixth via V26 is configured such that a second electrode of the fourteenth transistor (also the first electrode of the fifteenth transistor) formed subsequently is connected with the first region of the active pattern of the fifteenth transistor through the twenty-sixth via V26.

In an exemplary implementation, as shown in FIG. 21, an orthographic projection of the twenty-seventh via V27 on the base substrate is located within a range of an orthographic projection of the second region of the active pattern of the fifteenth transistor on the base substrate. The first insulation layer, the second insulation layer, the third insulation layer and the fourth insulation layer within the twenty-seventh via V27 are etched away to expose a surface of the second region of the active pattern of the fifteenth transistor, and the twenty-seventh via V27 is configured such that a second electrode of the fifteenth transistor formed subsequently is connected with the second region of the active pattern of the fifteenth transistor through the twenty-seventh via V27.

In an exemplary implementation, as shown in FIG. 21, an orthographic projection of the twenty-eighth via V28 on the base substrate is located within a range of an orthographic projection of the first region of the active pattern of the sixteenth transistor on the base substrate. The first insulation layer, the second insulation layer, the third insulation layer and the fourth insulation layer within the twenty-eighth via V28 are etched away to expose the surface of the first region of the active pattern of the sixteenth transistor, and the twenty-eighth via V28 is configured such that a first electrode of the sixteenth transistor formed subsequently is connected with the first region of the active pattern of the sixteenth transistor through the twenty-eighth via V28.

In an exemplary implementation, as shown in FIG. 21, an orthographic projection of the twenty-ninth via V29 on the base substrate is located within a range of an orthographic projection of a first region of the active pattern of the seventeenth transistor on the base substrate. The first insulation layer, the second insulation layer, the third insulation layer and the fourth insulation layer within the twenty-ninth via V29 are etched away to expose a surface of the first region of the active pattern of the seventeenth transistor, and the twenty-ninth via V29 is configured such that a first electrode of the seventeenth transistor subsequently formed is connected with the first region of the active pattern of the seventeenth transistor through the twenty-ninth via V29.

In an exemplary implementation, as shown in FIG. 21, an orthographic projection of the thirtieth via V30 on the base substrate is located within a range of an orthographic projection of the second region of the active pattern of the seventeenth transistor on the base substrate. The first insulation layer, the second insulation layer, the third insulation layer and the fourth insulation layer within the thirtieth via V30 are etched away to expose the surface of the second region of the active pattern of the seventeenth transistor, and the thirtieth via V30 is configured such that a second electrode of the seventeenth transistor (also the second electrode of the nineteenth transistor and the second electrode of the twenty-fourth transistor) formed subsequently is connected with the second region of the active pattern of the seventeenth transistor through the thirtieth via V30.

In an exemplary implementation, as shown in FIG. 21, an orthographic projection of the thirty-first via V31 on the base substrate is located within a range of an orthographic projection of a first region of the active pattern of the eighteenth transistor on the base substrate. The first insulation layer, the second insulation layer, the third insulation layer and the fourth insulation layer within the thirty-first via V31 are etched away to expose a surface of the first region of the active pattern of the eighteenth transistor, and the thirty-first via V31 is configured such that a first electrode of the eighteenth transistor formed subsequently is connected with the first region of the active pattern of the eighteenth transistor through the thirty-first via V31.

In an exemplary implementation, as shown in FIG. 21, an orthographic projection of the thirty-second via V32 on the base substrate is located within a range of an orthographic projection of a second region of the active pattern of the eighteenth transistor on the base substrate. The first insulation layer, the second insulation layer, the third insulation layer and the fourth insulation layer within the thirty-second via V32 are etched away to expose a surface of the second region of the active pattern of the eighteenth transistor, and the thirty-second via V32 is configured such that a second electrode of the eighteenth transistor (also the first electrode of the nineteenth transistor) formed subsequently is connected with the second region of the active pattern of the eighteenth transistor through the thirty-second via V32.

In an exemplary implementation, as shown in FIG. 21, an orthographic projection of the thirty-third via V33 on the base substrate is located within a range of an orthographic projection of a first region of the active pattern of the nineteenth transistor on the base substrate. The first insulation layer, the second insulation layer, the third insulation layer and the fourth insulation layer within the thirty-third via V33 are etched away to expose a surface of the first region of the active pattern of the nineteenth transistor, and the thirty-third via V33 is configured such that a second electrode of the eighteenth transistor (also the first electrode of the nineteenth transistor) formed subsequently is connected with the first region of the active pattern of the nineteenth transistor through the thirty-third via V33.

In an exemplary implementation, as shown in FIG. 21, an orthographic projection of the thirty-fourth via V34 on the base substrate is located within a range of an orthographic projection of the second region of the active pattern of the nineteenth transistor on the base substrate. The first insulation layer, the second insulation layer, the third insulation layer and the fourth insulation layer within the thirty-fourth via V34 are etched away to expose the surface of the second region of the active pattern of the nineteenth transistor, and the thirty-fourth via V34 is configured such that a second electrode of the seventeenth transistor (also the second electrode of the nineteenth transistor and the second electrode of the twenty-fourth transistor) formed subsequently is connected with the second region of the active pattern of the nineteenth transistor through the thirty-fourth via V34.

In an exemplary implementation, as shown in FIG. 21, an orthographic projection of the thirty-fifth via V35 on the base substrate is located within a range of an orthographic projection of a first region of the active pattern of the twentieth transistor on the base substrate. The first insulation layer, the second insulation layer, the third insulation layer and the fourth insulation layer within the thirty-fifth via V35 are etched away to expose a surface of the first region of the active pattern of the twentieth transistor, and the thirty-fifth via V35 is configured such that a first electrode of the twentieth transistor formed subsequently is connected with the first region of the active pattern of the twentieth transistor through the thirty-fifth via V35.

In an exemplary implementation, as shown in FIG. 21, an orthographic projection of the thirty-sixth via V36 on the base substrate is located within a range of an orthographic projection of a first region of the active pattern of the twenty-first transistor on the base substrate. The first insulation layer, the second insulation layer, the third insulation layer and the fourth insulation layer within the thirty-sixth via V36 are etched away to expose a surface of the first region of the active pattern of the twenty-first transistor, and the third via V36 is configured such that a first electrode of the twenty-first transistor formed subsequently is connected with the first region of the active pattern of the twenty-first transistor through the thirty-sixth via V36.

In an exemplary implementation, as shown in FIG. 21, an orthographic projection of the thirty-seventh via V37 on the base substrate is located within a range of an orthographic projection of a first region of the active pattern of the twenty-second transistor on the base substrate. The fourth insulation layer within the thirty-seventh via V37 is etched away to expose a surface of the first region of the active pattern of the second transistor, and the thirty-seventh via V37 is configured such that a first electrode of the twenty-second transistor formed subsequently is connected with the first region of the active pattern of the twenty-first transistor through the thirty-seventh via V37.

In an exemplary implementation, as shown in FIG. 21, an orthographic projection of the thirty-eighth via V38 on the base substrate is within a range of an orthographic projection of the second region of the active pattern of the twenty-second transistor on the base substrate. The fourth insulation layer within the thirty-eighth via V38 is etched away to expose a surface of the second region of the active pattern of the twenty-second transistor, and the thirty-eighth via V38 is configured such that the second electrode of the twenty-second transistor (also the second electrode of the twenty-third transistor) subsequently formed is connected with the second region of the active pattern of the twenty-first transistor through the thirty-eighth via V38.

In an exemplary implementation, as shown in FIG. 21, an orthographic projection of the thirty-ninth via V39 on the base substrate is within a range of an orthographic projection of the first region of the active pattern of the twenty-third transistor on the base substrate. The first insulation layer, the second insulation layer, the third insulation layer and the fourth insulation layer within the thirty-ninth via V39 are etched away to expose a surface of the first region of the active pattern of the twenty-third transistor, and the thirty-ninth via V39 is configured such that the first electrode of the twenty-third transistor formed subsequently is connected with the first region of the active pattern of the twenty-third transistor through the thirty-ninth via V39.

In an exemplary implementation, as shown in FIG. 21, an orthographic projection of the fortieth via V40 on the base substrate is located within a range of an orthographic projection of a second region of the active pattern of the twenty-third transistor on the base substrate. The first insulation layer, the second insulation layer, the third insulation layer and the fourth insulation layer within the fortieth via V40 are etched away to expose a surface of the second region of the active pattern of the twenty-third transistor, and the fortieth via V40 is configured such that a second electrode of the twenty-second transistor (also the second electrode of the twenty-third transistor) formed subsequently is connected with the second region of the active pattern of the twenty-third transistor through the fortieth via V40.

In an exemplary implementation, as shown in FIG. 21, an orthographic projection of the forty-first via V41 on the base substrate is located within a range of an orthographic projection of a first region of the active pattern of the twenty-fourth transistor on the base substrate. The fourth insulation layer within the forty-first via V41 is etched away to expose a surface of the first region of the active pattern of the twenty-fourth transistor, and the forty-first via V41 is configured such that a first electrode of the twenty-fourth transistor formed subsequently is connected with the first region of the active pattern of the twenty-fourth transistor through the forty-first via V41.

In an exemplary implementation, as shown in FIG. 21, an orthographic projection of the forty-second via V42 on the base substrate is located within a range of an orthographic projection of the second region of the active pattern of the twenty-fourth transistor on the base substrate. The fourth insulation layer within the forty-second via V42 is etched away to expose the surface of the second region of the active pattern of the twenty-fourth transistor, and the forty-second via V42 is configured such that a second electrode of the seventeenth transistor (also the second electrode of the nineteenth transistor and the second electrode of the twenty-fourth transistor) formed subsequently is connected with the second region of the active pattern of the twenty-fourth transistor through the forty-second via V42.

In an exemplary implementation, as shown in FIG. 21, an orthographic projection of the forty-third via V43 on the base substrate is located within a range of an orthographic projection of the gate electrode of the first transistor (which is also the gate electrode of the fourteenth transistor) on the base substrate. The second insulation layer, the third insulation layer and the fourth insulation layer within the forty-third via V43 are etched away to expose a surface of the gate electrode of the first transistor (also the gate electrode of the fourteenth transistor), and the forty-third via V43 is configured such that one of the first clock signal line and the second clock signal line and a first electrode of the second transistor formed subsequently is connected with to the gate electrode of the first transistor (also the gate electrode of the fourteenth transistor) through the forty-third via V43. FIG. 21 is illustrated by taking the first clock signal line and the gate electrode of the first transistor (also the gate electrode of the fourteenth transistor) being connected as an example.

In an exemplary implementation, as shown in FIG. 21, an orthographic projection of the forty-fourth via V44 on the base substrate is located within a range of an orthographic projection of the gate electrode of the second transistor (also the gate electrode of the eighth transistor) on the base substrate. The second insulation layer, the third insulation layer and the fourth insulation layer within the forty-fourth via V44 are etched away to expose the surface of the gate electrode of the second transistor (also the gate electrode of the eighth transistor), and the forty-fourth via V44 is configured such that a second electrode of the first transistor and the second electrode of the thirteenth transistor formed subsequently are connected with the gate electrode of the second transistor (also the gate electrode of the eighth transistor) through the forty-fourth via V44.

In an exemplary implementation, as shown in FIG. 21, an orthographic projection of the forty-fifth via V45 on the base substrate is located within a range of an orthographic projection of the gate electrode of the third transistor on the base substrate. The second insulation layer, the third insulation layer and the fourth insulation layer within the forty-fifth via V45 are etched away to expose the surface of the gate electrode of the third transistor, and the forty-fifth via V45 is configured such that one of the first clock signal line and the second clock signal line formed subsequently is connected with the gate electrode of the third transistor through the forty-fifth via V45. FIG. 21 illustrates the first clock signal line as an example.

In an exemplary implementation, as shown in FIG. 21, an orthographic projection of the forty-sixth via V46 on the base substrate is located within a range of an orthographic projection of the gate electrode of the fourth transistor (also the gate electrode of the sixteenth transistor and the first plate of the third capacitor) on the base substrate. The second insulation layer, the third insulation layer and the fourth insulation layer within the forty-sixth via V46 are etched away to expose the surface of the gate electrode of the fourth transistor (also the gate electrode of the sixteenth transistor and the first plate of the third capacitor), and the forty-sixth via V46 is configured such that the second electrode of the fifteenth transistor and the first electrode of the sixteenth transistor formed subsequently is connected with the gate electrode of the fourth transistor (also the gate electrode of the sixteenth transistor and the first plate of the third capacitor) through the forty-sixth via V46.

In an exemplary implementation, as shown in FIG. 21, an orthographic projection of the forty-seventh via V47 on the base substrate is located within a range of an orthographic projection of the gate electrode of the fifth transistor on the base substrate. The second insulation layer, the third insulation layer and the fourth insulation layer within the forty-seventh via V47 are etched away to expose a surface of the gate electrode of the fifth transistor, and the forty-seventh via V47 is configured such that the second electrode of the second transistor (also the second electrode of the third transistor and the first electrode of the eleventh transistor) formed subsequently is connected with the gate electrode of the fifth transistor through the forty-seventh via V47.

In an exemplary implementation, as shown in FIG. 21, an orthographic projection of the forty-eighth via V48 on the base substrate is located within a range of an orthographic projection of the gate electrode of the sixth transistor (the first plate of the first capacitor) on the base substrate. The second insulation layer, the third insulation layer and the fourth insulation layer within the forty-eighth via V48 are etched away to expose the surface of the gate electrode of the sixth transistor (the first plate of the first capacitor), and the forty-eighth via V48 is configured such that the second electrode of the eleventh transistor formed subsequently is connected with the gate electrode of the sixth transistor (the first plate of the first capacitor) through the forty-eighth via V48.

In an exemplary implementation, as shown in FIG. 21, an orthographic projection of the forty-ninth via V49 on the base substrate is within a range of an orthographic projection of the gate electrode of the seventh transistor on the base substrate. The second insulation layer, the third insulation layer and the fourth insulation layer within the forty-ninth via V49 are etched away to expose a surface of the gate electrode of the seventh transistor, and the forty-ninth via V49 is configured such that the other of the first clock signal line and the second clock signal line formed subsequently and the first electrode of the sixth transistor are connected with the gate electrode of the seventh transistor through the forty-ninth via V49. FIG. 21 illustrates the second clock signal line as an example.

In an exemplary implementation, as shown in FIG. 21, an orthographic projection of the fiftieth via V50 on the base substrate is located within a range of an orthographic projection of the gate electrode of the ninth transistor (also the gate electrode of the eighteenth transistor and the first plate of the second capacitor) on the base substrate. The second insulation layer, the third insulation layer and the fourth insulation layer within the fiftieth via V50 are etched away to expose the surface of the gate electrode of the ninth transistor (also the gate electrode of the eighteenth transistor and the first plate of the second capacitor), and the fiftieth via V50 is configured such that the second electrode of the seventh transistor (also the second electrode of the eighth transistor) formed subsequently is connected with the gate electrode of the ninth transistor (also the gate electrode of the eighteenth transistor and the first plate of the second capacitor) through the fiftieth via V50.

In an exemplary implementation, as shown in FIG. 21, an orthographic projection of the fifty-first via V51 on the base substrate is located within a range of an orthographic projection of the gate electrode of the tenth transistor (also the gate electrode of the seventeenth transistor) on the base substrate. The second insulation layer, the third insulation layer and the fourth insulation layer within the fifty-first via V51 are etched away to expose the surface of the gate electrode of the tenth transistor (also the gate electrode of the seventeenth transistor), and the fifty-first via V51 is configured such that the second electrode of the twelfth transistor (also the second electrode of the sixteenth transistor) formed subsequently is connected with the gate electrode of the tenth transistor (also the gate electrode of the seventeenth transistor) through the fifty-first via V51.

In an exemplary implementation, as shown in FIG. 21, an orthographic projection of the fifty-second via V52 on the base substrate is located within a range of an orthographic projection of the gate electrode of the eleventh transistor (also the gate electrode of the fifteenth transistor) on the base substrate. The second insulation layer, the third insulation layer and the fourth insulation layer within the fifty-second via V52 are etched away to expose the surface of the gate electrode of the eleventh transistor (also the gate electrode of the fifteenth transistor), and the fifty-second via V52 is configured such that the first electrode of the third transistor formed subsequently is connected with the gate electrode of the eleventh transistor (also the gate electrode of the fifteenth transistor) through the fifty-second via V52.

In an exemplary implementation, as shown in FIG. 21, an orthographic projection of the fifty-third via V53 on the base substrate is located within a range of an orthographic projection of the gate electrode of the twelfth transistor (also the first plate of the fifth capacitor) on the base substrate. The second insulation layer, the third insulation layer and the fourth insulation layer within the fifty-third via V53 are etched away to expose the surface of the gate electrode of the twelfth transistor (also the first plate of the fifth capacitor), and the fifty-third via V53 is configured such that the first electrode of the tenth transistor formed subsequently is connected with the gate electrode of the twelfth transistor (also the first plate of the fifth capacitor) through the fifty-third via V53.

In an exemplary implementation, as shown in FIG. 21, an orthographic projection of the fifty-fourth via V54 on the base substrate is located within a range of an orthographic projection of the gate electrode of the thirteenth transistor on the base substrate. The second insulation layer, the third insulation layer and the fourth insulation layer within the fifty-fourth via V54 are etched away to expose the surface of the gate electrode of the thirteenth transistor, and the fifty-fourth via V54 is configured such that a third power supply line formed subsequently is connected with the gate electrode of the thirteenth transistor through the fifty-fourth via V54.

In an exemplary implementation, as shown in FIG. 21, an orthographic projection of the fifty-fifth via V55 on the base substrate is located within a range of an orthographic projection of the gate electrode of the nineteenth transistor on the base substrate. The second insulation layer, the third insulation layer and the fourth insulation layer within the fifty-fifth via V55 are etched away to expose the surface of the gate electrode of the nineteenth transistor, and the fifty-fifth via V55 is configured such that the a first electrode of the twentieth transistor formed subsequently is connected with the gate electrode of the nineteenth transistor through the fifty-fifth via V55.

In an exemplary implementation, as shown in FIG. 21, an orthogonal projection of the fifty-sixth via V56 on the base substrate is within a range of an orthogonal projection of the gate electrode of the twentieth transistor on the base substrate. The second insulation layer, the third insulation layer, and the fourth insulation layer within the fifty-sixth via V56 are etched away to expose a surface of the gate electrode of the twentieth transistor, and the fifty-sixth via V56 is configured such that a seventh connection portion formed subsequently is connected with the gate electrode of the twentieth transistor through the fifty-sixth via V56.

In an exemplary implementation, as shown in FIG. 21, an orthographic projection of the fifty-seventh via V57 on the base substrate is within a range of an orthographic projection of the first gate electrode of the twenty-second transistor on the base substrate. The second insulation layer, the third insulation layer, and the fourth insulation layer within the fifty-seventh via V57 are etched away to expose the surface of the first gate electrode of the twenty-second transistor, and the fifty-seventh via V57 is configured such that an eighth connection line formed subsequently is connected with the first gate electrode of the twenty-second transistor through the fifty-seventh via V57.

In an exemplary implementation, as shown in FIG. 21, an orthographic projection of the fifty-eighth via V58 on the base substrate is within a range of an orthographic projection of the second gate electrode of the twenty-second transistor on the base substrate. The fifty-eighth via V58 exposes a surface of the second gate electrode of the twenty-second transistor, and the fifty-eighth via V58 is configured such that an eighth connection line and a seventh connection line subsequently formed are connected with the second gate electrode of the twenty-second transistor through the fifty-eighth via V58.

In an exemplary implementation, as shown in FIG. 21, an orthogonal projection of the fifty-ninth via V59 on the base substrate is within a range of an orthogonal projection of the gate electrode of the twenty-third transistor on the base substrate. The second insulation layer, the third insulation layer and the fourth insulation layer within the fifty-ninth via V59 are etched away to expose a surface of the gate electrode of the twenty-third transistor, and the fifty-ninth via V59 is configured such that the eighth connection line and a ninth connection line subsequently formed are connected with the gate electrode of the twenty-third transistor through the fifty-ninth via V59.

In an exemplary implementation, as shown in FIG. 21, an orthographic projection of the sixtieth via V60 on the base substrate is within a range of an orthographic projection of the first gate electrode of the twenty-fourth transistor on the base substrate. The second insulation layer, the third insulation layer, and the fourth insulation layer within the sixtieth via V60 are etched away to expose a surface of the first gate electrode of the twenty-fourth transistor, and the sixtieth via V60 is configured such that the first electrode of the twentieth transistor subsequently formed is connected with the first gate electrode of the twenty-fourth transistor through the sixtieth via V60.

In an exemplary implementation, as shown in FIG. 21, an orthographic projection of the sixty-first via V61 on the base substrate is within a range of an orthographic projection of the second gate electrode of the twenty-fourth transistor on the base substrate. The sixty-first V61 exposes a surface of the second gate electrode of the twenty-fourth transistor, and the sixty-first via V61 is configured such that a first electrode of the twentieth transistor subsequently formed is connected with to the second gate electrode of the twenty-fourth transistor through the sixty-first via V61.

In an exemplary implementation, as shown in FIG. 21, an orthographic projection of the sixty-second via V62 on the base substrate is within a range of an orthographic projection of the first connection line on the base substrate. The second insulation layer, the third insulation layer, and the fourth insulation layer within the sixty-second via V62 are etched away to expose a surface of the first connection line, and the sixty-second via V62 is configured such that the other of the first clock signal line and the second clock signal line and the first electrode of the fourth transistor formed subsequently are connected with the first connection line through the sixty-second via V62.

In an exemplary implementation, as shown in FIG. 21, an orthographic projection of the sixty-third via V63 on the base substrate is within a range of an orthographic projection of the second connection line on the base substrate. The second insulation layer, the third insulation layer, and the fourth insulation layer within the sixty-third via V63 are etched away to expose the surface of the second connection line, and the sixty-third via V63 is configured such that the first electrode of the twelfth transistor and the second electrode of the thirteenth transistor formed subsequently are connected with the second connection line through the sixty-third via V63.

In an exemplary implementation, as shown in FIG. 21, an orthographic projection of the sixty-fourth via V64 on the base substrate is within a range of an orthographic projection of the third connection line on the base substrate. The second insulation layer, the third insulation layer, and the fourth insulation layer within the sixty-fourth via V64 are etched away to expose the surface of the third connection line, and the sixty-fourth via V64 is configured such that the second electrode of the twenty-second transistor (also the second electrode of the twenty-third transistor) subsequently formed is connected with the third connection line through the sixty-fourth via V64.

In an exemplary implementation, as shown in FIG. 21, an orthographic projection of the sixty-fifth via V65 on the base substrate is within a range of an orthographic projection of the second plate of the first capacitor on the base substrate. The third insulation layer and the fourth insulation layer within the sixty-fifth via V65 are etched away to expose the surface of the second plate of the first capacitor, and the sixty-fifth via V65 is configured such that the second electrode of the sixth transistor (also the first electrode of the seventh transistor) formed subsequently is connected with the second plate of the first capacitor through the sixty-fifth via V65.

In an exemplary implementation, as shown in FIG. 21, an orthographic projection of the sixty-sixth via V66 on the base substrate is within a range of an orthographic projection of the second plate of the second capacitor on the base substrate. The third insulation layer and the fourth insulation layer within the sixty-sixth via V66 are etched away to expose the surface of a second plate of the second capacitor, and the sixty-sixth via V66 is configured such that the first electrode of the fifth transistor (also the first electrode of the eighth transistor, the first electrode of the ninth transistor, and the first electrode of the thirteenth transistor) formed subsequently is connected with the second plate of the second capacitor through the sixty-sixth via V66.

In an exemplary implementation, as shown in FIG. 21, an orthographic projection of the sixty-seventh via V67 on the base substrate is within a range of an orthographic projection of the second plate of the third capacitor on the base substrate. The third insulation layer and the fourth insulation layer within the sixty-seventh via V67 are etched away to expose a surface of the second plate of the third capacitor, and the sixty-seventh via V67 is configured such that the second electrode of the fourth transistor (also the second electrode of the fifth transistor) formed subsequently is connected with the second plate of the third capacitor through the sixty-seventh via V67.

In an exemplary implementation, as shown in FIG. 21, an orthographic projection of the sixty-eighth via V68 on the base substrate is within a range of an orthographic projection of the second plate of the fourth capacitor on the base substrate. The third insulation layer and the fourth insulation layer within the sixty-eighth via V68 are etched away to expose a surface of the second plate of the fourth capacitor, and the sixty-eighth via V68 is configured such that a tenth connection line subsequently formed is connected with the second plate of the fourth capacitor through the sixty-eighth via V68.

In an exemplary implementation, as shown in FIG. 21, an orthographic projection of the sixty-ninth via V69 on the base substrate is within a range of an orthographic projection of the second plate of the fifth capacitor on the base substrate. The third insulation layer and the fourth insulation layer within the sixty-ninth via V69 are etched away to expose a surface of the second plate of the fifth capacitor, and the sixty-ninth via V69 is configured such that the second electrode of the ninth transistor (also the second electrode of the tenth transistor) subsequent-formed is connected with the second plate of the fifth capacitor through the sixty-ninth via V69.

In an exemplary implementation, as shown in FIG. 21, the orthogonal projection of the seventieth via V70 on the base substrate is within the range of the orthogonal projection of the fourth connection line on the base substrate. The third insulation layer and the fourth insulation layer within the seventieth via V70 are etched away to expose the surface of the fourth connection line, and the seventieth via V70 is configured such that the second electrode of the ninth transistor (also the second electrode of the tenth transistor) and the eleventh connection line formed subsequently are connected with the fourth connection line through the seventieth via V70.

In an exemplary implementation, as shown in FIG. 21, an orthogonal projection of the seventy-first via V71 on the base substrate is within a range of an orthogonal projection of the fifth connection line on the base substrate. The third insulation layer and the fourth insulation layer within the seventy-first via V71 are etched away to expose a surface of the fifth connection line, and the seventy-first via V71 is configured such that the second electrode of the ninth transistor (also the second electrode of the tenth transistor) and the ninth connection line formed subsequently are connected with the fifth connection line through the seventy-first via V71.

In an exemplary implementation, as shown in FIG. 21, an orthographic projection of the seventy-second via V72 on the base substrate is within a range of an orthographic projection of the sixth connection line on the base substrate. The seventy-second via V72 exposes a surface of the sixth connection line, and the seventy-second via V72 is configured such that the second electrode of the seventeenth transistor (also the second electrode of the nineteenth transistor and the second electrode of the twenty-fourth transistor) subsequently formed is connected with the sixth connection line through the seventy-second via V72.

Figure 22:
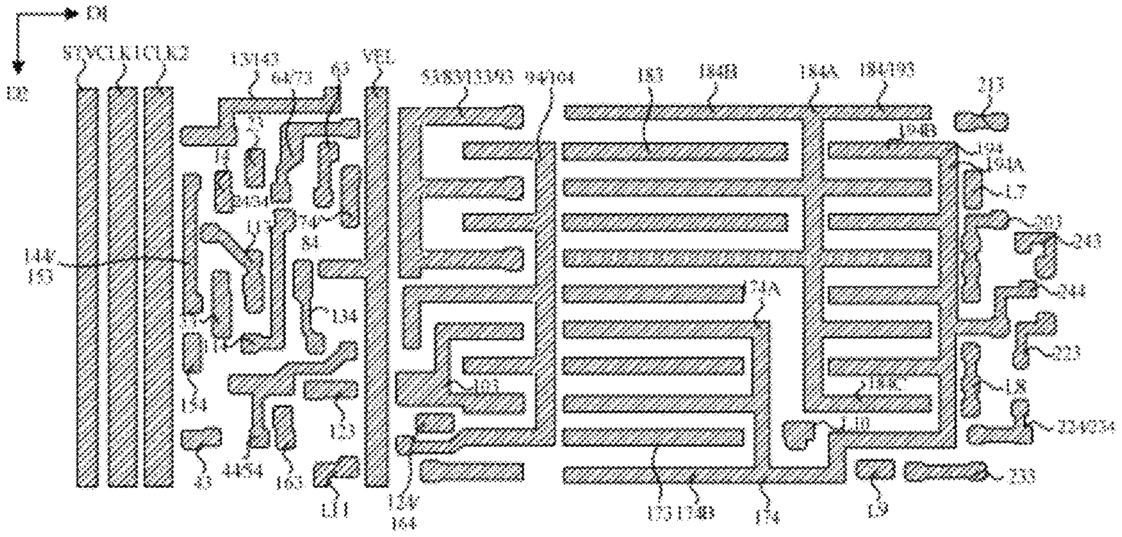
FIG. 22 is a schematic diagram of a pattern of a fourth conductive layer in FIG. 9.
Figure 23:
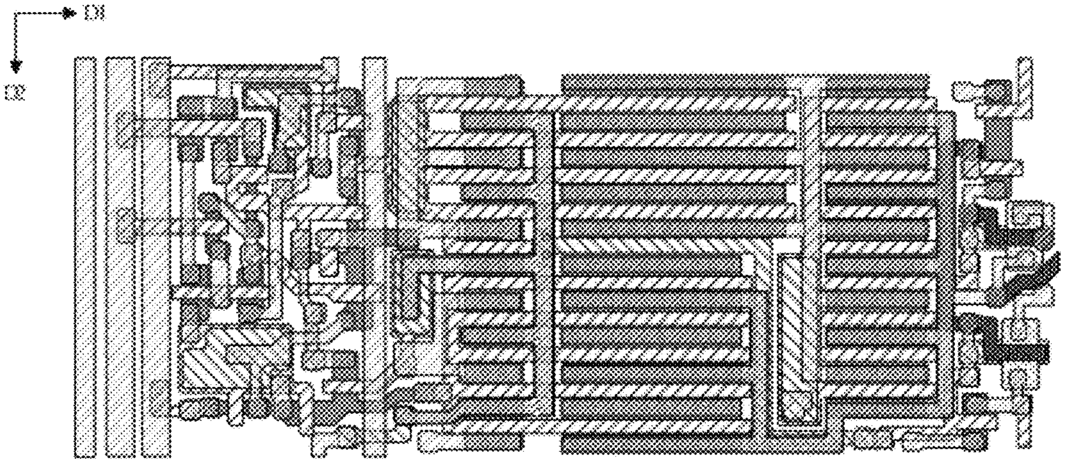
FIG. 23 is a schematic diagram after a pattern of a fourth conductive layer is formed in FIG. 9.

(7) Forming a pattern of a fourth conductive layer. In an exemplary implementation, forming a pattern of a fourth conductive layer may include: depositing a fourth conductive thin film on the base substrate on which the aforementioned patterns are formed, patterning the fourth conductive thin film by using a patterning process to form a fourth conductive layer disposed on the fifth insulation layer. As shown in FIG. 22 and FIG. 23, FIG. 22 is a schematic diagram of the pattern of the fourth conductive layer in FIG. 9, and FIG. 23 is a schematic diagram of the pattern of the fourth conductive layer formed in FIG. 9. In an exemplary implementation, the fourth conductive layer may be referred to as a first source drain metal (SD1) layer.

In an exemplary implementation, as shown in FIGS. 22 and 23, the pattern of the fourth conductive layer may at least include: an initial signal line STV, a first clock signal line CLK1, a second clock signal line CLK2, a third power supply line VEL and a first electrode 13 and a second electrode 14 of the first transistor to a first electrode 193 and a second electrode 194 of the nineteenth transistor, a first electrode 203 of the twentieth transistor, a first electrode 213 of the twenty-first transistor, a first electrode 222 and a second electrode 224 of the twenty-second transistor to a first electrode 243 and a second electrode 244 of the twenty-fourth transistor, and a seventh connection line L7 to a twelfth connection line L12 located in the shift register of each stage.

In an exemplary implementation, as shown in FIGS. 22 and 23, the first electrode 13 of the first transistor and the first electrode 143 of the fourteenth transistor form an integrated structure. The first electrode 13 of the first transistor (also the first electrode 143 of the fourteenth transistor) has a bend line shape and extends at least partially along the first direction D1. The first electrode 13 of the first transistor (also the first electrode 143 of the fourteenth transistor) is connected with the first region of the active pattern of the first transistor through a first via and to the first region of the active pattern of the fourteenth transistor through a twenty-fourth via.

In an exemplary implementation, as shown in FIGS. 22 and 23, the second electrode 14 of the first transistor is individually provided. The second electrode 14 of the first transistor may have a strip shape and extend along the second direction D2. The second electrode 14 of the first transistor is connected with the second region of the active pattern of the first transistor through the second via, and is connected with the gate electrode of the second transistor (also the gate electrode of the eighth transistor) through the forty-fourth via.

In an exemplary implementation, as shown in FIGS. 22 and 23, the first electrode 23 of the second transistor is individually provided. The first electrode 23 of the second transistor may have a strip shape and extend along the second direction D2. The first electrode 23 of the second transistor is connected with the first region of the active pattern of the second transistor through the third via, and is connected with the gate electrode of the first transistor (also the gate electrode of the fourteenth transistor) through a forty-third via.

In an exemplary implementation, as shown in FIGS. 22 and 23, the second electrode 24 of the second transistor, the second electrode 34 of the third transistor, and the first electrode 113 of the eleventh transistor form an integrated structure. The integrated structure of the second electrode 24 of the second transistor, the second electrode 34 of the third transistor, and the first electrode 113 of the eleventh transistor has a bend line shape and extends at least partially along the second direction D2. The second electrode 24 of the second transistor (also the second electrode 34 of the third transistor and the first electrode 113 of the eleventh transistor) is connected with the second region of the active pattern of the second transistor through the fourth via, and is connected with the second region of the active pattern of the third transistor through the sixth via, and is connected with the first region of the active pattern of the eleventh transistor through the nineteenth via, and is connected with the gate electrode of the fifth transistor through the forty-seventh via.

In an exemplary implementation, as shown in FIGS. 22 and 23, the first electrode 33 of the third transistor is individually provided. The first electrode 33 of the third transistor has a strip shape and extends along the second direction D2. The first electrode 33 of the third transistor is connected with the first region of the active pattern of the third transistor through the fifth via, and is connected with the gate electrode of the eleventh transistor (also the gate electrode of the fifteenth transistor) through the fifty-second via.

In an exemplary implementation, as shown in FIGS. 22 and 23, the first electrode 43 of the fourth transistor is individually provided. The first electrode 43 of the fourth transistor has a strip shape and extends at least partially along the first direction D1. The first electrode 43 of the fourth transistor is connected with the first region of the active pattern of the fourth transistor through the seventh via, and is connected with the first connection line through the sixty-second via.

In an exemplary implementation, as shown in FIGS. 22 and 23, the second electrode 44 of the fourth transistor and the second electrode 54 of the fifth transistor are disposed in an integrated structure provided separately. The integrated structure of the second electrode 44 of the fourth transistor and the second electrode 54 of the fifth transistor has a "⌈" shaped. The second electrode 44 of the fourth transistor (also the second electrode 54 of the fifth transistor) is connected with the second region of the active pattern of the fourth transistor through the eighth via, and connected with the second region of the active pattern of the fifth transistor through the tenth via, and connected with the second plate of the third capacitor through the sixty-seventh via.

In an exemplary implementation, as shown in FIGS. 22 and 23, the first electrode 53 of the fifth transistor, the first electrode 83 of the eighth transistor, the first electrode 93 of the ninth transistor, and the first electrode 133 of the thirteenth transistor form an integrated structure, and the integrated structure of the first electrode 53 of the fifth transistor, the first electrode 83 of the eighth transistor, the first electrode 93 of the ninth transistor, and the first electrode 133 of the thirteenth transistor has a "E" shape. The first electrode 53 of the fifth transistor (also the first electrode 83 of the eighth transistor, the first electrode 83 of the ninth transistor and the first electrode 133 of the thirteenth transistor) is connected with the first region of the active pattern of the fifth transistor (also the first region of the active pattern of the eighth transistor and the first region of the active pattern of the thirteenth transistor) through the ninth via, and is connected with the first region of the active pattern of the ninth transistor through the sixteenth via, and is connected with the second plate of the second capacitor through the sixty-sixth via.

In an exemplary implementation, as shown in FIGS. 22 and 23, the first electrode 63 of the sixth transistor is individually provided. The first electrode 63 of the sixth transistor has an "I" shape. The first electrode 63 of the sixth transistor is connected with the first region of the active pattern of the sixth transistor through the eleventh via, and is connected with the gate electrode of the seventh transistor through the forty-ninth via.

In an exemplary implementation, as shown in FIGS. 22 and 23, the second electrode 64 of the sixth transistor and the first electrode 73 of the seventh transistor form an integrated structure. The integrated structure of the second electrode 64 of the sixth transistor and the first electrode 73 of the seventh transistor has a "⌈" shape. The second electrode 64 of the sixth transistor (also the first electrode 73 of the seventh transistor) is connected with the second region of the active pattern of the sixth transistor through the twelfth via, and is connected with the first region of the active pattern of the seventh transistor through a thirteenth via, and is connected with the second plate of the first capacitor through the sixty-fifth via.

In an exemplary implementation, as shown in FIGS. 22 and 23, the second electrode 74 of the seventh transistor and the second electrode 84 of the eighth transistor form an integrated structure. The integrated structure of the second electrode 74 of the seventh transistor and the second electrode 84 of the eighth transistor has a strip shape and extends along the first direction D1. The second electrode 74 of the seventh transistor (also the second electrode 84 of the eighth transistor) is connected with the second region of the active pattern of the seventh transistor through the fourteenth via, and is connected with the second region of the active pattern of the eighth transistor through the fifteenth transistor, and is connected with the gate electrode of the ninth transistor (also the gate electrode of the eighteenth transistor and the first plate of the second capacitor) through the fiftieth via.

In an exemplary implementation, as shown in FIGS. 22 and 23, the second electrode 94 of the ninth transistor and the first electrode 104 of the tenth transistor form an integrated structure. The integrated structure of the second electrode 94 of the ninth transistor and the first electrode 104 of the tenth transistor has a comb-shaped structure, and the comb teeth are located on a side of the comb back away from the display region. The second electrode 94 of the ninth transistor (also the first electrode 104 of the tenth transistor) is connected with the second region of the active pattern of the ninth transistor (also the second region of the active pattern of the tenth transistor) through the seventeenth via, and is connected with the second plate of the fifth capacitor through the sixty-ninth via, and is connected with the fourth connection line through the seventieth via, and is connected with the fifth connection line through the seventy-first via.

In an exemplary implementation, as shown in FIGS. 22 and 23, the first electrode 103 of the tenth transistor may be individually provided. The first electrode 103 of the sixth transistor has a "[" shape. The first electrode 103 of the tenth transistor is connected with the first region of the active pattern of the tenth transistor through the eighteenth via, and is connected with the gate electrode of the twelfth transistor (also the first plate of the fifth capacitor) through the fifty-third via.

In an exemplary implementation, as shown in FIGS. 22 and 23, the second electrode 114 of the eleventh transistor may be individually provided. The second electrode 114 of the eleventh transistor has a bend line shape and extends at least partially along the second direction D2. The second electrode 114 of the eleventh transistor is connected with the second region of the active pattern of the eleventh transistor through the twentieth via, and is connected with the gate electrode of the sixth transistor (the first plate of the first capacitor) through the forty-eighth via.

In an exemplary implementation, as shown in FIGS. 22 and 23, the first electrode 123 of the twelfth transistor may be individually provided. The first electrode 123 of the twelfth transistor has a strip shape and extends along the first direction D1. The first electrode 123 of the twelfth transistor is connected with the first region of the active pattern of the twelfth transistor through the twenty-first via, and is connected with the second connection line through the sixty-third via.

In an exemplary implementation, as shown in FIGS. 22 and 23, the second electrode 124 of the twelfth transistor and the first electrode 164 of the sixteenth transistor form an integrated structure. The integrated structure of the second electrode 124 of the twelfth transistor and the first electrode 164 of the sixteenth transistor has a strip shape and extends along the first direction D1. The second electrode 124 of the twelfth transistor (also the first electrode 164 of the sixteenth transistor) is connected with the second region of the active pattern of the twelfth transistor (also the second region of the active pattern of the sixteenth transistor) through the twenty-second via, and is connected with the gate electrode of the tenth transistor (also the gate electrode of the seventeenth transistor) through the fifty-first via.

In an exemplary implementation, as shown in FIGS. 22 and 23, the second electrode 134 of the thirteenth transistor may be individually provided. The second electrode 134 of the thirteenth transistor has a strip shape and extends along the second direction D2. The second electrode 134 of the thirteenth transistor is connected with the second region of the active pattern of the thirteenth transistor through the twenty-third via, and is connected with the gate electrode of the second transistor (also the gate electrode of the eighth transistor) through the forty-fourth via, and is connected with the second connection line through the sixty-third via.

In an exemplary implementation, as shown in FIGS. 22 and 23, the second electrode 144 of the fourteenth transistor and the first electrode 153 of the fifteenth transistor form an integrated structure. The integrated structure of the second electrode 144 of the fourteenth transistor and the first electrode 153 of the fifteenth transistor has a strip shape and extends along the second direction D2. The second electrode 144 of the fourteenth transistor (also the first electrode 153 of the fifteenth transistor) is connected with the second region of the active pattern of the fourteenth transistor through the twenty-fifth via, and is connected with the first region of the active pattern of the fifteenth transistor through the twenty-sixth via.

In an exemplary implementation, as shown in FIGS. 22 and 23, the second electrode 154 of the fifteenth transistor may be individually provided. The second electrode 154 of the fifteenth transistor has a strip shape and extends along the second direction D2. The second electrode 154 of the fifteenth transistor is connected with the second region of the active pattern of the fifteenth transistor through the twenty-seventh via, and is connected with the gate electrode of the fourth transistor (also the gate electrode of the sixteenth transistor and the first plate of the third capacitor) through the forty-sixth via.

In an exemplary implementation, as shown in FIGS. 22 and 23, the first electrode 163 of the sixteenth transistor may be individually provided. The first electrode 163 of the sixteenth transistor has a strip shape and extends along the first direction D1. The first electrode 163 of the sixteenth transistor is connected with the first region of the active pattern of the sixteenth transistor through the twenty-eighth via, and is connected with the gate electrode of the fourth transistor (also the gate electrode of the sixteenth transistor and the first plate of the third capacitor) through the forty-sixth via.

In an exemplary implementation, as shown in FIGS. 22 and 23, the first electrode 173 of the seventeenth transistor may be individually provided. The first electrode 173 of the seventeenth transistor has a strip shape and extends along the first direction D1, the number of the first electrodes 173 of the seventeenth transistor may be a plurality, and the plurality of the first electrodes 173 of the seventeenth transistors are arranged along the second direction D2. The first electrode 173 of the seventeenth transistor is connected with the first region of the active pattern of the seventeenth transistor through the twenty-ninth via.

In an exemplary implementation, as shown in FIGS. 22 and 23, the second electrode 174 of the seventeenth transistor, the second electrode 194 of the nineteenth transistor, and the second electrode 244 of the twenty-fourth transistor form an integrated structure. The second electrode 174 of the seventeenth transistor includes a fourth connection section 174A and a plurality of fourth branch sections 174B, the plurality of fourth branch sections 174B are located on a side of the fourth connection section 174A away from the display region. The fourth connection section 174A has a strip shape and extends along the second direction D2, the fourth branch section 174B has a strip shape and extends along the first direction D1, and the plurality of fourth branch sections 174B are arranged along the second direction D2. The second electrode 174 of the seventeenth transistor has a comb-shaped structure, the fourth connection section 174A corresponds to a comb back, and the plurality of fourth branch sections 174B correspond to comb teeth. The plurality of fourth branch sections 174B are interspersed with the plurality of the first electrodes 173 of the seventeenth transistor. The second electrode 194 of the nineteenth transistor includes a fifth connection section 194A and a plurality of fifth branch sections 194B. The plurality of fifth branch sections 194B are located on a side of the fifth connection section 194A away from the display region, the fifth connection section 194A has a strip shape and extends along the second direction D2, the fifth branch section 194B has a strip shape and extends along the first direction D1, the plurality of fifth branch sections 194B are arranged along the second direction D2, and the fourth connection section 174A is connected with one of the fifth branch sections 194B. The second electrode 194 of the nineteenth transistor has a comb-shaped structure, the fifth connection section 194A corresponds to a comb back, and the plurality of fifth branch sections 194B correspond to comb teeth. The second electrode 244 of the twenty-fourth transistor is located on a side of the fifth connection section 194A close to the display region, and the second electrode 244 of the twenty-fourth transistor has a bend line shape and extends at least partially along the first direction D1. The second electrode 174 of the seventeenth transistor (also the second electrode 194 of the nineteenth transistor and the second electrode 244 of the twenty-fourth transistor) is connected with the second region of the active pattern of the seventeenth transistor through the thirtieth via, and is connected with the second region of the active pattern of the nineteenth transistor through the thirty-fourth via, and is connected with the second region of the active pattern of the twenty-fourth transistor through the forty-second via, and is connected with the sixth connection line through the seventy-second via.

In an exemplary implementation, as shown in FIGS. 22 and 23, the first electrode 183 of the eighteenth transistor may be individually provided. The first electrode 183 of the eighteenth transistor has a strip shape and extends along the first direction D1, the number of the first electrodes 183 of the eighteenth transistor may be a plurality, and the plurality of the first electrodes 183 of the eighteenth transistor are arranged along the second direction D2. The first electrode 183 of the eighteenth transistor is connected with the first region of the active pattern of the eighteenth transistor through the thirty-first via.

In an exemplary implementation, as shown in FIGS. 22 and 23, the second electrode 184 of the eighteenth transistor and the first electrode 193 of the nineteenth transistor form an integrated structure. The integrated structure of the second electrode 184 of the eighteenth transistor and the first electrode 193 of the nineteenth transistor includes: a sixth connection section 184A, a plurality of sixth branch sections 184B, and a plurality of seventh branch sections 184C. The plurality of sixth branch sections 184B are located on a side of the sixth connection section 184A away from the display region, and the plurality of seventh branch sections 184C are located on a side of the sixth connection section 184A close to the display region. The plurality of sixth branch sections 184B and the plurality of seventh branch sections 184C are connected with the sixth connecting section 184A, respectively. The sixth connection section 184A has a strip shape and extends along the second direction D2, the sixth branch section 184B has a strip shape and extends along the first direction D1, the plurality of sixth branch sections 184B are arranged along the second direction D2, the plurality of seventh branch sections 184C have a strip shape and extend along the first direction D1, and the plurality of seventh branch sections 184C are arranged along the second direction D2. The plurality of sixth branch sections 184B are interspersed with the plurality of the first electrodes 183 of the eighteenth transistor. The plurality of seventh branch sections 184C are interspersed with the plurality of fifth branch sections 194B. The second electrode 184 of the eighteenth transistor (also the first electrode 193 of the nineteenth transistor) is connected with the second electrode of the active pattern of the eighteenth transistor through the thirty-second via, and is connected with the second region of the active pattern of the nineteenth transistor through the thirty-third via.

In an exemplary implementation, as shown in FIGS. 22 and 23, the first electrode 203 of the twentieth transistor is individually provided. The shape of the first electrode 203 of the twentieth transistor may have a "⌈" shape. The first electrode 203 of the twentieth transistor is connected with the first region of the active pattern of the twentieth transistor through the thirty-fifth via, and is connected with the gate electrode of the nineteenth transistor through the fifty-fifth via, and is connected with the first gate electrode of the twenty-fourth transistor through the sixtieth via, and is connected with the second gate electrode of the twenty-fourth transistor through the sixty-first via.

In an exemplary implementation, as shown in FIGS. 22 and 23, the first electrode 213 of the twenty-first transistor is individually provided. The first electrode 213 of the twenty-first transistor has a strip shape and extends along the first direction D1. The first electrode 213 of the twenty-first transistor is connected with the first region of the active pattern of the twenty-first transistor through the thirty-sixth via.

In an exemplary implementation, as shown in FIGS. 22 and 23, the first electrode 223 of the twenty-second transistor is individually provided. The first electrode 223 of the twenty-second transistor has a "⌈" shape. The first electrode 223 of the twenty-second transistor is connected with the first region of the active pattern of the twenty-second transistor through the thirty-seven via.

In an exemplary implementation, as shown in FIGS. 22 and 23, the second electrode 224 of the twenty-second transistor and the second electrode 234 of the twenty-third transistor form an integrated structure. The integrated structure of the second electrode 224 of the twenty-second transistor and the second electrode 234 of the twenty-third transistor has a "⌉" shape. The second electrode 224 of the twenty-second transistor (also the second electrode 234 of the twenty-third transistor) is connected with the second region of the active pattern of the twenty-second transistor through the thirty-eighth via, and is connected with the second region of the active pattern of the twenty-third transistor through the fortieth via, and is connected with the third connection line through the sixty-fourth via.

In an exemplary implementation, as shown in FIGS. 22 and 23, the first electrode 233 of the twenty-third transistor is individually provided. The first electrode 233 of the twenty-third transistor has a strip shape and extends along the first direction D1. The first electrode 233 of the twenty-third transistor is connected with the first region of the active pattern of the twenty-third transistor through the thirty-ninth via.

In an exemplary implementation, as shown in FIGS. 22 and 23, the first electrode 243 of the twenty-fourth transistor is individually provided. The first electrode 243 of the twenty-fourth transistor has a "]" shape. The first electrode 243 of the twenty-fourth transistor is connected with the first region of the active pattern of the twenty-fourth transistor through the forty-first via.

In an exemplary implementation, as shown in FIGS. 22 and 23, the seventh connection line L7 is individually provided. The fifth connection line L7 has a strip shape and extends along the second direction D2. The seventh connection line L7 is electrically connected with the second gate electrode of the twenty-second transistor through the fifty-eighth via, and is electrically connected with the gate electrode of the twentieth transistor through the fifty-sixth via.

In an exemplary implementation, as shown in FIGS. 22 and 23, the eighth connection line L8 is individually provided. The eighth connection line L8 has a strip shape and extends along the second direction D2. The eighth connection line L8 is electrically connected with the second gate electrode of the twenty-second transistor through the fifty-eighth via, and is electrically connected with the first gate electrode of the twenty-second transistor through the fifty-seventh via, and is electrically connected with the gate electrode of the twenty-third transistor through the fifty-ninth via.

In an exemplary implementation, as shown in FIGS. 22 and 23, the ninth connection line L9 is individually provided. The ninth connection line L9 has a strip shape and extends along the first direction D1. The ninth connection line L9 is electrically connected with the gate electrode of the twenty-third transistor through the fifty-ninth via, and is electrically connected with the fifth connection line through the seventy-first via.

In an exemplary implementation, as shown in FIGS. 22 and 23, the tenth connection line L10 is individually provided. The tenth connection line L10 has a block shape. The tenth connection line L10 is electrically connected with the gate electrode of the twenty-third transistor through the fifty-ninth via, and is electrically connected with the fifth connection line through the seventy-first via.

In an exemplary implementation, as shown in FIGS. 22 and 23, the eleventh connection line L11 is individually provided. The eleventh connection line L11 has a strip shape and extends along the first direction D1. The eleventh connection line L11 is electrically connected with the fourth connection line through the seventieth via.

In an exemplary implementation, as shown in FIGS. 22 and 23, the initial signal line STV, the first clock signal line CLK1, the second clock signal line CLK2, and the third power supply line VEL are arranged sequentially along a direction close to the display region. The initial signal line STV, the first clock signal line CLK1, and the second clock signal line CLK2 are located on a side of the first electrodes and the second electrodes of all transistors in the shift register away from the display region, and an orthographic projection of the third power supply line VEL on the base substrate is at least partially overlapped with a portion of any one of the fifth transistor, the eighth transistor, the twelfth transistor, the thirteenth transistor, and the sixteenth transistor.

In an exemplary implementation, as shown in FIGS. 22 and 23, the shape of the initial signal line STV may be a line shape of which a main body portion extends along the second direction D2, and the third power supply line VEL is connected with the gate electrode of the thirteenth transistor through the fifty-fourth via.

In an exemplary implementation, as shown in FIGS. 22 and 23, the shape of any one of the first clock signal line CLK1 and the second clock signal line CLK2 may be a line shape of which a main body portion extends along the second direction D2. The first clock signal line CLK1 is connected with the gate electrode of the first transistor (also the gate electrode of the fourteenth transistor) through the forty-third via, and is connected with the gate electrode of the third transistor through the forty-fifth via. The second clock signal line CLK2 is connected with the gate electrode of the seventh transistor through the forty-ninth via, and is connected with the first connection line through the sixty-second via. Alternatively, the first clock signal line CLK1 is connected with the gate electrode of the seventh transistor through the forty-ninth via, and is connected with the first connection line through the sixty-second via, and the second clock signal line CLK2 is connected with the gate electrode of the first transistor (also the gate electrode of the fourteenth transistor) through the forty-third via, and is connected with the gate electrode of the third transistor through the forty-fifth via. FIG. 23 illustrates an example in which the first clock signal line CLK1 is connected with the gate electrode of the first transistor (also the gate electrode of the fourteenth transistor) through the forty-third via, and is connected with the gate electrode of the third transistor through the forty-fifth via, and the second clock signal line CLK2 is connected with the gate electrode of the seventh transistor through the forty-ninth via, and is connected with the first connection line through the sixty-second via.

In an exemplary implementation, the second clock signal line is connected with the first electrode of the fourth transistor through the first connection line. The first electrode of the twelfth transistor is connected with the second electrode of the thirteenth transistor through the second connection line. The gate electrode of the twentieth transistor is connected with the gate electrode of the twenty-second transistor through the seventh connection line. The first gate electrode and the second gate electrode of the twenty-second transistor are connected with the gate electrode of the twenty-third transistor through the eighth connection line. The gate electrode of the twenty-third transistor is connected with the second electrode of the ninth transistor (also the second electrode of the tenth transistor) through the ninth connection line and the fifth connection line.

In an exemplary implementation, the arrangement of the first connection line to the eleventh connection line functions as connection electrodes, so that the via depth in the display substrate can be reduced, and the reliability of the display substrate can be improved.

In an exemplary implementation, the initial signal line STV, the first clock signal line CLK1, the second clock signal line CLK2, and the third power supply line VEL may be in a design of equal width, or may be in a design of non-equal widths, may be straight lines, or may be bend lines, which may not only facilitate the layout of the shift register, but also reduce parasitic capacitor between signal lines, which is not limited here in the present disclosure.

(8) Forming a pattern of a first planarization layer. In an exemplary implementation, forming a pattern of a first planarization layer may include: depositing a sixth insulation thin film on the base substrate on which the aforementioned patterns are formed, coating a first planarization thin film, and patterning the sixth insulation thin film and the first planarization thin film by a patterning process to form a pattern of a sixth insulation layer and a pattern of a first planarization layer covering the aforementioned structure, wherein the sixth insulation layer and the first planarization layer are provided with a plurality of via patterns, as shown in FIG. 24, which is a schematic diagram after the pattern of the first planarization layer is formed in FIG. 9.

Figure 24:
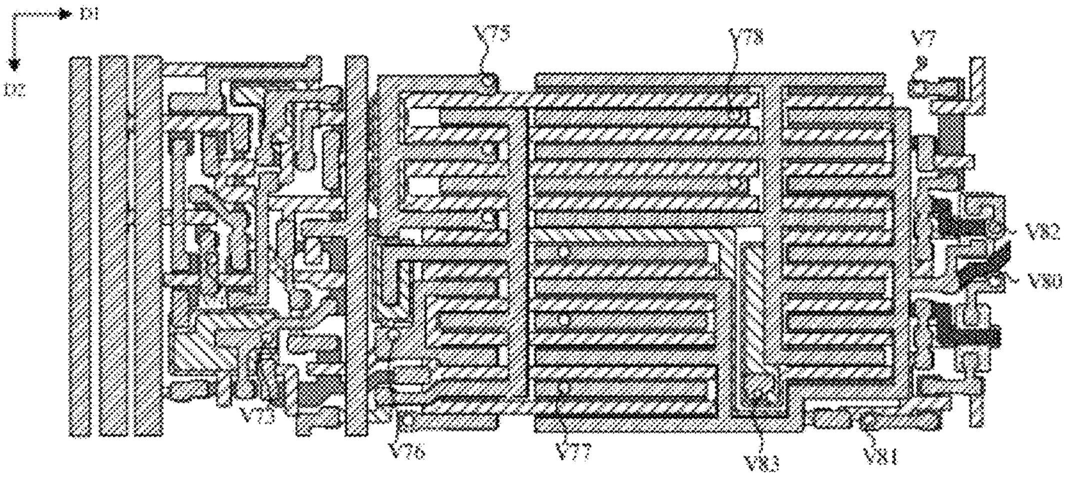
FIG. 24 is a schematic diagram after a pattern of a first planarization layer is formed in FIG. 9.

In an exemplary implementation, as shown in FIG. 24, the pattern of the sixth insulation layer and the pattern of the first planarization layer may at least include a seventy-third via V73 to an eighty-third via V83 located in the shift register of each stage.

In an exemplary implementation, as shown in FIG. 24, an orthographic projection of the seventy-third via V73 on the base substrate is within a range of an orthographic projection on the base substrate of the second electrode of the fourth transistor (also the second electrode of the fifth transistor). The seventy-third via V73 exposes a surface of the second electrode of the fourth transistor (also the second electrode of the fifth transistor), and the seventy-third via V73 is configured such that a thirteenth signal line subsequently formed is connected with the second electrode of the fourth transistor (also the second electrode of the fifth transistor) through the seventy-third via V73.

In an exemplary implementation, as shown in FIG. 24, an orthographic projection of the seventy-fourth via V74 on the base substrate is within a range of an orthographic projection of the first electrode of the third transistor on the base substrate. The seventy-fourth via V74 exposes a surface of the first electrode of the third transistor, and the seventy-fourth via V74 is configured such that the first one of the second power supply lines formed subsequently is connected with the first electrode of the third transistor through the seventy-fourth via V74.

In an exemplary implementation, as shown in FIG. 24, an orthographic projection of the seventy-fifth via V75 on the base substrate is located within a range of an orthographic projection of the first electrode of the fifth transistor (also the first electrode of the eighth transistor, the first electrode of the ninth transistor and the first electrode of the thirteenth transistor) on the base substrate. The seventy-fifth via V75 exposes the surface of the first electrode of the fifth transistor (also the first electrode of the eighth transistor, the first electrode of the ninth transistor and the first electrode of the thirteenth transistor), and the seventy-fifth via V75 is configured such that a first one of the first power supply lines formed subsequently is connected with the first electrode of the fifth transistor (also the first electrode of the eighth transistor, the first electrode of the ninth transistor and the first electrode of the thirteenth transistor) through the seventy-fifth via V75.

In an exemplary implementation, as shown in FIG. 24, an orthographic projection of the seventy-sixth via V76 on the base substrate is within a range of an orthographic projection of the first electrode of the tenth transistor on the base substrate, the seventy-sixth via V76 exposes a surface of the first electrode of the tenth transistor, and the seventy-sixth via V76 is configured such that a second one of the second power supply lines formed subsequently is connected with the first electrode of the tenth transistor through the seventy-sixth via V76.

In an exemplary implementation, as shown in FIG. 24, an orthographic projection of the seventy-seventh via V77 on the base substrate is within a range of an orthographic projection of the first electrode of the seventeenth transistor on the base substrate. The seventy-seventh via V77 exposes a surface of the first electrode of the seventeenth transistor, and the seventy-seventh via V77 is configured such that a third one of the second power supply lines formed subsequently is connected with the first electrode of the seventeenth transistor through the seventy-seventh via V77.

In an exemplary implementation, as shown in FIG. 24, an orthographic projection of the seventy-eighth via V78 on the base substrate is within a range of an orthographic projection of the first electrode of the eighteenth transistor on the base substrate. The seventy-eighth via V78 exposes a surface of the first electrode of the eighteenth transistor, and the seventy-eighth via V78 is configured such that a second one of the first power supply lines formed subsequently is connected with the first electrode of the eighteenth transistor through the seventy-eighth via V78.

In an exemplary implementation, as shown in FIG. 24, an orthographic projection of the seventy-ninth via V79 on the base substrate is within a range of an orthographic projection of the first electrode of the twenty-first transistor on the base substrate. The seventy-ninth via V79 exposes a surface of the first electrode of the twenty-first transistor, and the seventy-ninth via V79 is configured such that a masking signal line subsequently formed is connected with the first electrode of the twenty-first transistor through seventy-ninth via V79.

In an exemplary implementation, as shown in FIG. 24, an orthographic projection of the eightieth via V80 on the base substrate is within a range of an orthographic projection of the first electrode of the twenty-second transistor on the base substrate. The eightieth via V80 exposes a surface of the first electrode of the twenty-second transistor, and the eightieth via V80 is configured such that a fourth one of the second power supply lines formed subsequently is connected with the first electrode of the twenty-second transistor through the eightieth via V80.

In an exemplary implementation, as shown in FIG. 24, an orthographic projection of the eighty-first via V81 is within a range of an orthographic projection of the first electrode of the twenty-third transistor on the base substrate. The eighty-first via V81 exposes a surface of the first electrode of the twenty-third transistor, and the eighty-first via V81 is configured such that a second one of the first power supply lines formed subsequently is connected with the first electrode of the twenty-third transistor through the eighty-first via V81.

In an exemplary implementation, as shown in FIG. 24, an orthographic projection of the eighty-second via V82 is within a range of an orthographic projection of the first electrode of the twenty-fourth transistor on the base substrate. The eighty-second via V82 exposes a surface of the first electrode of the twenty-fourth transistor, and the eighty-second via V82 is configured such that a fourth one of the second power supply lines formed subsequently is connected with the first electrode of the twenty-fourth transistor through the eighty-second via V82.

In an exemplary implementation, as shown in FIG. 24, an orthographic projection of the eighty-third via V83 on the base substrate is within a range of an orthographic projection of the tenth connection line on the base substrate. The eighty-third via V83 exposes a surface of the tenth connection line, and the eighty-third via V83 is configured such that a second one of the first power supply lines formed subsequently is connected with the tenth connection line through the eighty-third via V83.

Figure 25:
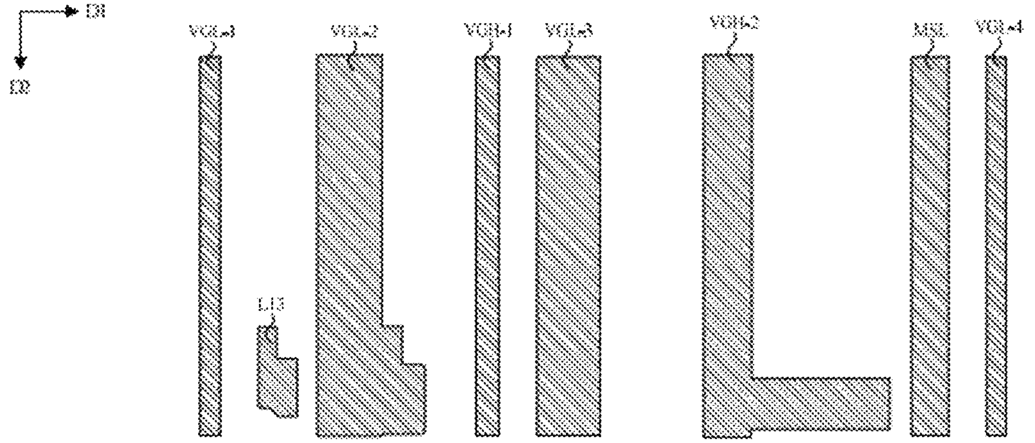
FIG. 25 is a schematic diagram of a pattern of a fifth conductive layer in FIG. 9.
Figure 26:
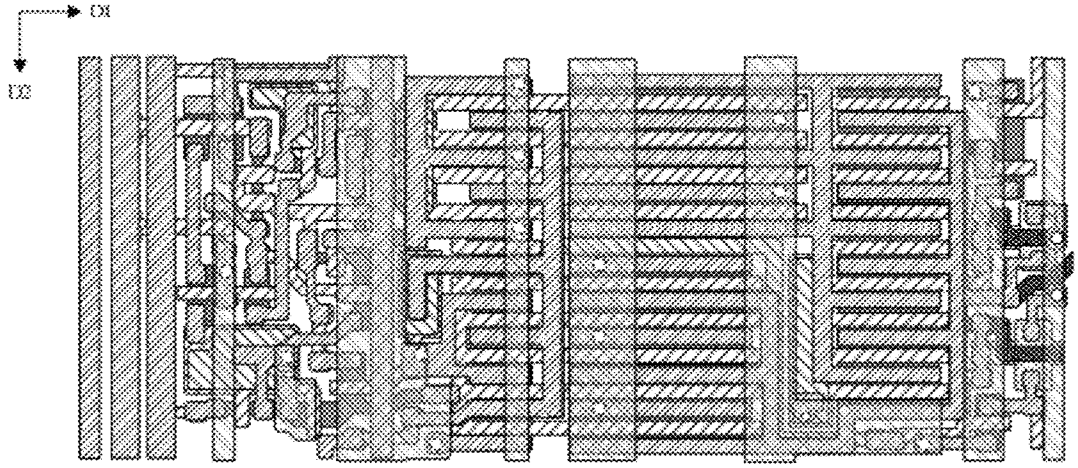
FIG. 26 is a schematic diagram after the pattern of the fifth conductive layer is formed in FIG. 9.

(9) Forming a pattern of a fifth conductive layer. In an exemplary implementation, forming a pattern of a fifth conductive layer may include: depositing a fifth conductive thin film on the base substrate on which the aforementioned patterns are formed, patterning the fifth conductive thin film by using a patterning process to form a fifth conductive layer disposed on the fifth insulation layer. As shown in FIGS. 25 and 26, FIG. 25 is a schematic diagram of the pattern of the fifth conductive layer in FIG. 9, and FIG. 26 is a schematic diagram after the pattern of the fifth conductive layer is formed in FIG. 9. In an exemplary implementation, the fifth conductive layer may be referred to as a second source drain metal (SD2) layer.

In an exemplary implementation, as shown in FIGS. 25 and 26, the pattern of the fifth conductive layer may include at least two first power supply lines, four second power supply lines, a masking signal line MSL, and a thirteenth connection line L13. The two first power supply lines include a first one of the first power supply lines VGH-1 and a second one of the first power supply lines VGH-2. The four second power supply lines include a first one of the second power supply lines VGL-1, a second one of the second power supply lines VGL-2, a third one of the second power supply lines VGL-3 and a fourth one of the second power supply lines VGL-4.

In an exemplary implementation, as shown in FIGS. 25 and 26, the first one of the second power supply lines VGL-1, the second one of the second power supply lines VGL-2, the first one of the first power supply lines VGH-1, the third one of the second power supply lines VGL-3, the second one of the first power supply lines VGH-2, the masking signal line MSL, and the fourth one of the second power supply lines VGL-4 are arranged sequentially along a direction close to the display region.

In an exemplary implementation, as shown in FIGS. 25 and 26, an orthographic projection of the second one of the second power supply lines VGL-2 on the base substrate is at least partially overlapped with an orthographic projection of the third power supply line on the base substrate.

In an exemplary implementation, as shown in FIGS. 25 and 26, an orthographic projection of the first one of the second power supply lines VGL-1 on the base substrate is located between an orthographic projection of the second clock signal line on the base substrate and an orthographic projection of the third power supply line on the base substrate.

In an exemplary implementation, as shown in FIGS. 25 and 26, orthographic projections of the first one of the first power supply lines VGH-1, the third one of the second power supply lines VGL-3, the second one of the first power supply lines VGH-2, the masking signal line MSL, and the fourth one of the second power supply lines VGL-4 on the base substrate are located on a side of an orthographic projection of the third power supply line on the base substrate close to the display region.

In an exemplary implementation, the thirteenth connection line L13 is located between the first one of the second power supply lines VGL-1 and the second one of the second power supply lines VGL-2. The thirteenth connection line L13 is connected with the second electrode of the fourth transistor (also the second electrode of the fifth transistor) through the seventy-third via.

In an exemplary implementation, as shown in FIGS. 25 and 26, the shape of the first one of the second power supply lines VGL-1 may be a line shape in which a main body portion extends along the second direction D2. The first one of the second power supply lines VGL-1 is connected with the first electrode of the third transistor through the seventy-fourth via.

In an exemplary implementation, as shown in FIGS. 25 and 26, the shape of the second one of the second power supply lines VGL-2 may be a line shape in which a main body portion extends along the second direction D2. The second one of the second power supply lines VGL-2 is connected with the first electrode of the tenth transistor through the seventy-sixth via.

In an exemplary implementation, as shown in FIGS. 25 and 26, the shape of the first one of the first power supply lines VGH-1 may be a line shape in which a main body portion extends along the second direction D2. The first one of the first power supply lines VGH-1 is connected with the first electrode of the fifth transistor (the first electrode of the eighth transistor, the first electrode of the ninth transistor, and the first electrode of the thirteenth transistor) through the seventy-fifth via.

In an exemplary implementation, as shown in FIGS. 25 and 26, the shape of the third one of the second power supply lines VGL-3 may be a line shape in which the main body portion extends along the second direction D2. The third one of the second power supply lines VGL-3 is connected with the first electrode of the seventeenth transistor through the seventy-seventh via.

In an exemplary implementation, as shown in FIGS. 25 and 26, the shape of the second one of the first power supply lines VGH-2 may be a line shape in which the main body portion extends along the second direction D2. The second one of the first power supply lines VGH-2 is connected with the first electrode of the eighteenth transistor through the seventy-eighth via, and is connected with the first electrode of the twenty-third transistor through the eighty-first via, and is connected with the tenth connection line through the eighty-third via.

In an exemplary implementation, as shown in FIGS. 25 and 26, the shape of the masking signal line MSL may be a line shape in which the main body portion extends along the second direction D2. The masking signal line MSL is connected with the first electrode of the twenty-first transistor through the seventy-ninth via.

In an exemplary implementation, as shown in FIGS. 25 and 26, the shape of the fourth one of the second power supply lines VGL-4 may be a line shape in which the main body portion extends along the second direction D2. The fourth one of the second power supply lines VGL-4 is connected with the first electrode of the twenty-second transistor through the eightieth via, and is connected with the first electrode of the twenty-fourth transistor through the eighty-second via.

In an exemplary implementation, the fourth one of the second power supply lines VGL-4 may be electrically connected with the adjacent drive circuit of the drive circuit where the shift register is located, so that the two drive circuits share one second power supply line, and the area occupied by the gate drive circuit can be reduced, thereby achieving a narrow bezel of the display substrate.

In an exemplary implementation, as shown in FIGS. 25 and 26, a line width of the first one of the second power supply lines VGL-1 is smaller than a line width of any one of the second one of the second power supply lines VGL-2 and the third one of the second power supply lines VGL-3.

In an exemplary implementation, as shown in FIGS. 25 and 26, a line width of the fourth one of the second power supply lines VGL-4 is smaller than the line width of any one of the second one of the second power supply lines VGL-2 and the third one of the second power supply lines VGL-3.

In an exemplary implementation, as shown in FIGS. 25 and 26, a line width of the first one of the first power supply lines VGH-1 is smaller than a line width of the second one of the first power supply lines VGH-2.

In an exemplary implementation, as shown in FIGS. 25 and 26, a line width of the masking signal line MSL is larger than the line width of any one of the first one of the second power supply lines VGL-1, the fourth one of the second power supply lines VGL-4, and the first one of the first power supply lines VGH-1, and smaller than the line width of the second one of the second power supply lines VGL-2, the line width of the third one of the second power supply lines VGL-3, and the line width of the second one of the first power supply lines VGH-2.

(10) Forming a second planarization layer. In an exemplary implementation, forming a pattern of a planarization layer may include: depositing a seventh insulation thin film on the base substrate on which the aforementioned patterns are formed, coating a second planarization thin film, and patterning the seventh insulation thin film and the second planarization thin film by a patterning process to form a pattern of a seventh insulation layer covering the aforementioned structure and a pattern of a second planarization layer covering the pattern of the seventh insulation layer.

So far, a drive circuit layer has been manufactured on the base substrate. In a plane parallel to the display substrate, the drive circuit layer may include a plurality of shift registers electrically connected with the initial signal line, the first clock signal line, the second clock signal line, the first power supply line, the second power supply line, the third power supply line and the masking signal line. In a plane perpendicular to the display substrate, the drive circuit layer may be disposed on the base substrate. The drive circuit layer may include a first semiconductor layer, a first insulation layer, a first conductive layer, a second insulation layer, a second conductive layer, a third insulation layer, a second semiconductor layer, a fourth insulation layer, a third conductive layer, a fifth insulation layer, a fourth conductive layer, a sixth insulation layer, a first planarization layer, a fifth conductive layer, a seventh insulation layer and a second planarization layer, which are arranged sequentially on a base substrate. The first semiconductor layer may at least include active patterns of the first transistor to the twenty-first transistor and an active pattern of the twenty-third transistor. The first conductive layer may at least include gate electrodes of the first transistor to the twenty-first transistor, a gate electrode of the twenty-third transistor and a first plate of the first capacitor to a first plate of the fifth capacitor. The second conductive layer may at least include a second plate of the first capacitor to a second plate of the fifth capacitor, a first gate electrode of the twenty-second transistor and a first gate electrode of the twenty-fourth transistor. The second semiconductor layer may at least include an active pattern of the twenty-second transistor and an active pattern of the twenty-fourth transistor. The third conductive layer may at least include a second gate electrode of the twenty-second transistor and a second gate electrode of the twenty-fourth transistor. The fourth conductive layer may at least include an initial signal line, a first clock signal line, a second clock signal line, a third power supply line, first electrodes and second electrodes of the plurality of transistors. The fifth conductive layer may at least include a first power supply line, a second power supply line, and a masking signal line.

In an exemplary implementation, the base substrate may be a rigid base substrate or a flexible base substrate, wherein the rigid base substrate may be, but is not limited to, one or more of glass and metal foil; the flexible base substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber.

In an exemplary implementation, the flexible base substrate may include a first flexible material layer, a first inorganic material layer, a semiconductor layer, a second flexible material layer, and a second inorganic material layer which are stacked. Materials of the first flexible material layer and the second flexible material layer may be Polyimide (PI), Polyethylene Terephthalate (PET), or a surface-treated polymer soft film, etc., and materials of the first inorganic material layer and the second inorganic material layer may be Silicon Nitride (SiNx), Silicon Oxide (SiOx), or the like, for improving water and oxygen resistance of the base substrate. The first inorganic material layer and the second inorganic material layer may also be referred to as barrier layers, and a material of the semiconductor layer may be amorphous silicon (a-si). In an exemplary implementation, taking a stacked structure of PI1/Barrier1/a-si/PI2/Barrier2 as an example, its preparation process may include: first coating a layer of polyimide on a glass carrier board, after the layer of polyimide is cured to form a film, a first flexible (PI1) layer is formed; then depositing a layer of barrier thin film on the first flexible layer to form a first barrier (Barrier 1) layer overlaying the first flexible layer; then depositing a layer of amorphous silicon thin film on the first barrier layer to form an amorphous silicon (a-si) layer overlaying the first barrier layer; then coating another layer of polyimide on the amorphous silicon layer, after this layer of polyimide is cured to form a film, a second flexible (PI2) layer is formed; and then depositing a layer of barrier thin film on the second flexible layer to form a second barrier (Barrier 2) layer overlaying the second flexible layer, so as to complete preparation of the base substrate.

In an exemplary implementation, the first semiconductor layer may be an amorphous silicon layer or a polysilicon layer.

In an exemplary implementation, the second semiconductor layer may be a metal oxide layer. Herein, the metal oxide layer may use an oxide including indium and tin, an oxide including tungsten and indium, an oxide including tungsten, indium and zinc, an oxide including titanium and indium, an oxide including titanium, indium and tin, an oxide including indium and zinc, an oxide including silicon, indium and tin, or an oxide including indium or gallium and zinc. The metal oxide layer may be a single layer, a double-layer, or a multi-layer.

In an exemplary implementation, the first conductive layer, the second conductive layer, the third conductive layer, the fourth conductive layer, and the fifth conductive layer may be made of a metal material, such as any one or more of Argentum (Ag), Copper (Cu), Aluminum (Al), and Molybdenum (Mo), or an alloy material of the aforementioned metals, such as an Aluminum Neodymium alloy (AlNd) or a Molybdenum Niobium alloy (MoNb), and may be of a single-layer structure or a multi-layer composite structure, such as Mo/Cu/Mo.

In an exemplary implementation, the first insulation layer, the second insulation layer, the third insulation layer, the fourth insulation layer, the fifth insulation layer, the sixth insulation layer and the seventh insulation layer may be made of any one or more of Silicon Oxide (SiOx), Silicon Nitride (SiNx), and Silicon Oxynitride (SiON), and may be a single layer, a multi-layer, or a composite layer. The first insulation layer, the second insulation layer and the third insulation layer may be referred to as Gate Insulation (GI) layers, the fourth insulation layer may be referred to as an Interlayer Dielectric (ILD) layer, and the fifth insulation layer may be referred to as a Passivation (PVX) layer.

In an exemplary implementation, the first planarization layer and the second planarization layer may be made of an organic material, such as resin or the like.

In an exemplary implementation, after preparation of the drive circuit layer is completed, a light emitting structure layer is prepared on the drive circuit layer, and a preparation process of the light emitting structure layer may include following operations.

An anode conductive thin film is deposited on the base substrate on which the aforementioned patterns are formed, the anode conductive thin film is patterned through a patterning process to form a pattern of the anode conductive layer arranged on the second planarization layer, a pixel definition thin film is deposited on the base substrate on which the aforementioned patterns are formed, the pixel definition thin film is patterned through a patterning process to form a pattern of a pixel definition layer exposing the pattern of the anode conductive layer, an organic light emitting material is coated on the base substrate on which the pattern of the pixel definition layer is formed, the organic light emitting material is patterned through a patterning process to form a pattern of an organic structure layer, a cathode conductive thin film is deposited on the base substrate on which the pattern of the organic material layer is formed, and the cathode conductive thin film is patterned through a patterning process to form the cathode conductive layer.

So far, the light emitting structure layer has been manufactured on the base substrate.

In an exemplary implementation, the anode conductive layer includes at least a plurality of anode patterns. The plurality of anode patterns may include an anode of a first light emitting device, an anode of a second light emitting device, an anode of a third light emitting device, and an anode of a fourth light emitting device, wherein the anode of the first light emitting device is located at a red sub-pixel emitting red light, the anode of the second light emitting device may be located at a blue sub-pixel emitting blue light, the anode of the third light emitting device may be located at a first green sub-pixel emitting green light, and the anode of the fourth light emitting device may be located at a second green sub-pixel emitting green light.

In an exemplary implementation, the anode of the first light emitting device and the anode of the second light emitting device may be alternately disposed along the first direction D1, and the anode of the third light emitting device and the anode of the fourth light emitting device may be alternately disposed along the first direction D1. Alternatively, the anode of the first light emitting device and the anode of the second light emitting device may be alternately arranged along the second direction D2, and the anode of the third light emitting device and the anode of the fourth light emitting device may be alternately arranged along the second direction D2.

In an exemplary implementation, four sub-pixels in one pixel unit may have the same or different anode shapes and areas.

In an exemplary implementation, the anode conductive layer may be of a single-layer structure, such as Indium Tin Oxide (ITO) or Indium Zinc Oxide (IZO), or may be of a multi-layer composite structure, such as ITO/Ag/ITO.

In an exemplary implementation, the organic structure layer may at least include: an organic light emitting layer of the light emitting device.

In an exemplary implementation, the cathode conductive layer may include, at least, cathodes of a plurality of light emitting devices.

In an exemplary implementation, the cathode layer may be made of a metal material, such as any one or more of argentum (Ag), copper (Cu), aluminum (Al), and molybdenum (Mo), or a alloy material of the above conductive metals, such as an Aluminum Neodymium alloy (AlNd) or a Molybdenum Niobium alloy (MoNb), and may have a single-layer structure or a multi-layer composite structure, such as Mo/Cu/Mo. Exemplarily, the fourth conductive layer may be of a three-layer stacked structure formed of titanium, aluminum, and titanium.

The display substrate according to the embodiment of the present disclosure may be applied to a display product with any resolution.

In an exemplary implementation, the subsequent preparation process may include forming an encapsulation structure layer on the cathode conductive layer, and the encapsulation structure layer may include a first encapsulation layer, a second encapsulation layer and a third encapsulation layer which are stacked. The first encapsulation layer and the third encapsulation layer may be made of an inorganic material, the second encapsulation layer may be made of an organic material, and the second encapsulation layer is arranged between the first encapsulation layer and the third encapsulation layer to ensure that external water vapor cannot enter the light emitting structure layer.

An embodiment of the present disclosure further provides a display apparatus, which may include: a display substrate.

The display substrate is the display substrate according to any of the aforementioned embodiments, and has similar implementation principles and implementation effects, which will not be repeated here.

In an exemplary implementation, the display apparatus may be any product or component with a display function such as a wearable device, a mobile phone, a tablet computer, a television, a display, a laptop computer, a digital photo frame, and a navigator.

The drawings of the embodiments of the present disclosure only involve structures involved in the embodiments of the present disclosure, and other structures may refer to a general design.

For the sake of clarity, a thickness and size of a layer or a micro structure are enlarged in the accompanying drawings used for describing the embodiments of the present disclosure. It may be understood that when an element such as a layer, film, region, or substrate is described as being "on" or "under" another element, the element may be "directly" located "on" or "under" the another element, or there may be an intermediate element.

Although the implementations of the present disclosure are disclosed above, the contents are only implementations used for ease of understanding of the present disclosure, but not intended to limit the present disclosure. Any of those skilled in the art of the present disclosure can make any modifications and variations in the implementation and details without departing from the spirit and scope of the present disclosure. However, the protection scope of the present disclosure should be subject to the scope defined by the appended claims.

The invention claimed is:

1. A display substrate, comprising a display region and a non-display region, wherein:

the display substrate comprises a pixel drive circuit located in the display region and a gate drive circuit group located in the non-display region; the gate drive circuit group at least comprises a first drive circuit, the first drive circuit is connected with the pixel drive circuit, and the first drive circuit comprises a plurality of cascaded shift registers; the shift register at least comprises a first output transistor, a second output transistor, a third output transistor, a fourth output transistor, a fifth output transistor, a cascaded signal output terminal, a drive signal output terminal, a first power supply terminal and a second power supply terminal; and the drive signal output terminal is electrically connected with the pixel drive circuit;

the first output transistor is electrically connected with the cascaded signal output terminal and the first power supply terminal, respectively; the second output transistor is connected with the cascaded signal output terminal and the second power supply terminal, respectively; the third output transistor is connected with the fifth output transistor and the first power supply terminal, respectively; the fourth output transistor is connected with the drive signal output terminal and the second power supply terminal, respectively; and the fifth output transistor is connected with the drive signal output terminal; and a gate electrode of the first output transistor and a gate electrode of the third output transistor form an integrated structure, and a gate electrode of the second output transistor and a gate electrode of the fourth output transistor form an integrated structure.

2. The display substrate according to claim 1, wherein the shift register further comprises a fifth capacitor; and the fifth capacitor is connected with the cascaded signal output terminal and the second power supply terminal, respectively.

3. The display substrate according to claim 2, wherein a capacitance value of the fifth capacitor is less than or equal to 60 farads.

4. The display substrate according to claim 2, wherein any one of the third output transistor and the fourth output transistor is located on a side of any one of the first output transistor and the second output transistor close to the display region, the fifth output transistor is located on a side of any one of the third output transistor and the fourth output transistor close to the display region, and the fifth capacitor is located on a side of the second output transistor away from the display region; and the first output transistor and the third output transistor are arranged along a first direction, the second output transistor and the fourth output transistor are arranged along the first direction, the first output transistor and the second output transistor are arranged along a second direction, the third output transistor and the fourth output transistor are arranged along the second direction, and the first direction is intersected with the second direction.

5. The display substrate according to claim 1, wherein the first output transistor, the second output transistor, the third output transistor, the fourth output transistor, the fifth output transistor each comprises an active pattern; a length of the active pattern of the first output transistor along a first direction is less than a length of the active pattern of the third output transistor along the first direction; and a channel width of the active pattern of the first output transistor is less than a channel width of the active pattern of the third output transistor, and a channel length of the active pattern of the first output transistor is greater than a channel length of the active pattern of the third output transistor.

6. The display substrate according to claim 5, wherein the channel width of the active pattern of the third output transistor ranges from 250 microns to 300 microns and the channel length of the active pattern of the third output transistor ranges from 2.9 microns to 3.2 microns.

7. The display substrate according to claim 5, wherein the channel width of the active pattern of the first output transistor ranges from 80 microns to 100 microns and the channel length of the active pattern of the first output transistor ranges from 3.2 microns to 3.7 microns.

8. The display substrate according to claim 1, wherein the first output transistor, the second output transistor, the third output transistor, the fourth output transistor, the fifth output transistor each comprises an active pattern; a length of the active pattern of the third output transistor along a first direction is greater than a length of the active pattern of the fourth output transistor along the first direction, and a length of the active pattern of the third output transistor along a second direction is less than a length of the active pattern of the fourth output transistor along the second direction.

9. The display substrate according to claim 1, wherein:

the first output transistor, the second output transistor, the third output transistor, the fourth output transistor, the fifth output transistor each comprises an active pattern;

a length of the active pattern of the second output transistor along a first direction is less than a length of the active pattern of the fourth output transistor along the first direction; and a channel width of the active pattern of the second output transistor is less than a channel width of the active pattern of the fourth output transistor, and a channel length of the active pattern of the second output transistor is greater than a channel length of the active pattern of the fourth output transistor.

10. The display substrate according to claim 9, wherein the channel width of the active pattern of the second output transistor ranges from 80 microns to 100 microns and the channel length of the active pattern of the second output transistor ranges from 3.2 microns to 3.7 microns.

11. The display substrate according to claim 9, wherein the channel width of the active pattern of the fourth output transistor ranges from 250 microns to 300 microns and the channel length of the active pattern of the fourth output transistor ranges from 2.9 microns to 3.2 microns.

12. The display substrate according to claim 1, wherein a length of an active pattern of the fifth output transistor along a second direction is greater than a length of an active pattern of any one of the third output transistor and the fourth output transistor along the second direction; and a channel width of the active pattern of the fifth output transistor ranges from 250 microns to 300 microns, and a channel length of the active pattern of the fifth output transistor ranges from 2.9 microns to 3.2 microns.

13. The display substrate according to claim 1, wherein the first output transistor, the second output transistor, the third output transistor, the fourth output transistor, the fifth output transistor each comprises a gate electrode; a length of the gate electrode of the third output transistor along a first direction is greater than a length of the gate electrode of the fourth output transistor along the first direction.

14. The display substrate according to claim 1, wherein the first output transistor, the second output transistor, the third output transistor, the fourth output transistor, the fifth output transistor each comprises a gate electrode; a length of the gate electrode of the fifth output transistor along a second direction is greater than a length of the gate electrode of any one of the first output transistor and the second output transistor along the second direction.

15. The display substrate according to claim 14, wherein the fourth capacitor is located between the second output transistor and the fourth output transistor.

16. The display substrate according to claim 1, wherein the shift register further comprises a fourth capacitor; and the fourth capacitor is connected with the fifth output transistor and the first power supply terminal, respectively.

17. The display substrate according to claim 1, wherein the shift register further comprises: a twenty-fourth transistor; and the twenty-fourth transistor is connected with the fifth output transistor and the second power supply terminal, respectively; the twenty-fourth transistor has a transistor type opposite to a transistor type of any one of the first output transistor to the fifth output transistor.

18. The display substrate according to claim 17, wherein the twenty-fourth transistor is located on a side of the fifth output transistor close to the display region and is arranged along a first direction with the first output transistor and the third output transistor.

19. The display substrate according to claim 1, wherein:

the shift register further comprises a twentieth transistor, a twenty-first transistor, a twenty-second transistor, a twenty-third transistor, a reverse signal output terminal, and a masking signal terminal;

the twentieth transistor is connected with the cascaded signal output terminal, the fifth output transistor and the twenty-first transistor, respectively; the twenty-first transistor is connected with the reverse signal output terminal and the masking signal terminal of a shift register of previous stage, respectively; the twenty-second transistor is connected with the cascaded signal output terminal, the reverse signal output terminal and the second power supply terminal, respectively; the twenty-third transistor is connected with the cascaded signal output terminal, the reverse signal output terminal and the first power supply terminal, respectively; and a transistor type of the twenty-second transistor is opposite to a transistor type of any one of the first output transistor to the third output transistor, the twentieth transistor, the twenty-first transistor, and the twenty-third transistor.

20. A display apparatus, comprising: the display substrate according to claim 1.

* * * * *